(12) United States Patent
Lunt, III et al.

(10) Patent No.: US 12,557,432 B2
(45) Date of Patent: Feb. 17, 2026

(54) HIGH-PERFORMANCE NEAR-INFRARED HARVESTING TRANSPARENT LUMINESCENT SOLAR CONCENTRATORS

(71) Applicant: Board of Trustees of Michigan State University, East Lansing, MI (US)

(72) Inventors: Richard R. Lunt, III, Williamston, MI (US); Chenchen Yang, Holt, MI (US); Babak Borhan, Okemos, MI (US); Mehdi Moemeni, Okemos, MI (US); Matthew Bates, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 17/867,022

(22) Filed: Jul. 18, 2022

(65) Prior Publication Data

US 2023/0033629 A1    Feb. 2, 2023

Related U.S. Application Data

(63) Continuation of application No. PCT/US2021/013946, filed on Jan. 19, 2021.

(60) Provisional application No. 62/963,455, filed on Jan. 20, 2020.

(51) Int. Cl.
*H10F 77/45* (2025.01)
*H10F 19/80* (2025.01)
*H10F 77/42* (2025.01)

(52) U.S. Cl.
CPC ............. *H10F 77/45* (2025.01); *H10F 19/80* (2025.01); *H10F 77/484* (2025.01)

(58) Field of Classification Search
CPC . H01L 31/055; H01L 31/048; H01L 31/0543; F24S 23/12; G02B 6/0003; Y02B 10/20; Y02E 10/52
See application file for complete search history.

(56) References Cited

U.S. PATENT DOCUMENTS

| | | |
|---|---|---|
| 7,745,724 B2 | 6/2010 | Balasubramanian et al. |
| 2005/0221116 A1* | 10/2005 | Cocchi ............. H10K 50/125 428/917 |
| 2009/0205701 A1 | 8/2009 | Govaerts et al. |
| 2010/0043880 A1* | 2/2010 | Bhaumik ............. H01L 31/055 136/257 |

(Continued)

FOREIGN PATENT DOCUMENTS

| | | |
|---|---|---|
| CN | 102460725 A | 5/2012 |
| CN | 106133921 A | 11/2016 |

(Continued)

OTHER PUBLICATIONS

Chinese Office Action for corresponding CN Application 202180022868X dated Mar. 1, 2025, with English summary.

(Continued)

*Primary Examiner* — Michael Y Sun
(74) *Attorney, Agent, or Firm* — Harness, Dickey & Pierce, P.L.C.

(57) ABSTRACT

A transparent luminescent solar concentrator (TLSC) is provided. The TLSC includes a luminophore and a waveguide that guides light emitted from the luminophore. The TLSC has a light utilization efficiency (LUE) of greater than or equal to about 1.

47 Claims, 28 Drawing Sheets

(56) References Cited

U.S. PATENT DOCUMENTS

| | | | |
|---|---|---|---|
| 2010/0139749 A1* | 6/2010 | Mapel | C03C 4/12 |
| | | | 136/255 |
| 2011/0253198 A1* | 10/2011 | Patrick | G02B 6/1226 |
| | | | 359/850 |
| 2013/0213472 A1* | 8/2013 | Powell | H01L 31/0481 |
| | | | 438/69 |
| 2014/0130864 A1* | 5/2014 | Lunt | E06B 9/24 |
| | | | 427/164 |
| 2014/0283896 A1* | 9/2014 | Lunt, III | H01L 31/0549 |
| | | | 136/247 |
| 2015/0194555 A1 | 7/2015 | Zhang et al. | |
| 2015/0287864 A1 | 10/2015 | Ziegler et al. | |
| 2018/0019355 A1 | 1/2018 | Brovelli et al. | |
| 2018/0366668 A1* | 12/2018 | Barr | H10K 85/6576 |
| 2019/0226720 A1 | 7/2019 | Lunt et al. | |
| 2019/0326460 A1 | 10/2019 | Needell et al. | |
| 2021/0230427 A1* | 7/2021 | Lunt, III | H01L 31/055 |

FOREIGN PATENT DOCUMENTS

| | | | | |
|---|---|---|---|---|
| CN | 107210329 A | 9/2017 | | |
| CN | 110622322 A | 12/2019 | | |
| JP | 2013110356 A | 6/2013 | | |
| JP | 2017516316 A | 6/2017 | | |
| WO | WO-2019217583 A1 * | 11/2019 | | C09B 23/0025 |

OTHER PUBLICATIONS

European Office Action for corresponding EP Application 21744842.2 dated May 14, 2025.

Banal, J. L., White, J. M., Lam, T. W., Blakers, A. W., Ghiggino, K. P., & Wong, W. W. (2015). A Transparent Planar Concentrator Using Aggregates of gem-Pyrene Ethenes. Advanced Energy Materials, 5(19), 1500818.

Bergren, M. R., Makarov, N. S., Ramasamy, K., Jackson, A., Guglielmetti, R., & McDaniel, H. (2018). High-performance CuInS2 quantum dot laminated glass luminescent solar concentrators for windows. ACS Energy Letters, 3(3), 520-525.

Chen, W., Zhang, J., Xu, G., Xue, R., Li, Y., Zhou, Y., . . . & Li, Y. (2018). A semitransparent inorganic perovskite film for overcoming ultraviolet light instability of organic solar cells and achieving 14.03% efficiency. Advanced Materials, 30(21), 1800855.

Chinese Office Action for CN Application 202180022868.X dated Jul. 19, 2024.

Cnops, K., Zango, G., Genoe, J., Heremans, P., Martinez-Diaz, M. V., Torres, T., & Cheyns, D. (2015). Energy level tuning of non-fullerene acceptors in organic solar cells. Journal of the American Chemical Society, 137(28), 8991-8997.

Coropceanu, I., & Bawendi, M. G. (2014). Core/shell quantum dot based luminescent solar concentrators with reduced reabsorption and enhanced efficiency. Nano letters, 14(7), 4097-4101.

Currie, M. J., Mapel, J. K., Heidel, T. D., Goffri, S., & Baldo, M. A. (2008). High-efficiency organic solar concentrators for photovoltaics. Science, 321(5886), 226-228.

Debije, Michael G. et al., "Thirty Years of Luminescent Solar Concentrator Research: Solar Energy for the Built Environment." Advanced Energy Materials, vol. 2, pp. 12-35 (2012).

Erickson, C. S., Bradshaw, L. R., McDowall, S., Gilbertson, J. D., Gamelin, D. R., & Patrick, D. L. (2014). Zero-reabsorption doped-nanocrystal luminescent solar concentrators. ACS nano, 8(4), 3461-3467.

Extended European Search Report for corresponding EP Application 21744842.2 dated Jan. 23, 2024.

International Search Report and Written Opinion for International Application PCT/US2021/013946 dated May 24, 2021.

Lee, K., Kim, N., Kim, K., Um, H. D., Jin, W., Choi, D., . . . & Seo, K. (2020). Neutral-colored transparent crystalline silicon photovoltaics. Joule, 4(1), 235-246.

Li, C., Chen, W., Wu, D., Quan, D., Zhou, Z., Hao, J., . . . & Wang, K. (2015). Large Stokes shift and high efficiency luminescent solar concentrator incorporated with CuInS2/ZnS quantum dots. Scientific reports, 5(1), 17777.

Li, H., Wu, K., Lim, J., Song, H. J., & Klimov, V. I. (2016). Doctor-blade deposition of quantum dots onto standard window glass for low-loss large-area luminescent solar concentrators. Nature Energy, 1(12), 1-9.

Li, Y., Ji, C., Qu, Y., Huang, X., Hou, S., Li, C. Z., . . . & Forrest, S. R. (2019). Enhanced light utilization in semitransparent organic photovoltaics using an optical outcoupling architecture. Advanced Materials, 31(40), 1903173.

Liu, D., Yang, C., & Lunt, R. R. (2018). Halide perovskites for selective ultraviolet-harvesting transparent photovoltaics. Joule, 2(9), 1827-1837.

Lunt, Richard R. et al., "Theoretical limits for visibly transparent photovoltaics." Applied Physics Letters, vol. 101, pp. 043902-043902-4 (2012).

Meinardi, F., & Colombo, A. (2014). Kirill a. Velizhanin, Roberto Simonutti, Monica Lorenzon, Luca Beverina, Ranjani Viswanatha, Victor I. Klimov, and Sergio Brovelli. Large-area luminescent solar concentrators based on "Stokes-shift-engineered" nanocrystals in a mass-polymerized PMMA matrix. Nature Photonics, 8(5), 392-399.

Meinardi, F., Ehrenberg, S., Dhamo, L., Carulli, F., Mauri, M., Bruni, F., . . . & Brovelli, S. (2017). Highly efficient luminescent solar concentrators based on earth-abundant indirect-bandgap silicon quantum dots. Nature Photonics, 11(3), 177-185.

Meinardi, F., McDaniel, H., Carulli, F., & Colombo, A. (2015). K. a. Velizhanin, NS Makarov, R. Simonutti, VI Klimov, S. Brovelli. Nat. Nanotechnol, 10(10), 878-885.

Meng, L., Zhang, Y., Wan, X., Li, C., Zhang, X., Wang, Y., . . . & Chen, Y. (2018). Organic and solution-processed tandem solar cells with 17.3% efficiency. Science, 361(6407), 1094-1098.

Rondao, R., Frias, A. R., Correia, S. F., Fu, L., de Zea Bermudez, V., Andre, P. S., . . . & Carlos, L. D. (2017). High-performance near-infrared luminescent solar concentrators. ACS applied materials & interfaces, 9(14), 12540-12546.

Sharma, M., Gungor, K., Yeltik, A., Olutas, M., Guzelturk, B., Kelestemur, Y., . . . & Demir, H. V. (2017). Near-unity emitting copper-doped colloidal semiconductor quantum wells for luminescent solar concentrators. Advanced Materials, 29(30), 1700821.

Slooff, L. H., Bende, E. E., Burgers, A. R., Budel, T., Pravettoni, M., Kenny, R. P., . . . & Buchtemann, A. (2008). A luminescent solar concentrator with 7.1% power conversion efficiency. physica status solidi (RRL)-Rapid Research Letters, 2(6), 257-259.

Sumner, R., Eiselt, S., Kilburn, T. B., Erickson, C., Carlson, B., Gamelin, D. R., . . . & Patrick, D. L. (2017). Analysis of optical losses in high-efficiency CuInS2-based nanocrystal luminescent solar concentrators: balancing absorption versus scattering. The Journal of Physical Chemistry C, 121(6), 3252-3260.

Traverse, C. J., Pandey, R., Barr, M. C., & Lunt, R. R. (2017). Emergence of highly transparent photovoltaics for distributed applications. Nature Energy, 2(11), 849-860.

Wang, J., Zhang, J., Xiao, Y., Xiao, T., Zhu, R., Yan, C., . . . & Zhan, X. (2018). Effect of isomerization on high-performance nonfullerene electron acceptors. Journal of the American Chemical Society, 140(29), 9140-9147.

Wu, K., Li, H., & Klimov, V. I. (2018). Tandem luminescent solar concentrators based on engineered quantum dots. Nature Photonics, 12(2), 105-110.

Xiao, Z., Jia, X., Li, D., Wang, S., Geng, X., Liu, F., . . . & Ding, L. (2017). 26 mA cm-2 Jsc from organic solar cells with a low-bandgap nonfullerene acceptor. Science Bulletin, 62(22), 1494-1496.

Yang, C., Liu, D., & Lunt, R. R. (2019). How to accurately report transparent luminescent solar concentrators. Joule, 3(12), 2871-2876.

Yang, C., Liu, D., Bates, M., Barr, M. C., & Lunt, R. R. (2019). How to accurately report transparent solar cells. Joule, 3(8), 1803-1809.

Yang, C., Zhang, J., Peng, W. T., Sheng, W., Liu, D., Kuttipillai, P. S., . . . & Lunt, R. R. (2018). Impact of Stokes shift on the performance of near-infrared harvesting transparent luminescent solar concentrators. Scientific Reports, 8(1), 16359.

(56) References Cited

OTHER PUBLICATIONS

Yang, C.; Lunt, R. R. Limits of Visibly Transparent Luminescent Solar Concentrators. Adv. Opt. Mater. 2017, 5 (8), 1600851.

Zhang, B., Zhao, P., Wilson, L. J., Subbiah, J., Yang, H., Mulvaney, P., . . . & Wong, W. W. (2019). High-performance large-area luminescence solar concentrator incorporating a donor- emitter fluorophore system. ACS Energy Letters, 4(8), 1839-1844.

Zhao, H., Benetti, D., Jin, L., Zhou, Y., Rosei, F., & Vomiero, A. (2016). Absorption enhancement in "Giant" core/alloyed-shell quantum dots for luminescent solar concentrator. Small, 12(38), 5354-5365.

Zhao, Y., & Lunt, R. R. (2013). Transparent Luminescent Solar Concentrators for Large-Area Solar Windows Enabled by Massive Stokes-Shift Nanocluster Phosphors. Advanced Energy Materials, 3(9).

Zhao, Y.; Meek, G. A.; Levine, B. G.; Lunt, R. R. Near-Infrared Harvesting Transparent Luminescent Solar Concentrators. *Adv. Opt. Mater.* 2014, 2 (7), 606-611.

Zhou, Y., Benetti, D., Fan, Z., Zhao, H., Ma, D., Govorov, A. O., . . . & Rosei, F. (2016). Near infrared, highly efficient luminescent solar concentrators. Advanced Energy Materials, 6(11), 1501913.

Zuo, L., Shi, X., Fu, W., & Jen, A. K. Y. (2019). Highly efficient semitransparent solar cells with selective absorption and tandem architecture. Advanced Materials, 31(36), 1901683.

Japanese Office Action for JP Application 2022544125, dated Nov. 5, 2024, with English Language summary.

Australian Examination Report for AU Application 2021210856 dated Oct. 15, 2025.

\* cited by examiner

CO₁8DFIC

IEICO-4F

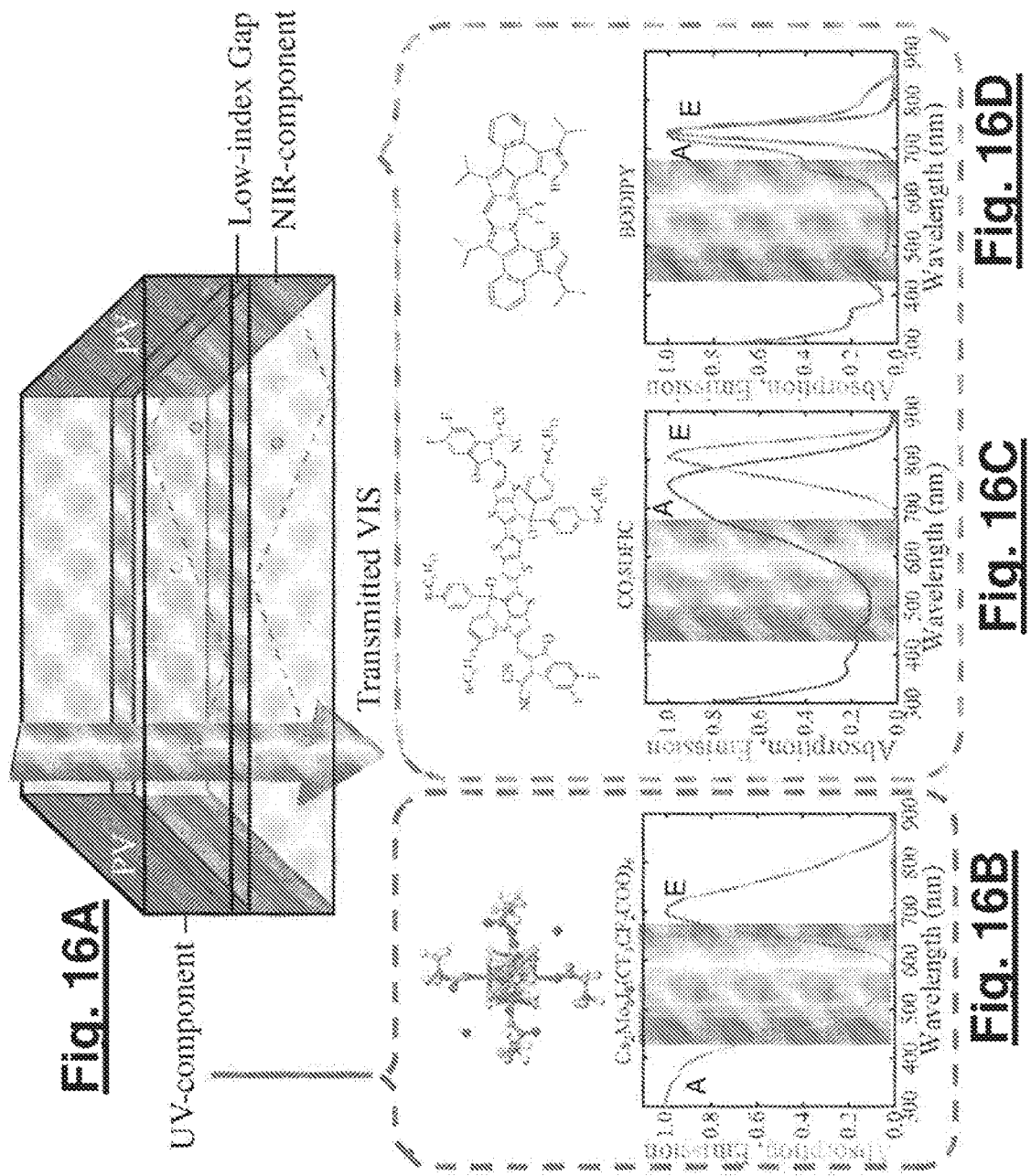

HIGH-PERFORMANCE NEAR-INFRARED HARVESTING TRANSPARENT LUMINESCENT SOLAR CONCENTRATORS

CROSS-REFERENCE TO RELATED APPLICATIONS

This application is a continuation of PCT international Patent Application No. PCT/US2021/013946, filed on Jan. 19, 2021, which claims priority to U.S. provisional Patent Application No. 62/963,455, filed on Jan. 20, 2020. The entire disclosures of the above applications are incorporated herein by reference.

GOVERNMENT SUPPORT

This invention was made with government support under 1702591 awarded by the National Science Foundation. The government has certain rights in the invention.

FIELD

The present disclosure relates to transparent luminescent solar concentrators.

BACKGROUND

This section provides background information related to the present disclosure which is not necessarily prior art.

Integrating solar-harvesting systems into architectures, including building envelopes, vehicle windows and panels, and electronic displays, provides a practical approach to utilize renewable solar energy. Widespread adoption of solar-harvesting systems in architectures; however, is severely hampered by difficulties associated with mounting traditional solar modules on and around architectures due to cost, architectural impedance, and mostly importantly, aesthetics.

The concept of luminescent solar concentrators ("LSCs"), including transparent LSCs (TLSCs) is known, and with recent advances in phosphorescent and fluorescent luminophore efficiencies, LSC system efficiencies have increased to 7.1%. Although optical funneling of light limits the overall system conversion efficiency to less than ten percent (without LSC stacking), it can dramatically reduce the area of expensive solar cells needed, driving down the overall installed cost and increasing the ratio of electricity generation to solar cell surface area. Because of the high cost of glass and real-estate that factor into the module and the balance of systems costs, respectively, such LSCs have rarely been adopted in solar-farm practice despite the increasing performance and potential for low module costs. Furthermore, there has been demonstrated interest in utilizing LSCs as windows for buildings and vehicles and displays for electronic devices. To date; however, many of these systems have been limited to absorption and emission (glow) in the visible part of spectrum, hindering widespread adoption of such devices. For example, the purpose of windows is to provide natural lighting with a view and most people prefer not to work behind colored glass. A high level of untinted-transparency is therefore desirable for ubiquitous adoption.

The performance of LSCs can be understood by the component efficiencies: luminophore photoluminescence efficiency (quantum yield), solar spectrum absorption efficiency, waveguide (trapping) efficiency, solar cell efficiency, and transport (re-absorption) efficiency. The highest performance LSCs utilize phosphorescent organic molecules or blends of multiple fluorophores (such as quantum dots or organic dyes) that act to reduce reabsorption (Stokes shift) losses and enhance overall absorption efficiencies across the spectrum. Some of the highest efficiencies reported (6-7%) have been for relatively small plates (less than 0.1 m$^2$), since larger LSCs sizes suffer substantial reabsorption losses that limit efficiencies to less than 5%.

It has long been recognized that LSCs are most limited by reabsorption losses, particularly for larger plate sizes. Indeed, LSC research has focused on the reduction of these reabsorption losses through increasing Stokes shifts with organic phosphors, multiple dye optimization to artificially increase the Stokes-shift or resonance shifting, applicable only to neat-film dye layers less than several microns thick.

Previous efforts to construct transparent solar-harvesting architectures have focused on (1) semi-transparent thin-film photovoltaics that typically have severe tinting or limited transmission or have an inherent tradeoff between efficiency and transparency, (2) LSCs incorporating colored chromophores that absorb or emit in the visible, (3) optical systems using wavelength dependent optics that collect direct light only and require solar tracking, or (4) have unacceptable levels of haze. All of these approaches are severely limited in their potential for window applications due to aesthetic properties, bulkiness, or considerably limited transparency. These approaches suffer from an inherent tradeoff between power conversion efficiency (PCE) and visible transparency (VT), since both parameters cannot be simultaneously optimized in conventional devices. Architectural adoption is impeded further with typical organic photovoltaics (PVs) that have peaked absorption within the visible spectrum, resulting in poor color rendering index (CRI), high colored tinting and poor natural lighting quality. Accordingly, there remains a need to develop efficient, high performance TLSCs that provide natural, non-tinted light.

SUMMARY

This section provides a general summary of the disclosure, and is not a comprehensive disclosure of its full scope or all of its features.

The current technology provides high performance near-infrared harvesting transparent luminescent solar concentrators.

In various aspects, the current technology provides a transparent luminescent solar concentrator (TLSC) that includes a luminophore and a waveguide that guides light emitted from the luminophore, wherein the TLSC has a light utilization efficiency (LUE) of greater than or equal to about 1.

In one aspect, the TLSC has an average visible transmittance (AVT) of greater than or equal to about 50% and a color rendering index (CRI) of greater than or equal to about 80 at normal incidence to the waveguide.

In one aspect, the TLSC has a power conversion efficiency (PCE) of greater than or equal to about 1% and a |b*| value of less than or equal to about 25.

In one aspect, the TLSC has an average visible transmittance (AVT) of greater than or equal to about 60%.

In one aspect, the luminophore is embedded within the waveguide, disposed directly on the waveguide, or provided in a film that is disposed on the waveguide.

In one aspect, the TLSC further includes a photovoltaic component operably coupled to the waveguide.

In one aspect, the luminophore has a strongest absorbance maximum and a strongest peak emission greater than or equal to about 650 nm.

In one aspect, the TLSC has a haze that is less than or equal to about %.

In one aspect, the luminophore is a non-fullerene acceptor, a boron-dipyrromethene (BODIPY), or a combination thereof.

In one aspect, the luminophore is the non-fullerene acceptor, the non-fullerene acceptor being 2,2'-[[4,4,11,11-tetrakis (4-hexylphenyl)-4,11-dihydrothieno[2',3':4,5]thieno[2,3-d] thieno[2",3":4"',5]thieno[2"',3"':4",5]pyrano[2",3":4',5] thieno[2',3':4,5]thieno[3,2-b]pyran-2,9-diyl]bis [methylidyne(5,6-difluoro) (COi8DFIC), 3,9-bis(2-methylene-(3-(1,1-dicyanomethylene)-indanone))-5,5,11, 11-tetrakis(4-hexylphenyl)-dithieno[2,3-d:2',3'-d]-s-indaceno[1,2-b:5,6-b']dithiophene) (ITIC), 2,2'-[[4,4,9,9-Tetrakis(4-hexylphenyl)-4,9-dihydro-s-indaceno[1,2-b:5,6-b']dithiophene-2,7-diyl]bis[[4-(2-ethylhexyl)oxy]-5,2-thiophenediyl]methylidyne(5,6-difluoro-3-oxo-1H-indene-2,1(3H)-diylidene)]]bis[propanedinitrile] (IEICO-4F), or a combination thereof.

In one aspect, the TLSC further includes a second luminophore and a second waveguide that guides light emitted from the second luminophore, wherein the second waveguide is positioned adjacent to the waveguide so that the waveguide receives light that is transmitted through the second waveguide, and wherein the waveguide and the second waveguide are separated by a gap that is either filled with air or filled with a visually transparent material.

In one aspect, the visually transparent material has an index of refraction (n) of less than or equal to about 1.3.

In one aspect, the second luminophore has a quantum yield (QY) greater than or equal to about 50%.

In one aspect, the second luminophore has a strongest absorbance maximum less than or equal to about 450 nm and a strongest peak emission greater than or equal to about 650 nm.

In one aspect, the second luminophore includes a nanocluster.

In one aspect, the waveguide and the second waveguide are configured so that incident light first passes through the second waveguide and then through the first waveguide.

In various aspects, the current technology also provides a transparent luminescent solar concentrator (TLSC) including a luminophore and a waveguide that guides light emitted from the luminophore, wherein the TLSC has a power conversion efficiency (PCE) of greater than or equal to about 1% and a |b*| value of less than or equal to about 25.

In one aspect, the TLSC has an average visible transmittance of greater than or equal to about 50% and a color rendering index (CRI) of greater than or equal to about 80 at normal incidence to the waveguide.

In one aspect, the TLSC has a light utilization efficiency (LUE) of greater than or equal to about 1.

In one aspect, the TLSC has an average visible transmittance (AVT) of greater than or equal to about 50%.

In one aspect, the luminophore is embedded within the waveguide, disposed directly on the waveguide, or provided in a film that is disposed on the waveguide.

In one aspect, the TLSC further includes a photovoltaic component operably coupled to the waveguide.

In one aspect, the luminophore has a strongest absorbance maximum and a strongest peak emission greater than or equal to about 650 nm.

In one aspect, the TLSC has a haze that is less than or equal to about 10%.

In one aspect, the luminophore is a non-fullerene acceptor, a boron-dipyrromethene (BODIPY), or a combination thereof.

In one aspect, the luminophore is the non-fullerene acceptor, the non-fullerene acceptor being COi8DFIC, 3,9-bis(2-methylene-(3-(1,1-dicyanomethylene)-indanone))-5,5,11, 11-tetrakis(4-hexylphenyl)-dithieno[2,3-d:2',3'-d']s-indaceno[1,2-b:5,6-b']dithiophene) (ITIC), 2,2'-[[4,4,9,9-Tetrakis(4-hexylphenyl)-4,9-dihydro-s-indaceno[1,2-b:5,6-b']dithiophene-2,7-diyl]bis[[4-[(2-ethylhexyl)oxy]-5,2-thiophenediyl]methylidyne(5,6-difluoro-3-oxo-1H-indene-2,1(3H)-diylidene)]]bis[propanedinitrile] (IEICO-4F), or a combination thereof.

In one aspect, the TLSC further includes a second luminophore and a second waveguide that guides light emitted from the second luminophore, wherein the second waveguide is positioned adjacent to the waveguide so that the waveguide receives light that is transmitted through the second waveguide, and wherein the waveguide and the second waveguide are separated by a gap that is either filled with air or filled with a visually transparent material.

In one aspect, the visually transparent material has an index of refraction (n) of less than or equal to about 1.3.

In one aspect, the second luminophore has a quantum yield (QY) greater than or equal to about 50%.

In one aspect, the second luminophore has a strongest absorbance maximum less than or equal to about 450 nm and a strongest peak emission greater than or equal to about 650 nm.

In one aspect, the second luminophore includes a nanocluster.

In one aspect, the waveguide and the second waveguide are configured so that incident light first passes through the second waveguide and then through the first waveguide.

In various aspects, the current technology also provides a transparent luminescent solar concentrator (TLSC) including a luminophore including a polythiophene having both a strongest absorbance maximum and a strongest peak emission greater than or equal to about 650 nm, and a waveguide that guides light emitted from the luminophore.

In one aspect, the TLSC has a light utilization efficiency (LUE) of greater than or equal to about 1, an average visible transmittance (AVT) of greater than or equal to about 50%, and a color rendering index (CRI) of greater than or equal to about 80 at normal incidence to the waveguide.

In one aspect, the TLSC has a power conversion efficiency (PCE) of greater than or equal to about 1% and a |b*| value of less than or equal to about 25.

In one aspect, the luminophore is embedded within the waveguide, disposed directly on the waveguide, or provided in a film that is disposed on the waveguide.

In one aspect, the TLSC further includes a photovoltaic component operably coupled to the waveguide.

In one aspect, the TLSC has a haze that is less than or equal to about 10%.

In one aspect, the polythiophene is 2,2'-[[4,4,11,11-tetrakis(4-hexylphenyl)-4,11-dihydrothieno[2',3':4,5]thieno[2,3-d]thieno[2"",3"":4"',5"']thieno[2"',3"':4",5"]pyrano[2",3":4', 5']thieno[2',3':4,5]thieno[3,2-b]pyran-2,9-diyl]bis [methylidyne(5,6-difluoro) (COi8DFIC), 3,9-bis(2-methylene-(3-(1,1-dicyanomethylene)-indanone))-5,5,11, 11-tetrakis(4-hexylphenyl)-dithieno[2,3-d:2',3'-d']-s-indaceno[1,2-b:5,6-b']dithiophene) (ITIC), 2,2'-[[4,4,9,9-Tetrakis(4-hexylphenyl)-4,9-dihydro-s-indaceno[1,2-b:5,6-b']dithiophene-2,7-diyl]bis[[4-[(2-ethylhexyl)oxy]-5,2- thiophenediyl]methylidyne(5,6-difluoro-3-oxo-1H-indene-2,1(3H)-diylidene)]]bis[propanedinitrile] (IEICO-4F), or a combination thereof.

In one aspect, the TLSC further includes a second luminophore including a boron-dipyrromethene (BODIPY) having both a strongest absorbance maximum and a strongest peak emission greater than or equal to about 650 nm, wherein the waveguide guides light emitted from both the luminophore and the second luminophore.

In one aspect, the TLSC further includes a second luminophore and a second waveguide that guides light emitted from the second luminophore, wherein the second waveguide is positioned adjacent to the waveguide so that the waveguide receives light that is transmitted through the second waveguide, and wherein the waveguide and the second waveguide are separated by an air layer or a layer including a visually transparent material.

In one aspect, the visually transparent material has an index of refraction (n) of less than or equal to about 1.3.

In one aspect, the second luminophore has a quantum yield (QY) greater than or equal to about 50%.

In one aspect, the second luminophore has a strongest absorbance maximum less than or equal to about 450 nm and a strongest peak emission greater than or equal to about 650 nm.

In one aspect, the second luminophore includes a nanocluster.

In one aspect, the waveguide and the second waveguide are configured so that incident light first passes through the second waveguide and then through the first waveguide.

In one aspect, the TLSC further includes a third luminophore including a boron-dipyrromethene (BODIPY) having both a strongest absorbance maximum and a strongest peak emission greater than or equal to about 650 nm, wherein the waveguide guides light emitted from both the luminophore and the third luminophore.

In certain aspects, the current technology provides a transparent luminescent solar concentrator (TLSC) including a luminophore including boron-dipyrromethene (BODIPY) having a strongest absorbance maximum and a strongest peak emission greater than or equal to about 650 nm, and a waveguide that guides light emitted from the luminophore.

In one aspect, the TLSC has a light utilization efficiency (LUE) of greater than or equal to about 1, an average visible transmittance (AVT) of greater than or equal to about 50%, and a color rendering index (CRI) of greater than or equal to about 80 at normal incidence to the waveguide.

In one aspect, the TLSC has a power conversion efficiency (PCE) of greater than or equal to about 1% and a |b*| value of less than or equal to about 25.

In one aspect, the luminophore is embedded within the waveguide, disposed directly on the waveguide, or provided in a film that is disposed on the waveguide.

In one aspect, the TLSC further includes a photovoltaic component operably coupled to the waveguide.

In one aspect, the TLSC has a haze that is less than or equal to about 10%.

In one aspect, the TLSC further includes a second luminophore including a polythiophene having both a strongest absorbance maximum and a strongest peak emission greater than or equal to about 650 nm, wherein the polythiophene is 2,2'-[[4,4,11,11-tetrakis(4-hexylphenyl)-4,11-dihydrothieno[2',3':4,5]thieno[2,3-d]thieno[2'''',3'''':4''',5''']thieno[2''',3''':4'',5''  ]pyrano[2''',3'':4',5']thieno[2',3':4,5]thieno[3,2-b]pyran-2,9-diyl]bis[methylidyne(5,6-difluoro) (COi8DFIC), 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene) (ITIC), 2,2'-[[4,4,9,9-Tetrakis(4-hexylphenyl)-4,9-dihydro-s-indaceno[1,2-b:5,6-b']dithiophene-2,7-diyl]bis[[4-[(2-ethylhexyl)oxy]-5,2-thiophenediyl]methylidyne(5,6-difluoro-3-oxo-1H-indene-2,1(3H)-diylidene)]]bis[propanedinitrile] (IEICO-4F), or a combination thereof, wherein the waveguide guides light emitted from both the luminophore and the second luminophore.

In one aspect, the TLSC further includes a second luminophore and a second waveguide that guides light emitted from the second luminophore, wherein the second waveguide is positioned adjacent to the waveguide so that the waveguide receives light that is transmitted through the second waveguide, and wherein the waveguide and the second waveguide are separated by an air layer or a layer including a visually transparent material.

In one aspect, the visually transparent material has an index of refraction (n) of less than or equal to about 1.3.

In one aspect, the second luminophore has a quantum yield (QY) greater than or equal to about 50%.

In one aspect, the second luminophore has a strongest absorbance maximum less than or equal to about 450 nm and a strongest peak emission greater than or equal to about 650 nm.

In one aspect, the second luminophore includes a nanocluster.

In one aspect, the waveguide and the second waveguide are configured so that incident light first passes through the second waveguide and then through the first waveguide.

In one aspect, the TLSC further includes a third luminophore including a polythiophene having both a strongest absorbance maximum and a strongest peak emission greater than or equal to about 650 nm, the polythiophene being 2,2'-[[4,4,11,11-tetrakis(4-hexylphenyl)-4,11-dihydrothieno[2',3':4,5]thieno[2,3-d]thieno[2'''',3'''':4''',5''']thieno[2''',3''':4'',5''  ]pyrano[2''',3'':4',5']thieno[2',3':4,5]thieno[3,2-b]pyran-2,9-diyl]bis[methylidyne(5,6-difluoro) (COi8DFIC), 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene) (ITIC), 2,2'-[[4,4,9,9-Tetrakis(4-hexylphenyl)-4,9-dihydro-s-indaceno[1,2-b:5,6-b']dithiophene-2,7-diyl]bis[[4-[(2-ethylhexyl)oxy]-5,2-thiophenediyl]methylidyne(5,6-difluoro-3-oxo-1H-indene-2,1(3H)-diylidene)]]bis[propanedinitrile] (IEICO-4F), or a combination thereof, wherein the waveguide guides light emitted from both the luminophore and the third luminophore.

In various aspects, the current technology provides a transparent luminescent solar concentrator (TLSC) including a first waveguide that guides light emitted form a first luminophore, the first waveguide having a first light receiving surface and an opposing first light transmitting surface; and a second waveguide that guides light emitted from a second luminophore, the second waveguide having a second light receiving surface and an opposing second light transmitting surface, wherein the first waveguide and the second waveguide are separated by either a transparent material having an index of refraction (n) of less than or equal to about 1.3 or an air layer, and wherein one of the first luminophore or the second luminophore has a strongest absorbance maximum less than or equal to about 450 nm and a strongest peak emission greater than or equal to about 650 nm, and the other of the first luminophore or the second luminophore has a strongest absorbance maximum and a strongest peak emission greater than or equal to about 650 nm.

In one aspect, the first light receiving surface of the first waveguide is configured to receive incident light and the first luminophore has the strongest absorbance maximum less than or equal to about 450 nm and the strongest peak emission greater than or equal to about 650 nm.

In one aspect, the first luminophore has a quantum yield (QY) greater than or equal to about 50%.

In one aspect, the first luminophore has a strongest absorbance maximum less than or equal to about 450 nm and a strongest peak emission greater than or equal to about 650 nm.

In one aspect, the first luminophore includes a nanocluster.

In one aspect, the second luminophore having the strongest absorbance maximum and a strongest peak emission greater than or equal to about 650 nm includes a polythiophene, a boron-dipyrromethene (BODIPY), or a combination thereof.

In one aspect, the second luminophore includes the polythiophene, the polythiophene being 2,2'-[[4,4,11,11-tetrakis (4-hexylphenyl)-4,11-dihydrothieno[2',3':4,5]thieno[2,3-d] thieno[2"",3"":4''',5''']thieno[2''',3''':4",5" ]pyrano[2",3':4', 5']thieno[2',3':4,5]thieno[3,2-b]pyran-2,9-diyl]bis [methylidyne(5,6-difluoro) (COi8DFIC), 3,9-bis(2-methylene-(3-(1,1-dicyanomethylene)-indanone))-5,5,11, 11-tetrakis(4-hexylphenyl)-dithieno[2,3-d:2',3'-d']-s-indaceno[1,2-b:5,6-b']dithiophene) (ITIC), 2,2'-[[4,4,9,9-Tetrakis(4-hexylphenyl)-4,9-dihydro-s-indaceno[1,2-b:5,6-b']dithiophene-2,7-diyl]bis[[4-[(2-ethylhexyl)oxy]-5,2-thiophenediyl]methylidyne(5,6-difluoro-3-oxo-1H-indene-2,1(3H)-diylidene)]]bis[propanedinitrile] (IEICO-4F), or a combination thereof.

In one aspect, the TLSC has a light utilization efficiency (LUE) of greater than or equal to about 1.

In one aspect, the TLSC has a power conversion efficiency (PCE) of greater than or equal to about 1%.

In one aspect, the TLSC has a |b*| value of less than or equal to about 25.

In one aspect, the TLSC has a haze that is less than or equal to about 10%.

In one aspect, the TLSC has an average visible transmittance (AVT) of greater than or equal to about 50%.

In one aspect, the TLSC has a color rendering index (CRI) of greater than or equal to about 80 at normal incidence to the waveguide.

In one aspect, the TLSC further includes a photovoltaic cell operably coupled to a first edge of the first waveguide and to a second edge of the second waveguide.

In one aspect, the first luminophore is embedded within the first waveguide, disposed directly on the first waveguide, or provided in a film that is disposed on the first waveguide; and the second luminophore is embedded within the second waveguide, disposed directly on the second waveguide, or provided in a film that is disposed on the second waveguide.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 6A:
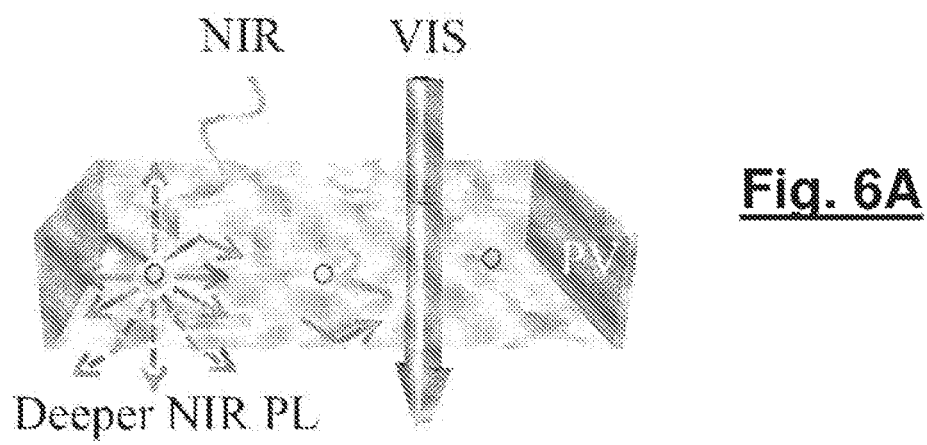
Figure 6B:
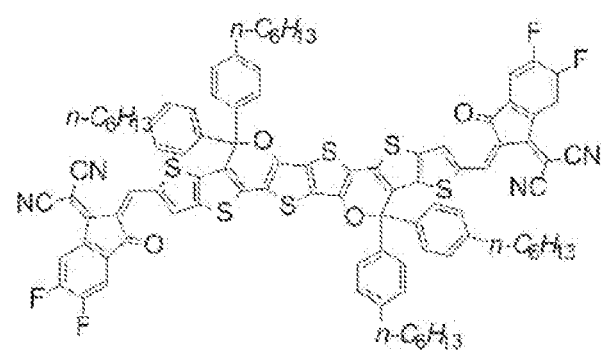
Figure 6C:
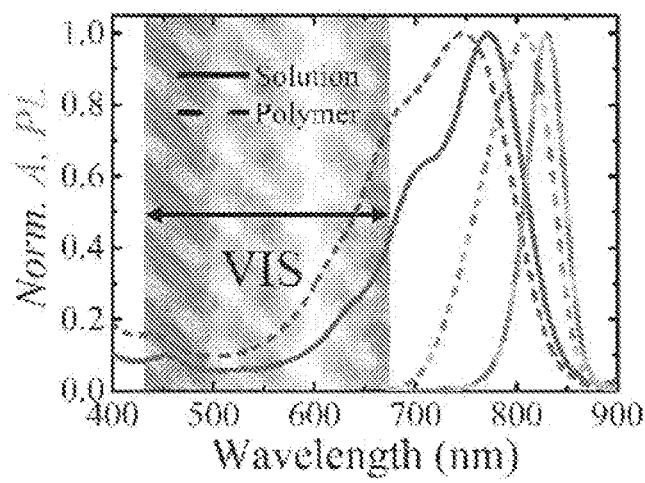

FIGS. 6A-6C show a schematic illustration of the working principle of a near-infrared (NIR) harvesting wavelength-selective transparent luminescent solar concentrator (TLSC) where the emitted deeper NIR photoluminescence is waveguided to the edge-mounted PV cells via total internal reflection, while the visible light passes through (FIG. 6A), a molecular structure of CO$_i$8DFIC (FIG. 6B), and a graph showing normalized absorption (blue) and emission spectra (red) of COi8DFIC in chlorobenzene solution (solid lines) and polymer matrix (dashed lines) (FIG. 6C).

Figure 7A:
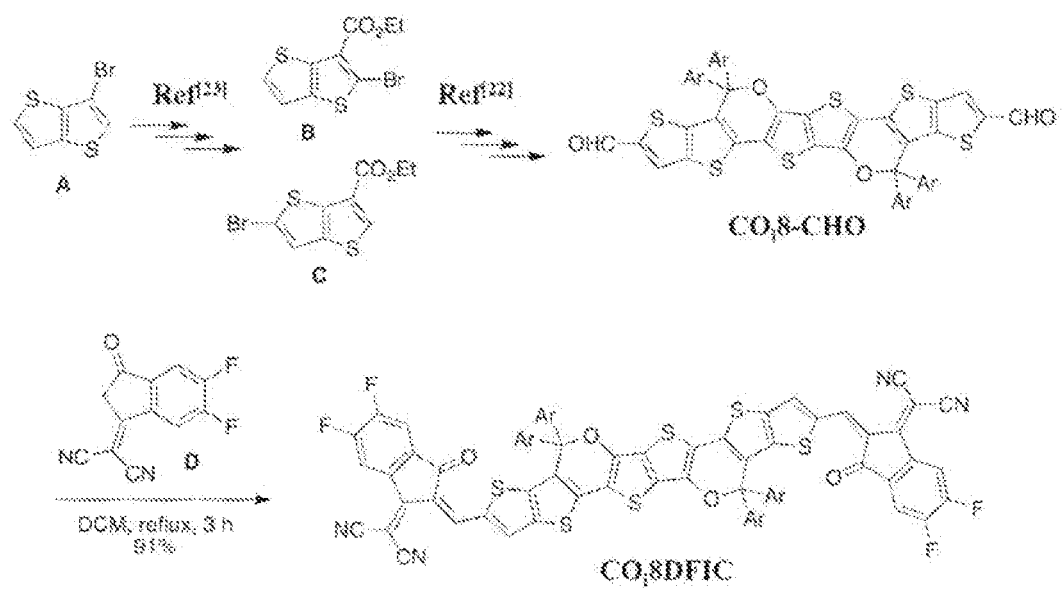
Figure 7B:
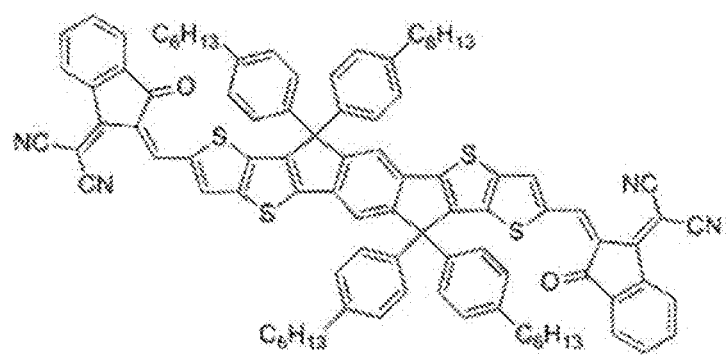

FIG. 7A-7B show reactions for the synthesis of Co$_i$8DFIC (FIG. 7A) and the molecular structure of ITIC (FIG. 7B).

Figure 8A:
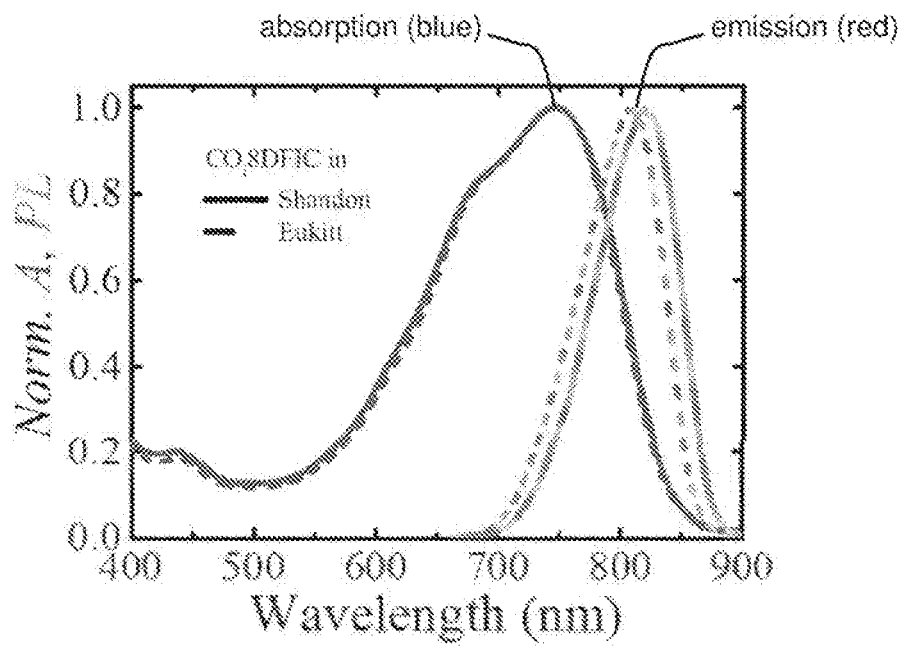
Figure 8B:
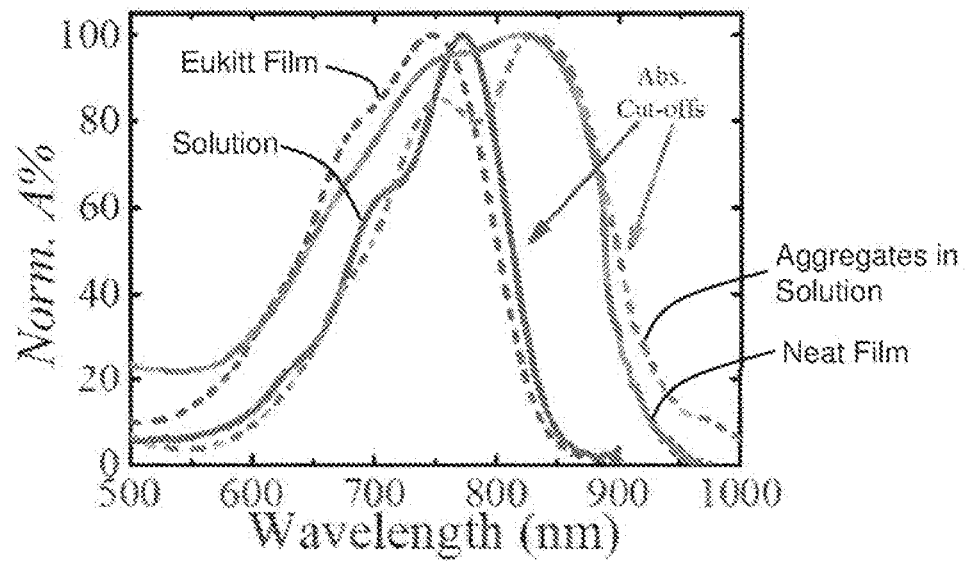

FIGS. 8A-8B are graphs showing normalized absorption (blue) and emission (red) spectra of COi8DFIC embedded in two different polymer matrices: Shandon (solid lines) and Eukitt (dashed lines) (FIG. 8A) and a normalized absorption comparison of COi8DFIC in solution, polymer matrix film, neat film, and particle aggregates (FIG. 8B).

Figure 9A:
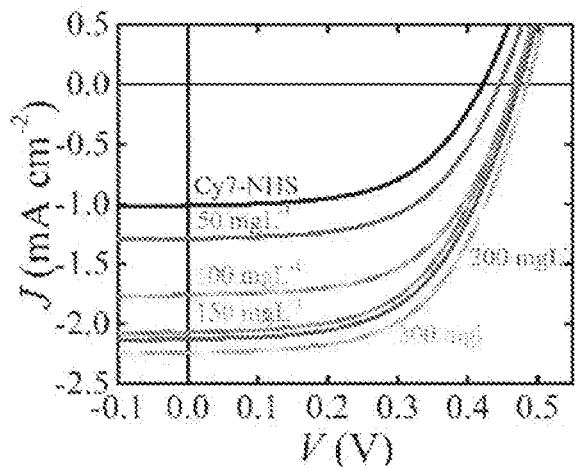
Figure 9B:
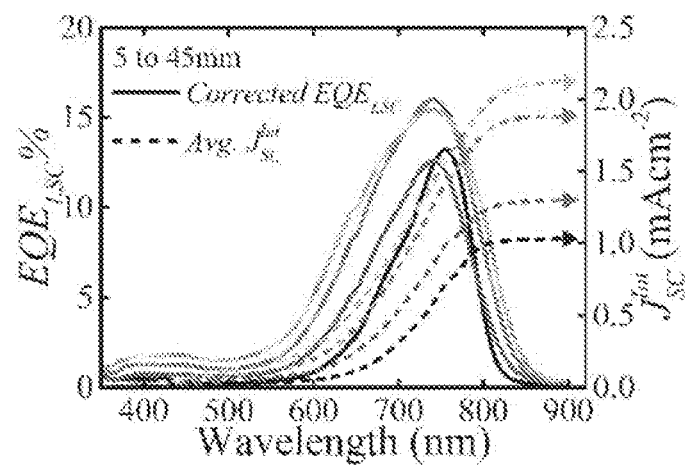
Figure 9C:
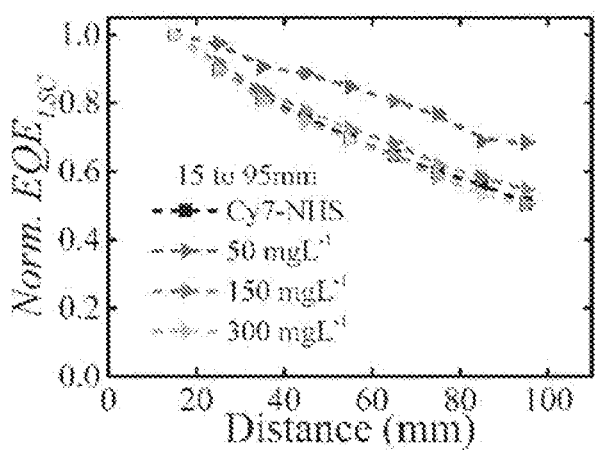

FIGS. 9A-9C are graphs showing current density versus voltage (J-V) characteristics of COi8DFIC TLSCs with different concentrations (the legends 50 mgL$^{-1}$ to 300 mgL$^{-1}$ indicate the solution concentration) where all of the scans were measured under AM 1.5G illumination and all TLSCs were edge-mounted with Si PVs (FIG. 9A), average $EQE_{LSC}(\lambda)$ spectra of COi8DFIC TLSCs with different concentrations where the corresponding integrated $J_{SC}$ match well with the $J_{SC}$ extracted from J-V characteristics shown in FIG. 9A (FIG. 9B), and the normalized position-dependent $EQE_{LSC}$ peak values of CO$_i$8DFIC TLSCs with different concentrations (FIG. 9C).

Figures 10A, 10B, 10C:
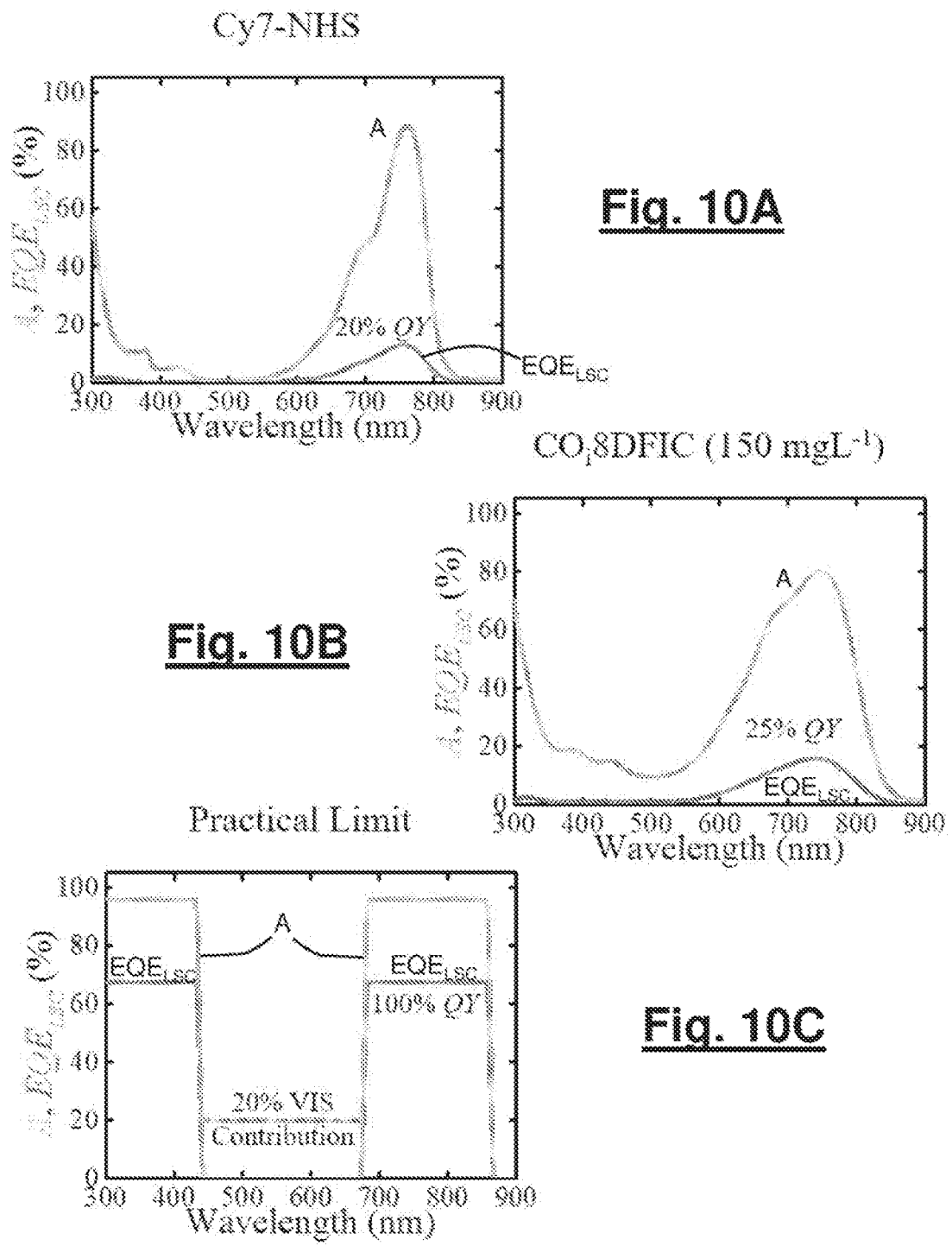

FIGS. 10A-10C are graphs showing absolute absorption and $EQE_{LSC}$ spectra for TLSCs with Cy7-NHS (FIG. 10A), absolute absorption and $EQE_{LSC}$ spectra for TLSCs with COi$_8$DFIC 150 mgL$^{-1}$ (FIG. 10B), and a TLSC reaching practical limits with GaAs as edge-mounted PV (FIG. 10C).

Figure 11A:
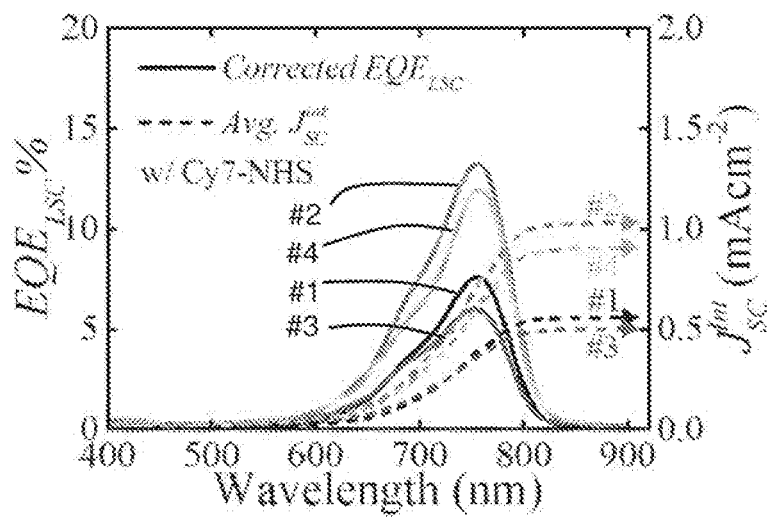
Figure 11B:
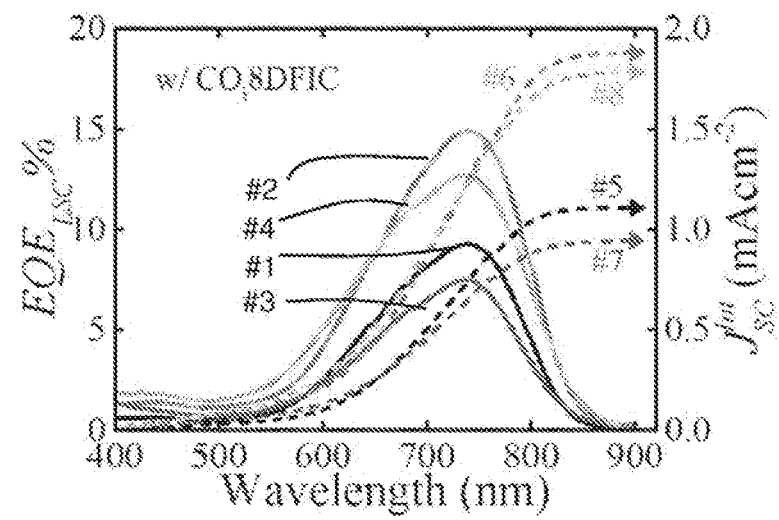
Figure 12A:
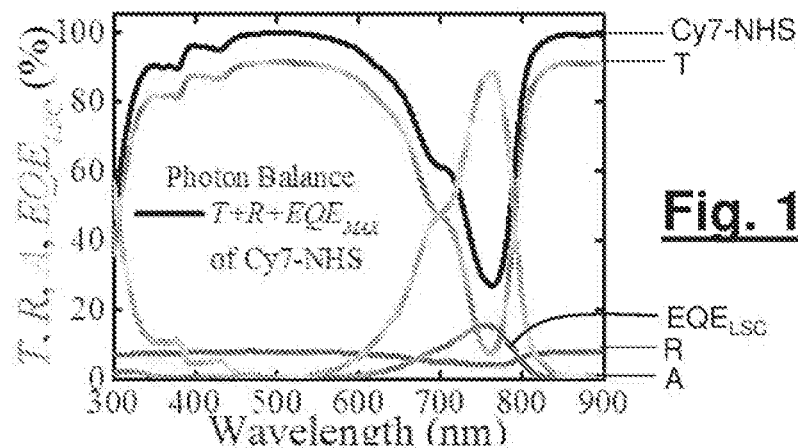
Figure 12B:
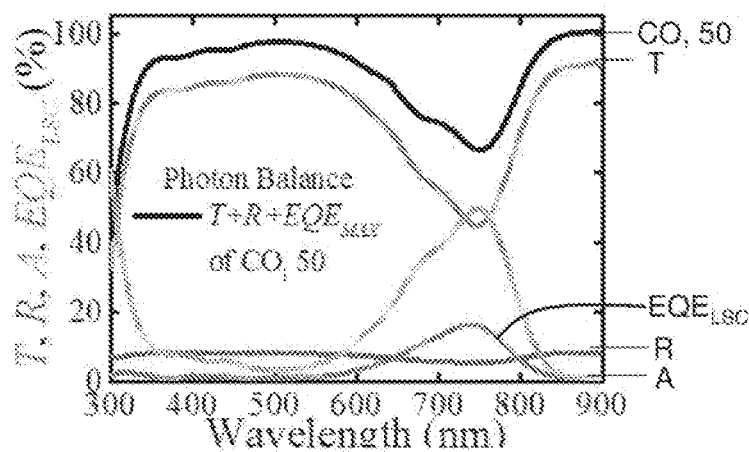
Figure 12C:
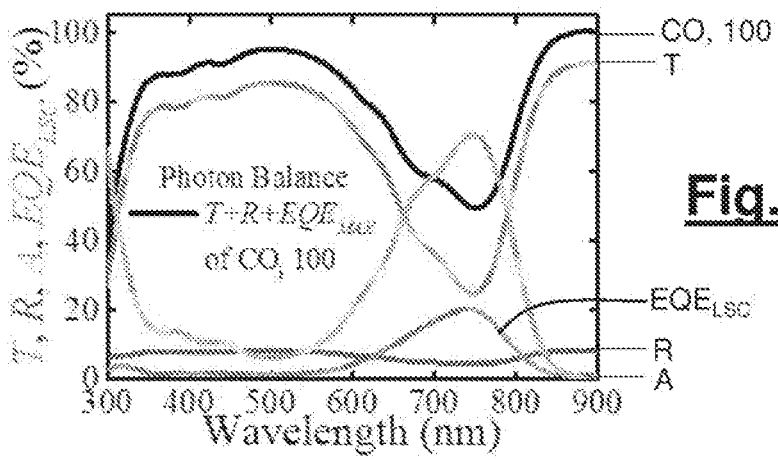
Figure 12D:
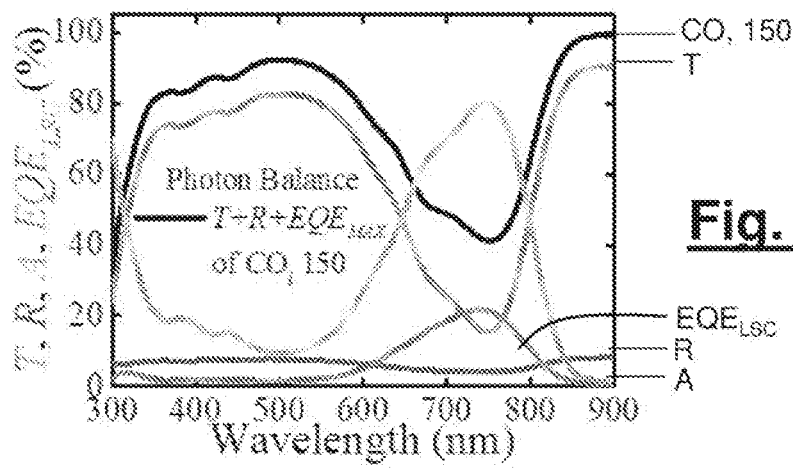
Figure 12E:
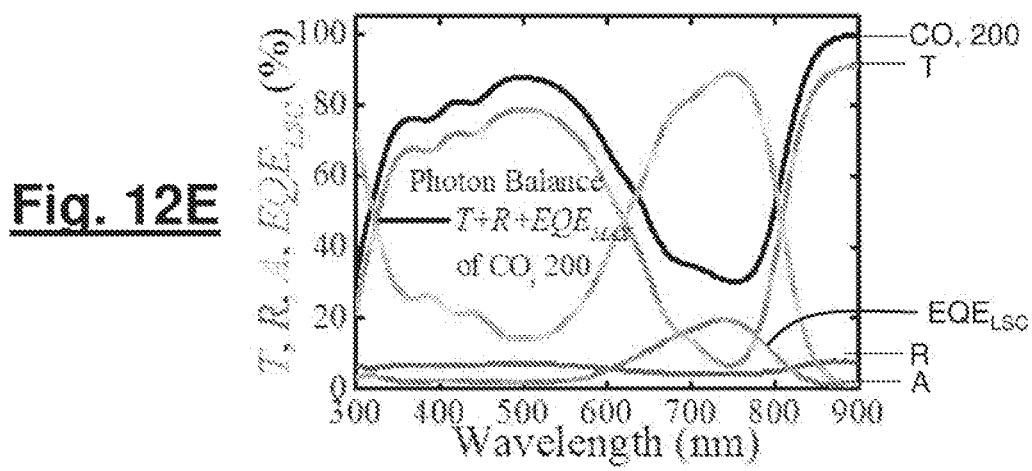
Figure 12F:
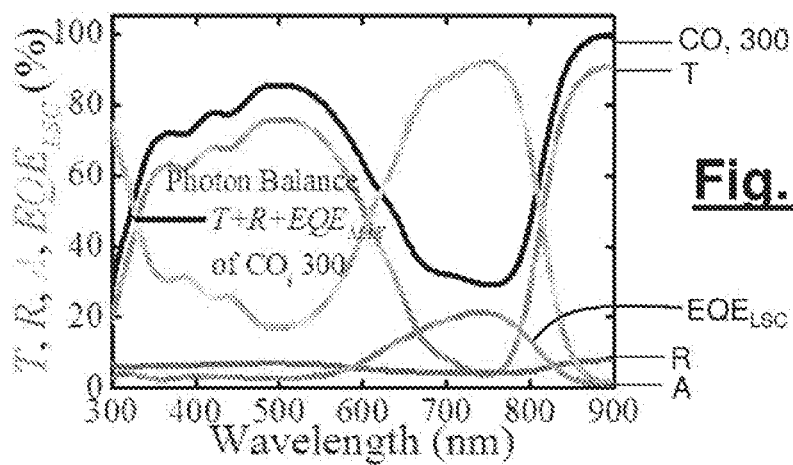

FIGS. 11A-11B are graphs showing $EQE_{LSC}$ and the averaged integrated JSC comparison of TLSC with different edge mounted PVs and G factors where the luminophore is Cy7-NHS (FIG. 11A) and Co$_i$8DFIC (FIG. 11B).

FIGS. 12A-12F show measured transmittance (T(A)), reflectance (R(A)), absorption (A($\lambda$)=1−T($\lambda$)−R($\lambda$)), $EQE_{LSC}(\lambda)$ spectrum, and photon balance check ($EQE_{LSC}(\lambda)$+T($\lambda$)+R($\lambda$) 1) of TLSC devices at each wavelength for cy7-NHS (FIG. 12A) and varying concentrations of Co$_i$8DFIC (FIGS. 12B-12F).

Figure 13A:
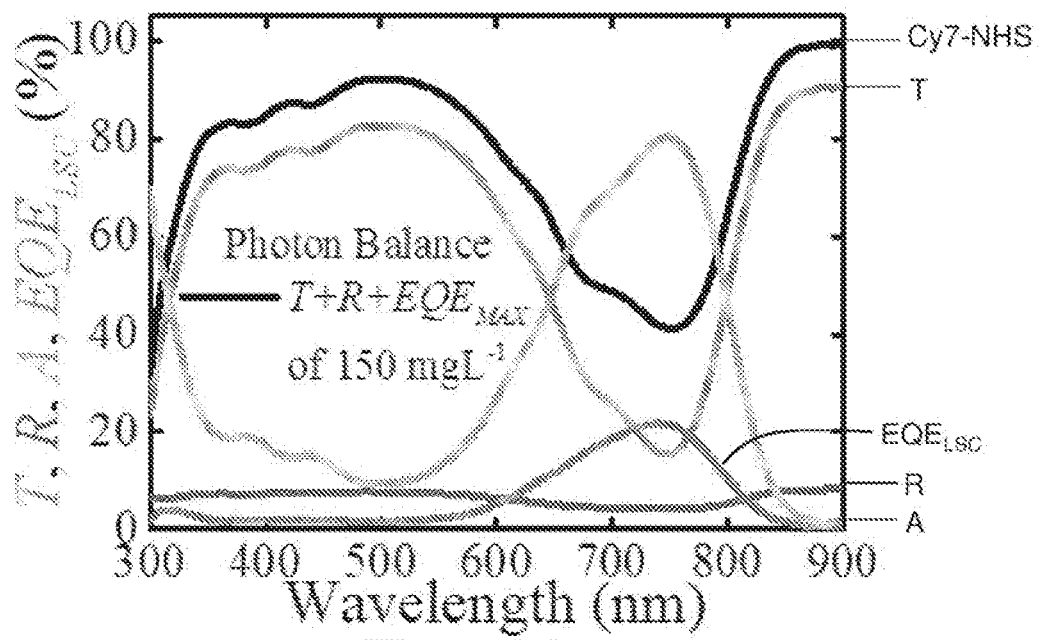
Figure 13B:
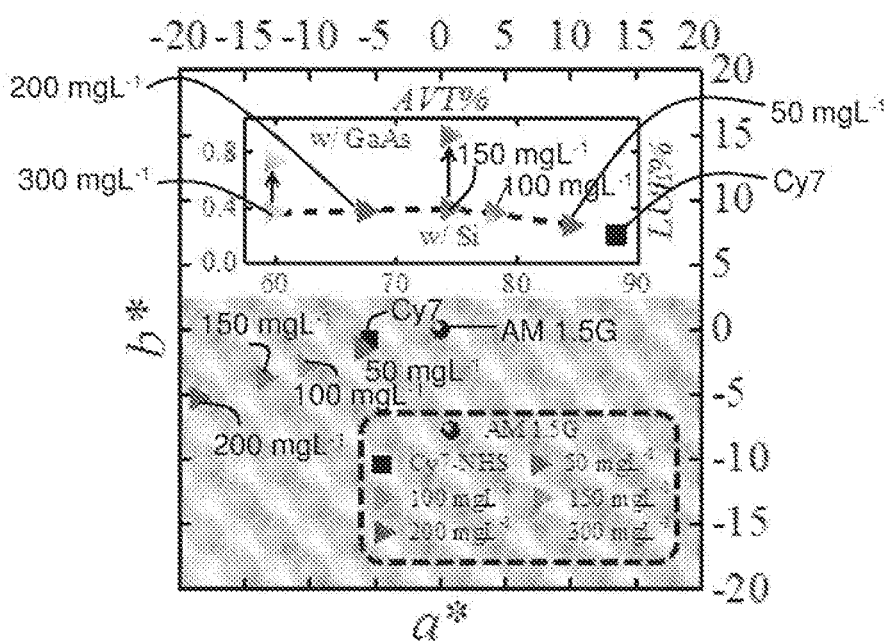
Figure 13C:
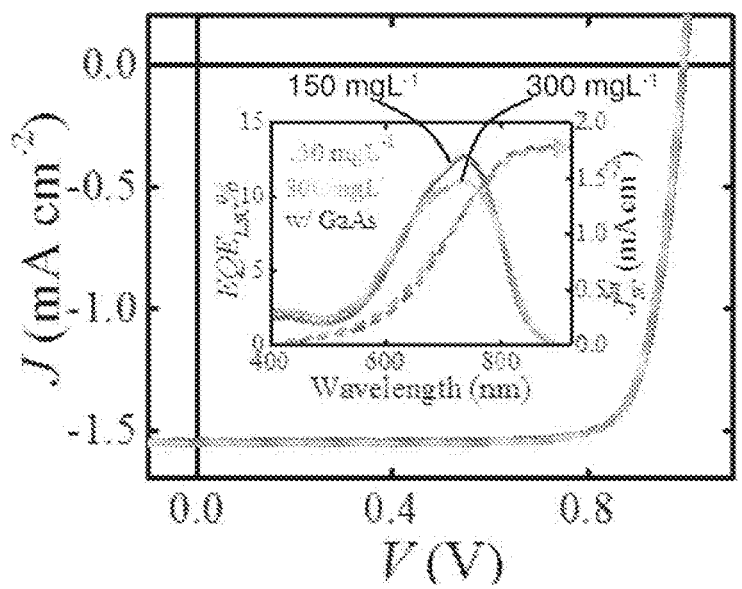
Figure 13D:
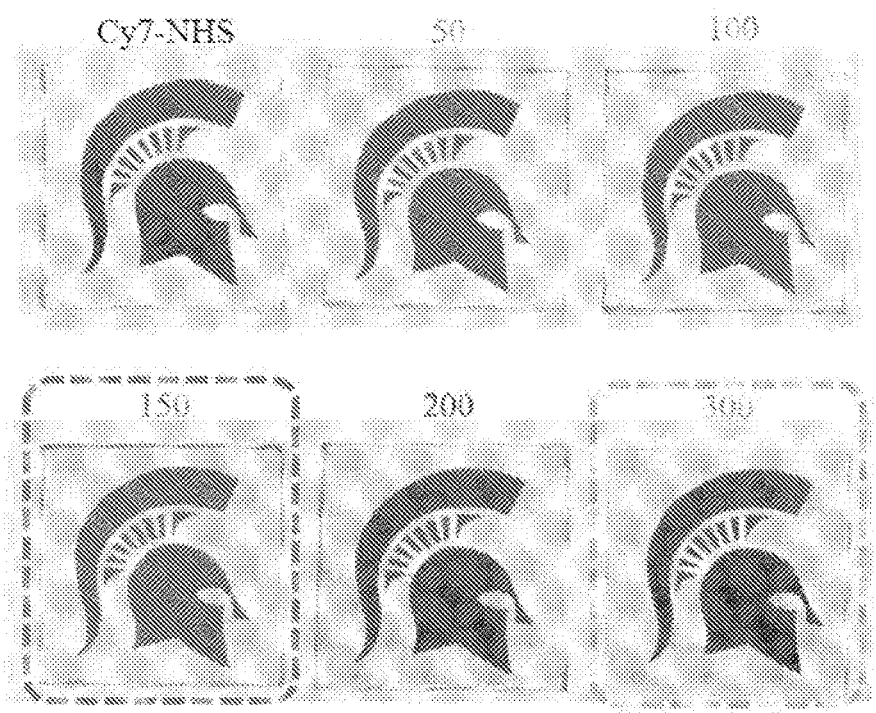

FIGS. 13A-13D show a graph showing measured transmittance (T($\lambda$)), reflectance (R($\lambda$)), absorption (A($\lambda$)=1−T($\lambda$)−R($\lambda$)), $EQE_{LSC}(\lambda)$ spectrum and photon balance check ($EQE_{LSC}(\lambda)$+T($\lambda$)+R($\lambda$) 1) of "150 mgL$^{-1}$" TLSC device at each wavelength (FIG. 13A); color coordinates (a*, b*) of CO$_i$8DFIC TLSCs in CIELAB color space where "300 mgL$^{-1}$" is strongly tinted and the corresponding CO$_i$8DFIC TLSCs (edge-mounted with Si or GaAs PV) versus average visible transmittance (AVT) (FIG. 13B); current density versus voltage (J-V) characteristics of "150 mgL$^{-1}$" and "300 mgL$^{-1}$" TLSCs edge-mounted with GaAs PVs where the inset shows averaged $EQE_{LSC}(\lambda)$ spectra of the same two TLSCs edge-mounted with GaAs PVs and where the corresponding integrated $J_{SC}$ match well with the $J_{SC}$ extracted from J-V characteristics (FIG. 13C); and photographs of all the TLSC devices (FIG. 13D).

Figure 14A:
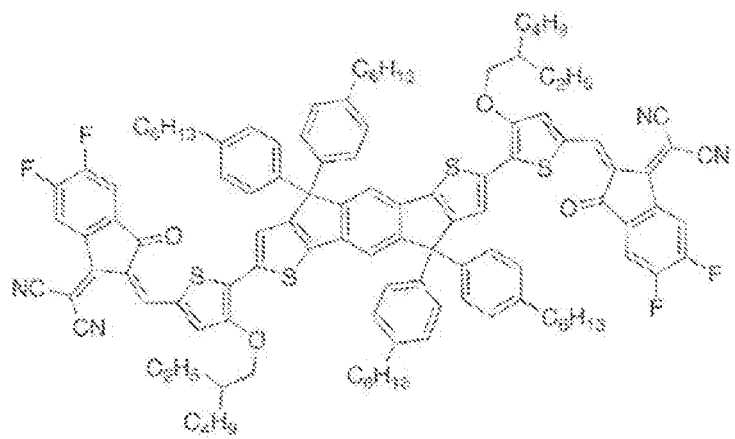
Figure 14B:
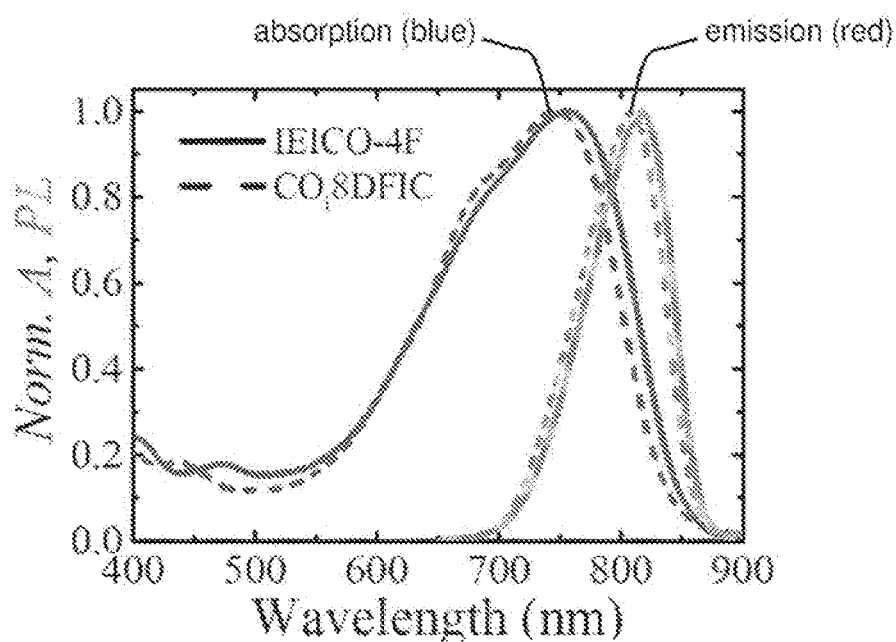
Figure 14C:
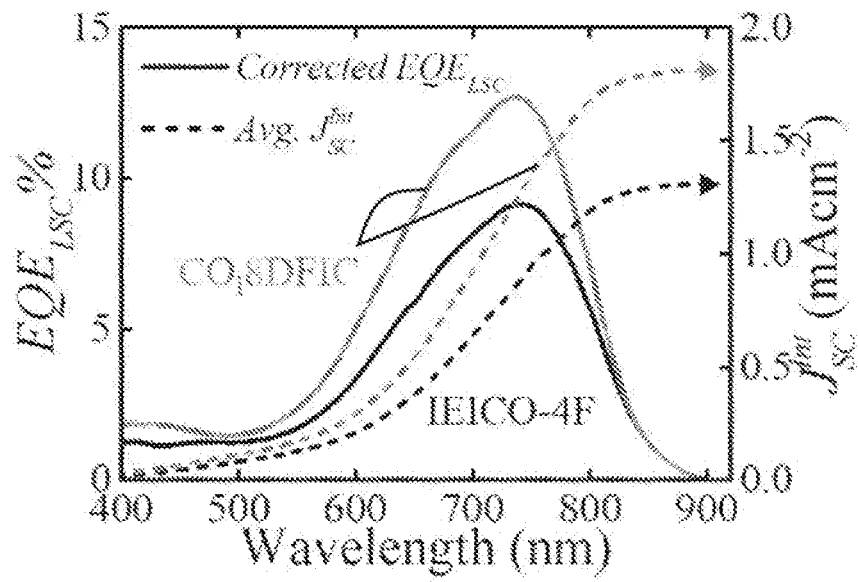
Figure 14D:
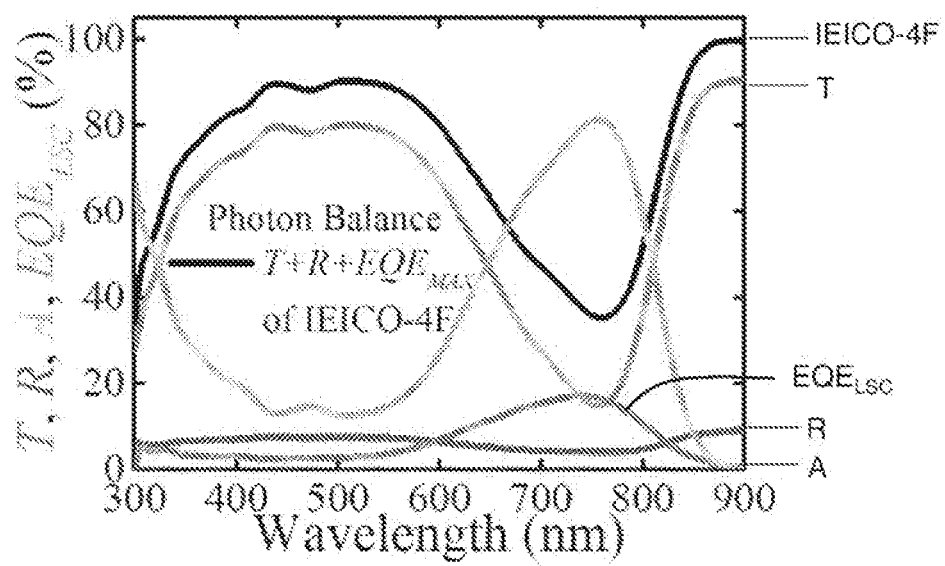

FIGS. 14A-14D show the molecular structure of IEICO-4F (FIG. 14A), a graph showing normalized absorption (blue) and emission (red) spectra of CO$_i$8DFIC (solid lines) and IEICO-4F (dashed lines) embedded in polymer matrix (Eukitt) (FIG. 14B), a graph showing $EQE_{LSC}$ and the averaged integrated $J_{SC}$ comparison of TLSC with CO$_i$8DFIC and IEICO-4F as luminophores (FIG. 14C), and a graph showing photon balance of the TLSC with IEICO-4F (FIG. 14D).

Figure 15:
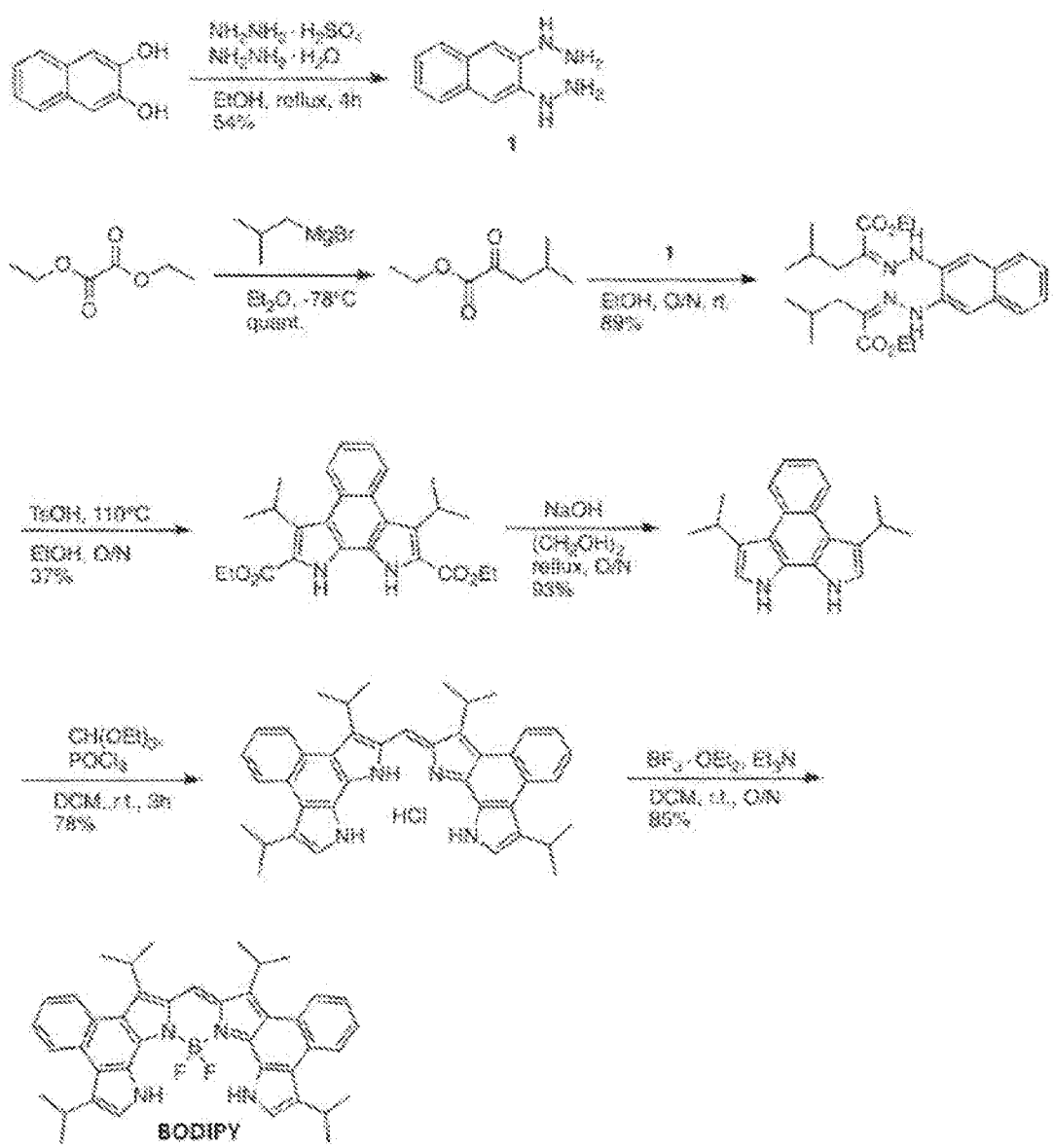

FIG. 15 shows show reactions for the synthesis of BODIPY.

FIGS. 16A-16D show a schematic illustration showing the structure and working principle of the dual-band selective harvesting transparent luminescent solar concentrator (TLSC) where the UV-component and NIR component are separated by an air gap which enables total internal reflection within each waveguide and isolation of the emission from each luminophore (FIG. 16A); the molecular structure, normalized absorption, and emission spectra of $Cs_2Mo_6I_8$(CF3CF2COO)$_6$ nanocluster (FIG. 16B); the molecular structure, normalized absorption, and emission spectra of CO$_i$8DFIC (FIG. 156C); and the molecular structure, normalized absorption, and emission spectra of BODIPY in polymer matrix (FIG. 16D).

Figure 17A:
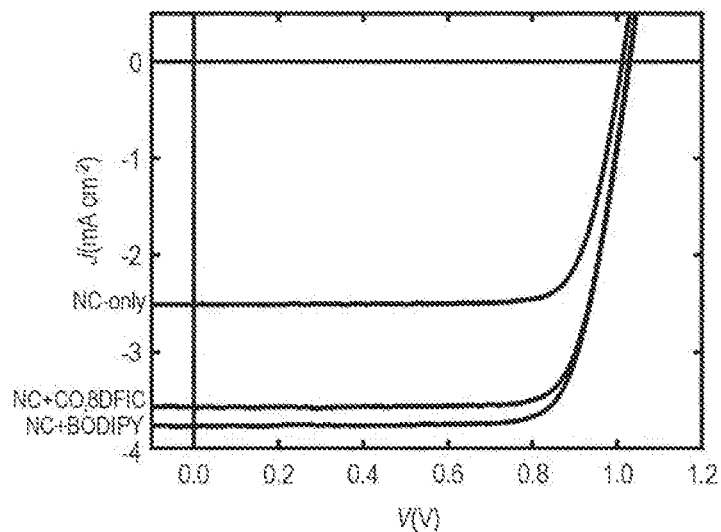
Figure 17B:
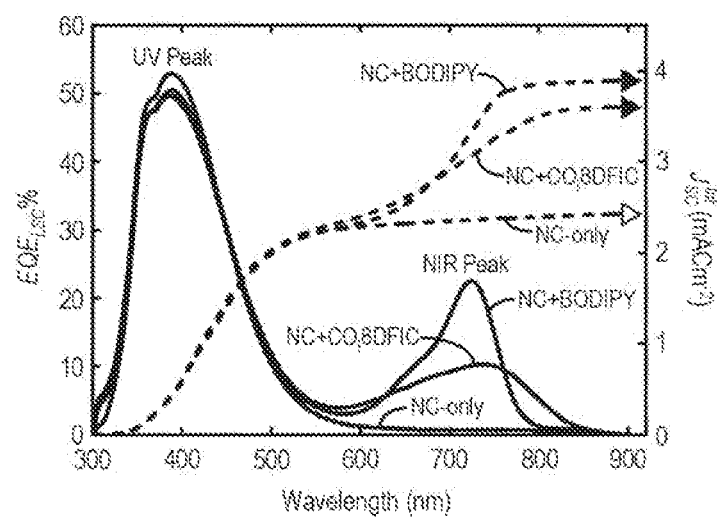
Figure 17C:
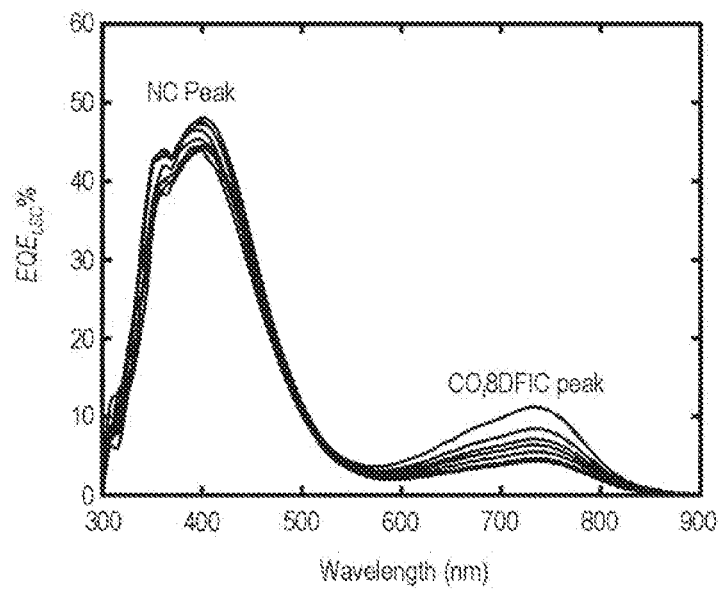
Figure 17D:
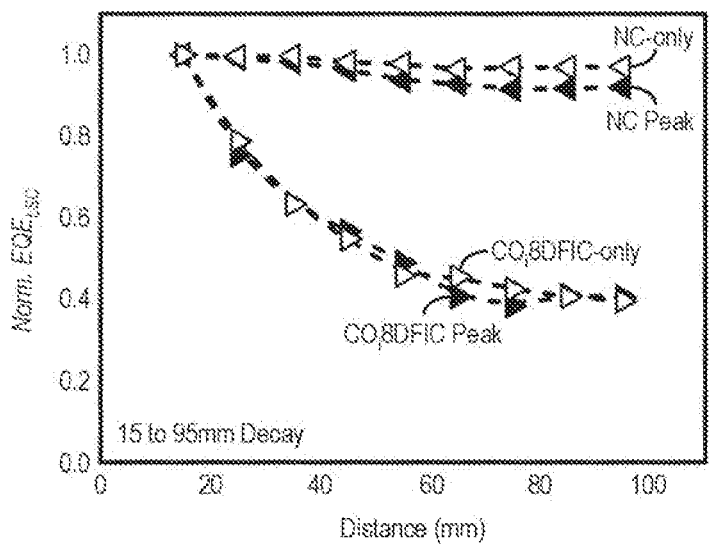
Figure 17E:
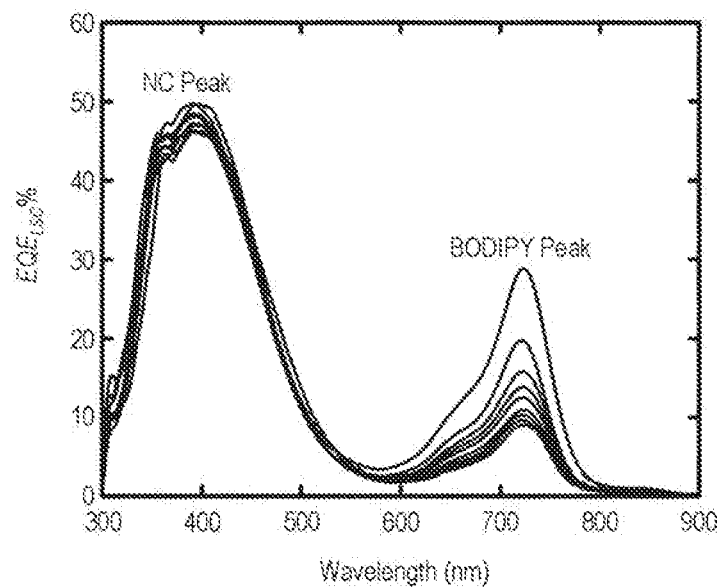
Figure 17F:
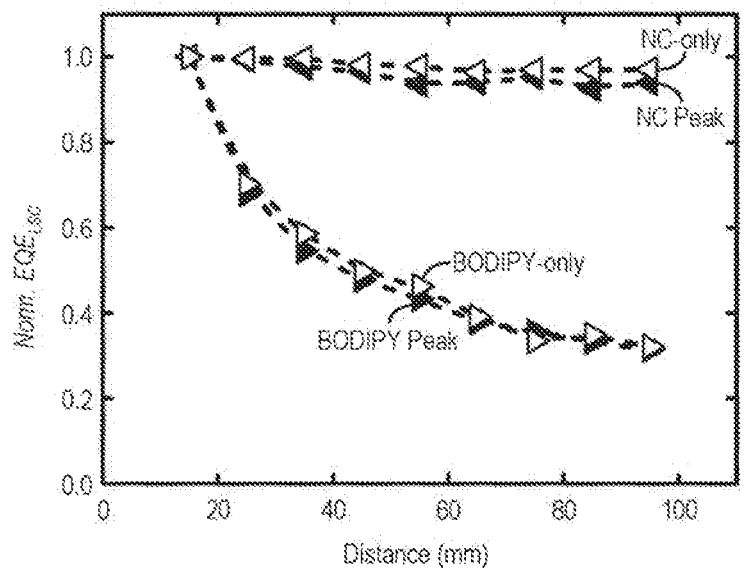

FIGS. 17A-17F are graphs showing current density versus voltage (J-V) characteristics of NC-only, NC+CO$_i$8DFIC, and NC+BODIPY TLSCs where all scans were measured under AM 1.5G illumination and all TLSCs were edge-mounted with the same GaAs PV cells (FIG. 17A); average $EQE_{LSC}(\lambda)$ spectra of NC-only, NC+CO$_i$8DFIC, and NC+BODIPY TLSCs where the corresponding integrated short-circuit current density ($J_{SC}^{int}$) match well with the $J_{SC}$ extracted from J-V characteristics shown in FIG. 17A (FIG. 17B); the absolute position-dependent $EQE_{LSC}$ spectra of a NC+CO$_i$8DFIC TLSC (FIG. 167C); the absolute position-dependent $EQE_{LSC}$ spectra of a NC+BODIPY TLSC (FIG. 17D); normalized position-dependent $EQE_{LSC}$ peak values of a NC+CO$_i$8DFIC TLSC (FIG. 17E); and normalized position-dependent $EQE_{LSC}$ peak values of a NC+BODIPY TLSC (FIG. 17F).

Figure 18A:
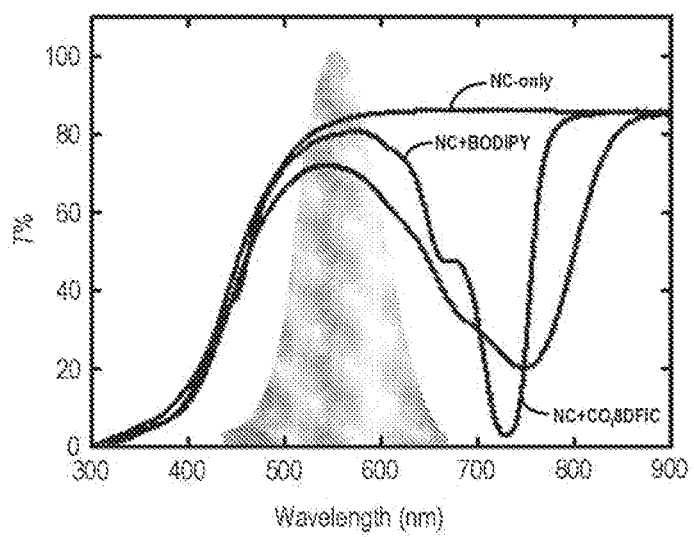
Figure 18B:
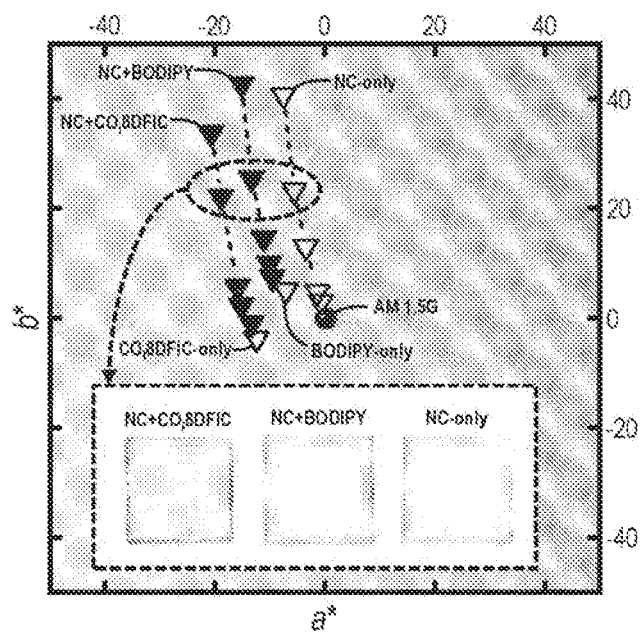

FIGS. 18A-18B show transmittance spectra (T($\lambda$)) of the NC-only, NC+CO$_i$8DFIC, and NC+BODIPY TLSCs along with the normalized photopic response of the human eye (V($\lambda$)) for comparison (FIG. 18A) and (a*, b*) coordinates of NC-only group, NC+CO$_i$8DFIC group and NC+BODIPY group TLSCs in CIELAB color space where within each group the NC concentration (1, 2, 5, 10 and 20 mg/mL) is the only variable (FIG. 18B). The (a*, b*) of CO$_i$8DFIC-only and BODIPY-only TLSCs are also included as references. The inset shows photographs of NC-only, NC+CO$_i$8DFIC, and NC+BODIPY TLSCs with NC concentration at 10 mg/mL.

Figure 19A:
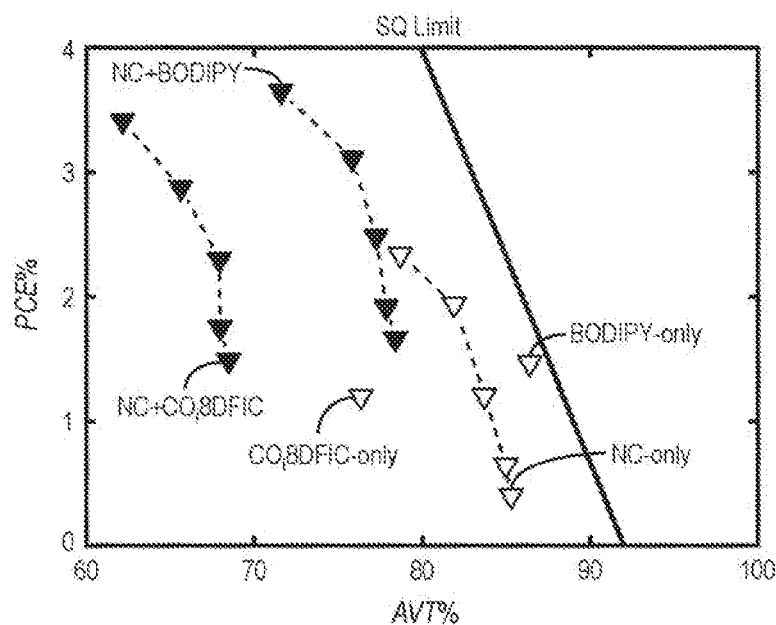
Figure 19B:
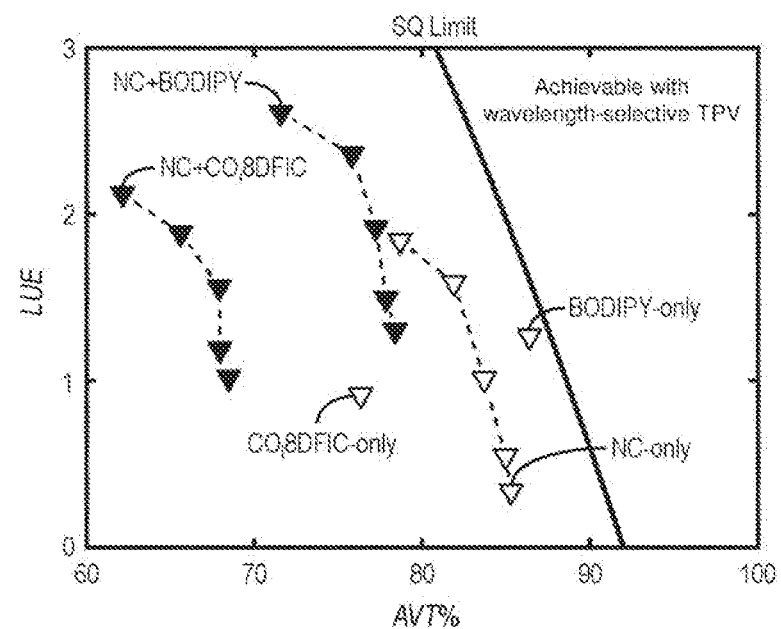

FIGS. 19A-19B are graphs showing power conversion efficiency (PCE) versus average visible transmittance (AVT) for NC-only group, NC+CO$_i$8DFIC group, NC+BODIPY group, CO$_i$8DFIC-only, and BODIPY-only TLSCs where the black line is the Shockley-Queisser (SQ) PCE limit for non-wavelength selective PV with partial visible transmittance and the region to the right of this line indicates the target PCE and AVT combination only achievable with the wavelength-selective approach (FIG. 19A) and light utilization efficiency (LUE=PCE×AVT) versus AVT for NC-only group, NC+CO$_i$8DFIC group, NC+BODIPY group, CO$_i$8DFIC-only, and BODIPY-only TLSCs where the black line is the Shockley-Queisser (SQ) LUE limit for non-wavelength selective PV with partial visible transmittance and the region to the right of this line indicates the target LUE and AVT combination only achievable with the wavelength-selective approach (FIG. 19B).

Figure 20A:
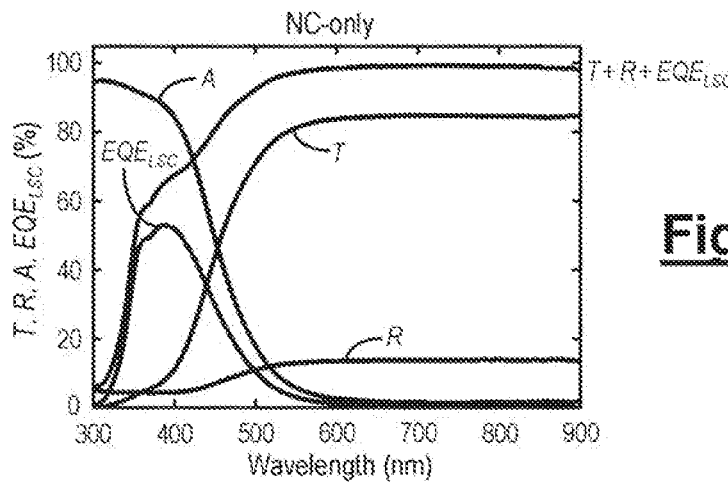
Figure 20B:
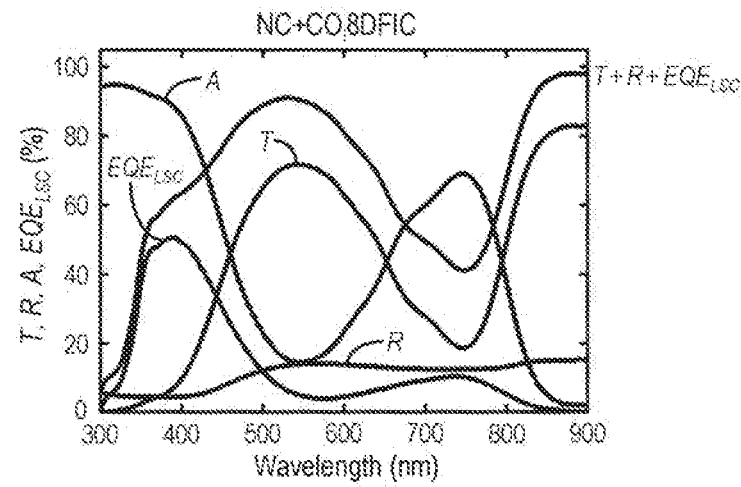
Figure 20C:
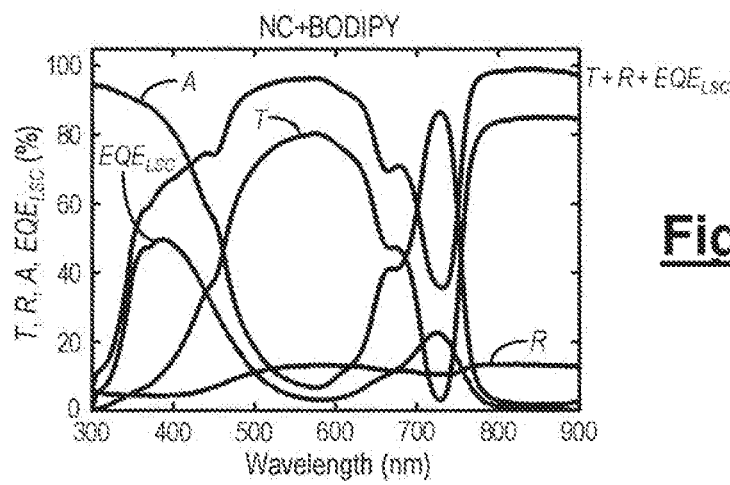

FIGS. 20A-20C are graphs showing the photon balance include T, R, A, and EQE for a device including nanoclusters only (FIG. 20A); a dual-band device including nanoclusters and CO$_i$8DFIC (FIG. 20B); and a dual-band device including nanoclusters and BODIPY (FIG. 20C).

Figures 21A, 21B, 21C:
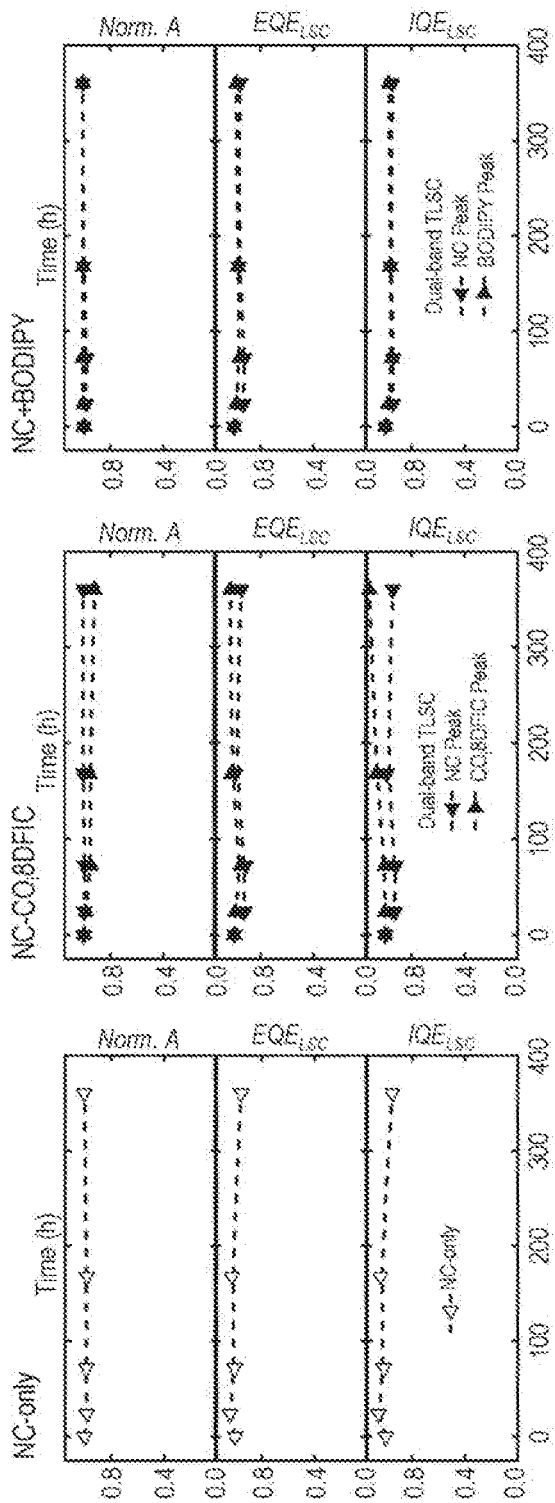

FIGS. 21A-21C show a photostability study of dual-band TLSCs: normalized peak values of absorption spectra, $EQE_{LSC}$, and $IQE_{LSC}$ for NC-only (FIG. 21A), NC+CO$_i$8DFIC (FIG. 21B), and NC+BODIPY (FIG. 21C) as a function of time under constant illumination.

Corresponding reference numerals indicate corresponding parts, components, and compositions throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a,""an," and "the" may be intended to include the plural forms as well, unless the context clearly indicates otherwise. The terms "comprises,""comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to,""connected to," or "coupled to" another element or layer, it may be directly on, engaged, connected or coupled to the other component, element, or layer, or intervening elements or layers may be present. In contrast, when an element is referred to as being "directly on,""directly engaged to,""directly connected to," or "directly coupled to" another element or layer, there may be no intervening elements or layers present. Other words used to describe the relationship between elements should be interpreted in a like fashion (e.g., "between" versus "directly between,""adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first,""second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before,""after,""inner," "outer,""beneath,""below," "lower,""above,""upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

Example embodiments will now be described more fully with reference to the accompanying drawings.

The current technology provides efficient, high performance TLSCs that provide natural, non-tinted light. The TLSCs comprise waveguides that are operatively coupled to luminophores that selectively absorb and emit light that is outside of the visible spectrum. These luminophores include non-fullerene acceptors, such as thiophenes, and boron-dipyrromethenes (BODIPYs). The TLSCs exhibit an average visible transmittance (AVT) of greater than or equal to about 50%, a color rendering index (CRI) of greater than or equal to about 80 at normal (i.e., 90°) incidence to the waveguide, a |b*| value less than 25, and a light utilization efficiency (LUE) of greater than or equal to about 1.

Figure 1A:
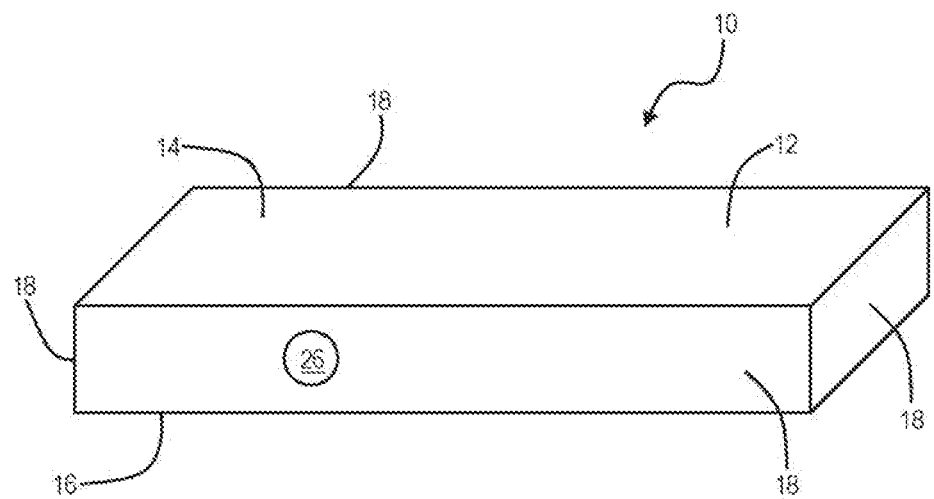
FIG. 1A is a schematic illustration of a TLSC in accordance with various aspects of the current technology.

With reference to FIG. 1A, the current technology provides a TLSC 10 comprising a waveguide 12. The waveguide 12 comprises a first surface 14 that receives light, such as incident light, and an opposing second surface 16 that transmits light. The waveguide 12 also comprises edges 18. The waveguide 12 comprises a visibly transparent material, which can be glass, low iron glass (such as Diamont® low iron glass, and Planilux® transparent glass from Saint Gobain (Paris, France) and Borofloat® 33 borosilicate glass from Schott (Mainz, Germany)), plastic, poly(methyl methacrylate) (PMMA), poly-(ethylmethacrylate) (PEMA), (poly)-butyl methacrylate-co-methyl methacrylate (PBMMA), polyethylene terephthalate (PET), polyimides, such as Kapton® polyimide films (DuPont, Wilmington, DE), and combinations thereof as non-limiting examples.

Figure 1B:
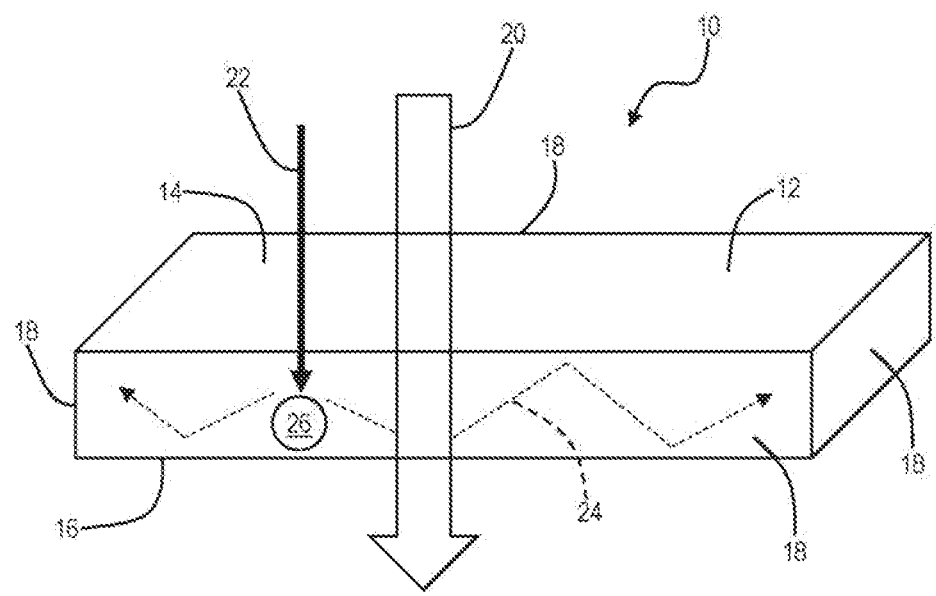
FIG. 1B is a schematic illustration of light interacting with the TLSC of FIG. 1A in accordance with various aspects of the current technology.

The waveguide 12 is in contact with a luminophore 26 (described in more detail below). FIG. 1B shows the TLSC 10 as it receives incident visible (VIS) light 20 and incident near infrared (NIR) light 22 on the first surface 14 of the waveguide 12. The luminophore 26 absorbs at least a portion of the NIR light light 22. However, the luminophore 26 does not substantially absorb the VIS light 20, which passes through the second surface 16 of the waveguide 12. The absorbed NIR light 22 excites the luminophore 26, which emits NIR light 24 of a different NIR wavelength, which is guided by the waveguide 12 to the edges 18. Therefore, the TLSC harvests the NIR light 22 and the waveguide 12 guides the NIR light 24 emitted from the luminophore 26. The emitted NIR light 24 is directed to a photovoltaic PV cell or a PV array to generate electricity, which is discussed in more detail below.

Figure 2A:
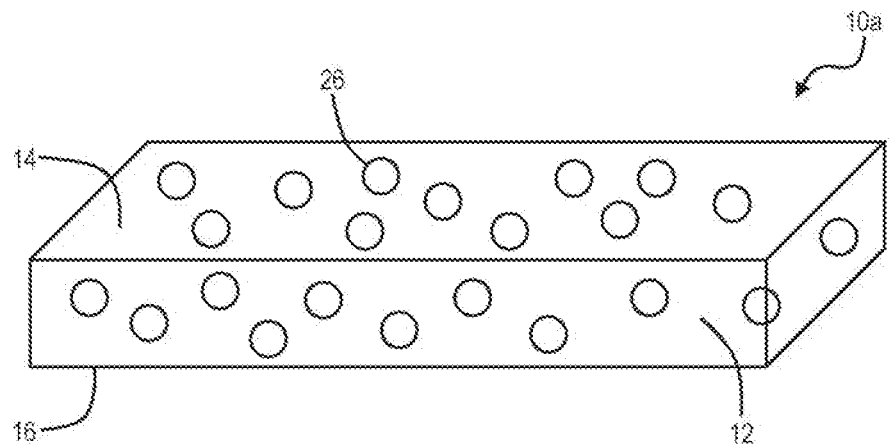
FIG. 2A is a schematic illustration of a TLSC in which luminophores are embedded within a waveguide in accordance with various aspects of the current technology.

FIG. 2A shows a TLSC 10a comprising the waveguide 12 of FIGS. 1A-1B and the luminophore 26. Here, the luminophore 26 is embedded within the waveguide 12. For example, during fabrication, the luminophore 26 is dispersed in a waveguide precursor composition. As the waveguide precursor composition solidifies or cures to form the waveguide 12, the luminophore 26 remains embedded in an internal matrix of the waveguide 12.

Figure 2B:
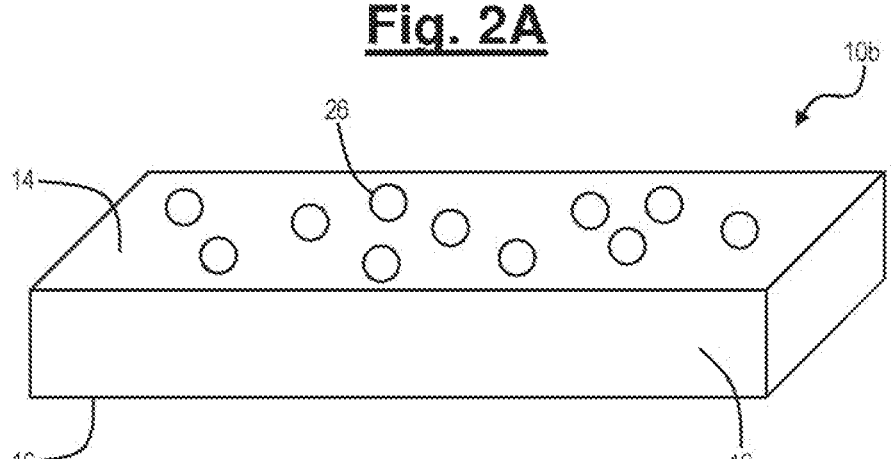
FIG. 2B is a schematic illustration of a TLSC in which luminophores are disposed directly onto a surface of a waveguide in accordance with various aspects of the current technology.

FIG. 2B shows a TLSC 10b in which the luminophore 26 is disposed directly on the first surface 14 of the waveguide 12. For example, after the waveguide is formed, a solution comprising a solvent and the luminophore 26 can be casted, deposited (e.g., vacuum deposited), pipetted, sprayed or poured onto the first surface 14. Upon removal of the solvent, e.g., by evaporation, only the luminophore remains on the first surface 14. Although the luminophore 26 is shown disposed directly on the first surface 14, it is understood that the luminophore 26 can alternatively be directly disposed on the second surface 16 or on both the first surface 14 and the second surface 16.

Figure 2C:
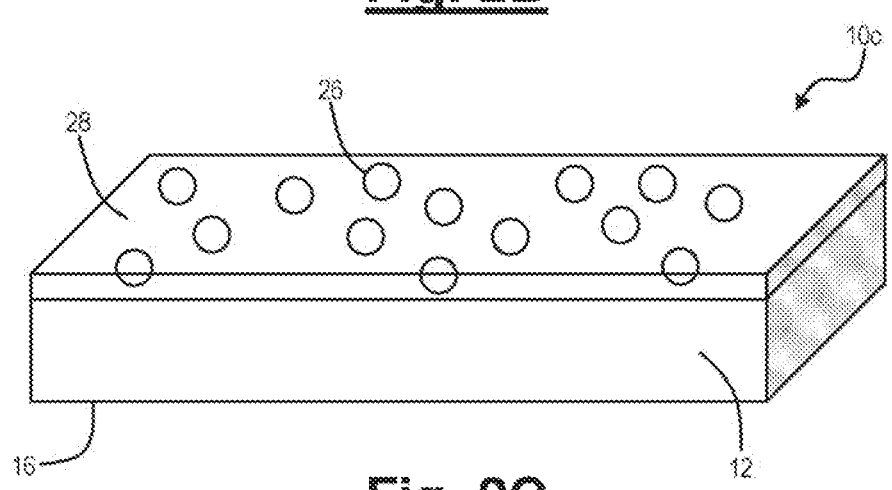
FIG. 2C is a schematic illustration of a TLSC in which a film comprising luminophores is disposed directly onto a surface of a waveguide in accordance with various aspects of the current technology.

FIG. 2C shows a TLSC 10c comprising a film 28 comprising the luminophore 26, wherein the film 28 is directly disposed on the first surface 14 of the waveguide 12 (which is no longer visible in FIG. 2C). The film 28 can be formed on the waveguide 12 or the film 28 can be formed separately and then disposed onto the first surface 14 of the waveguide 12. The film comprises a visibly transparent material such aspolymethyl methacrylate, poly(n-butyl acrylate)/poly (methyl methacrylate-co-methacrylic acid), polycarbonate, Polydimethylsiloxane, 4,4'-Bis(N-carbazolyl)-1,1'-biphenyl, SiO$_2$, mounting media such as Euikitt and Shandon, and combinations thereof as non-limiting examples. Although the film 28 is shown disposed directly on the first surface 14, it is understood that the film 28 can alternatively be directly disposed on the second surface 16 or on both the first surface 14 and the second surface 16. In some aspects, the film 28 is coupled to the waveguide by way of an adhesive, which may be an adhesive with a low refractive index.

As discussed above, the luminophore 26 harvests (i.e., absorbs) light with wavelengths in at least one of the NIR, and IR regions of the solar spectrum. As used herein, UV light has a wavelength from about 300 nm to about 450 nm, VIS light has a wavelength from about 450 nm to about 650 nm, NIR light has a wavelength from about 650 nm to about 1500 nm, and IR light has a wavelength form about 1500 nm to about 1 mm. The luminophore 26 has a strongest absorbance maximum of light at a wavelength of greater than or equal to about 650 nm. Many luminophores have a plurality of absorbance maxima that may be in various regions of the spectrum. Therefore, the "strongest absorbance maximum" is the absorbance maximum with the largest peak. Accordingly, the luminophore 26 has a strongest absorbance maximum in the NIR region of the spectrum, or in the infrared (IR) region of the spectrum. The luminophore 26 has a strongest peak emission of light at a wavelength of greater than or equal to about 650 nm. Similarly, many luminophores have a plurality of emission maxima that may be in various regions of the spectrum. Therefore, the "strongest peak emission" is the emission maximum with the largest peak. The luminophore 26 has a strongest peak emission in the NIR region of the spectrum, or in the IR region of the spectrum.

In some aspects, the luminophore 26 has a strongest absorbance maximum of greater than or equal to about 650 nm, which is in the NIR and IR regions of the spectrum, and less than or equal to about 50%, less than or equal to about 30%, less than or equal to about 20%, less than or equal to about 10%, or less than or equal to about 5% of the total light absorbed by the luminophore 26 has a wavelength in the VIS region of the spectrum. Put another way, of the total VIS incident light that contacts the luminophore, less than or equal to about 50%, less than or equal to about 30%, less than or equal to about 20%, less than or equal to about 10%, or less than or equal to about 5% of the total VIS incident light is absorbed by the luminophore 26. Conversely greater than or equal to about 50%, greater than or equal to about 70%, greater than or equal to about 80%, greater than or equal to about 90%, greater than or equal to about 95% of the total VIS light that contacts the waveguide 12 and the luminophore 26 is transmitted completely through the waveguide 12 without being scattered. Therefore, the TLSC 10 (and the TLSCs 10a, 10b, and 10c) are visibly transparent and a substantially free of haze. As used herein, the term "substantially free of haze" means that a device has less than or equal to about 20% haze as discussed in more detail below. As used herein the terms "transparent" or "visibly transparent" refer to TLSCs that have an average visible transmittance (AVT) of greater than or equal to about 50%, greater than or equal to about 60%, greater than or equal to about 75%, greater than or equal to about 80%, or greater than or equal to about 90%. The terms "opaque" or "visibly opaque" refer to devices that have an average visible transparency, weighted by the photopic response of an eye of 10% or less for specular transmission. Devices that have an AVT, weighted by the photopic response of an eye, of between 10% to 50% are "semitransparent." Therefore, the TLSCs 10, 10a, 10b, 10c are visually transparent having luminophores 26 that have a strongest peak absorbance in the NIR/IR and a strongest peak emission in the NIR/IR.

The luminophore 26 has an optical integral (OI) of less than or equal to about 50, less than or equal to about 20, less than or equal to about 10, or less than or equal to about 5. The OI quantifies reabsorption properties of a luminophore as:

$$OI = \int_0^\infty A(\lambda) \cdot PL^*(\lambda) d\lambda \qquad (1),$$

where $A(\lambda)$ is the single-path absolute absorption spectrum $(\lambda(\lambda)-1-R(?)-T((\lambda)))$ of a luminophore/host composite film and $PL^*(\lambda)d\lambda$ is the normalized emission spectrum of the luminophore in the host material. The OI depends on the thickness of a luminophore layer and the degree of overlap between absorption and emission spectra in a host material (rather than in a solution). Therefore, a decreasing OI corresponds to a decreasing overlap between absorption and emission spectra. By decreasing the overlap between absorption and emission spectra, efficiency losses due to reabsorption are decreased.

The luminophore 26 has a Stokes shift greater than or equal to about 10 nm or greater than or equal to about 30 nm, including Stokes shifts of about 10 nm, about 20 nm, about 30 nm, about 40 nm, about 50 nm, about 75 nm, about 100 nm, about 125 nm, about 150 nm, or larger.

In some aspects of the current technology, the luminophore 26 is a non-fullerene acceptor (electron acceptor), such as a thiophene a polythiophene, or a combination thereof. Non-limiting examples of thiophenes and polythiophenes include 2,2'-[[4,4,11,11-tetrakis(4-hexylphenyl)-4,11-dihydrothieno[2',3':4,5]thieno[2,3-d]thieno[2'''',3''''':4''',5''']thieno[2''',3''':4'',5''  ]pyrano[2'',3''':4',5']thieno[2',3':4,5]thieno[3,2-b]pyran-2,9-diyl]bis[methylidyne(5,6-difluoro) (CO,8DFIC), 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene) (ITIC), 2,2'-[[4,4,9,9-Tetrakis(4-hexylphenyl)-4,9-dihydro-s-indaceno[1,2-b:5,6-b']dithiophene-2,7-diyl]bis[[4-[(2-ethylhexyl)oxy]-5,2-thiophenediyl]methylidyne(5,6-difluoro-3-oxo-1H-indene-2,1(3H)-diylidene)]]bis[propanedinitrile] (IEICO-4F), derivatives thereof that do not change each molecular weight by more than about 50% and that retain each thiophene backbone, and combinations thereof.

In other aspects, the luminophore 26 is boron-dipyrromethene (BODIPY), which has the following structure.

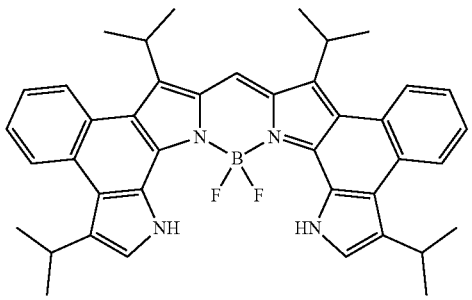

The luminophore 26 can also be a BODIPY derivative that keeps the following BODIPY backbone, such as BOD-66, Keio Flours (KFL), Oligothienyl-BODIPY, 4,4-difluoro-4-bora-3a,4a-diaza-s-indacene, "zig-zag" edge-fused BODIPY, aza-BODIPY, [a]-fused BODIPY, [b]-fused BODIPY, and combinations thereof, as non-limiting examples. These compounds can optionally be used in combination with BODIPY.

The luminophore 26 can be any combination of thiophene, polythiophene and BODIPY. For example, the TLSC 10 can include a first luminophore and a second luminophore, wherein the first luminophore is a thiophene or polythiophene and the second luminophore is a BODIPY.

In some aspects, the luminophore 26 is a luminescent nanocluster having a strongest absorbance maximum of less than or equal to about 450 nm, which is in the UV region of the spectrum, and less than or equal to about 50%, less than or equal to about 30%, less than or equal to about 20%, less than or equal to about 10%, or less than or equal to about 5% of the total light absorbed by the luminophore 26 has a wavelength in the VIS region of the spectrum. Put another way, of the total VIS incident light that contacts the luminophore, less than or equal to about 50%, less than or equal to about 30%, less than or equal to about 20%, less than or equal to about 10%, or less than or equal to about 5% of the total VIS incident light is absorbed by the luminophore 26. Conversely, greater than or equal to about 50%, greater than or equal to about 70%, greater than or equal to about 80%, greater than or equal to about 90%, greater than or equal to about 95% of the total VIS light that contacts the waveguide 12 and the luminophore 26 is transmitted completely through the waveguide 12. The luminophore 26 has a strongest peak emission in the NIR region of the spectrum, or in the IR region of the spectrum. Therefore, the TLSCs 10, 10a, 10b, 10c are visually transparent with the luminescent nanocluster and substantially free of haze. As used herein, the term "substantially free of haze" means that a device has less than or equal to about 20% haze as discussed in more detail below.

The luminescent nanoclusters can be hexanuclear clusters, octahedral clusters, tetrahedral clusters, Chevral clusters, edge-capped halide clusters, metal clusters, or Chalcogenide clusters. The hexanuclear clusters can comprise a phosphorescent metal halide nanocluster or a phosphorescent metal halide nanocluster salt. The metal halide or metal halide salt can be, as non-limiting examples, $M_6X_{12}$, $M_6X_{12} \cdot nR$, $A_2M_6X_{14}$, $A_2M_6X_{14} \cdot nR$, $EM_6X_{14}$, $EM_6X_{14} \cdot nR$, $M_6X_8L_6$, $A_2M_6X_8L_6$, $M_6X_{14}$, $M_6X_{14} \cdot nR$, $A_4M_6X_{18}$, or $A_4M_6X_{18} \cdot nR$, wherein M represents metals, X represents halogens, A and E represents terminal 1+ and 2+ cations respectively, R represents a first ligand, L represents a second ligand, such as propionate or pentafluoroproprionate, and n is value between zero and M+X. M is Mo, W, Cr, Mn, Tc, Re, Cu, Ti, V, Ta, Nb, Sn, Zn, Zr, or Ga; X is F, Cl, Br, I, At, or a mixture thereof; and A is $H^+$, $H_3O^+$, $K^+$, $Na^+$, $Li^+$, $Rb^+$, $Cu^+$, $Cs^+$, ammonium, butylammonium, tetrabutylammonium (TBA), or $NR'_4{}^+$ where R' is independently selected from alkyl or aryl groups, wherein R' is optionally substituted with one or more of halo, nitro, cyano, hydroxy, hydroxyalkyl, haloalkyl, haloalkoxy, amino, azido, carboxy, carbamoyl, mercapto, sulphamoyl, $C_{1-10}$ alkyl, $C_{2-10}$ alkenyl, $C_{2-10}$ alkynyl, $C_{1-10}$ alkoxy, $C_{1-10}$ alkoxyalkyl, $C_{1-10}$ alkanoyl, $C_{1-10}$ alkanoyloxy, N—($C_{1-10}$ alkyl)amino, N,N—

($C_{1-10}$ alkyl)$_2$amino, $C_{1-10}$ alkanoylamino, N—($C_{1-10}$ alkyl)carbamoyl, N,N—($C_{1-10}$ alkyl)$_2$carbamoyl, $C_{1-10}$ alkyl-S(O)$_a$ wherein a is 0, 1 or 2, $C_{1-10}$ alkoxycarbonyl, N—($C_{1-10}$ alkyl)sulphamoyl, N,N—($C_{1-10}$ alkyl)$_2$sulphamoyl, H$_2$NS(O)$_2$NH—, N—($C_{1-10}$ alkyl)NHS(O)$_2$NH—, N,N—($C_{1-10}$ alkyl)$_2$NS(O)$_2$NH—, aryl, aryloxy, arylthio, heteroaryl, heteroaryloxy, cycloalkyl, cycloalkyloxy, heterocyclyl, heterocyclyl(C=O)—, heterocyclyloxy and heterocyclylthio, wherein these selections are non-limiting; L is F, Cl, Br, I, At, S, propionate, pentafluoroproprionate, or a mixture thereof, E is Be$^{2+}$, Mg$^{2+}$, Ca$^{2+}$, Sr$^{2+}$, Cu$^{2+}$, Ni$^{2+}$, Ti$^{2+}$, Ba$^{2+}$ or a mixture thereof; and R is H$_2$O, CH$_3$CN, or any other solvate.

Metal halide clusters, for example phosphorescent metal (II) halide clusters, can be modified from the parent salt compounds through ligand exchange reactions. The parent ion is usually synthesized through reduction of M(V)X$_5$, or obtained directly in the form of M(II)X$_2$. For Mo-based clusters, the parent compound is purified by conversion to the HCl salt, which is returned to M(II)X$_2$ or M(II)X$_{12}$ via heat-treatment under vacuum. Ligand exchange can be carried out in a Soxhlet extractor or by direct reaction in acidic solutions in the presence of free cations, forming various complexes or salts respectively. The properties of a selected range of metal halide complexes synthesized here (hydrates and salts) exhibit quantum yields from about 1% to great than about 70%. Many amine and thiol based ligands can be substituted around the terminal halides through thiolate and amine coordination. M, X, and L are varied in MX$_2$.L$_2$, AMX$_2$.L$_2$, M$_6$X$_{12}$.L$_2$, A$_2$M$_6$X$_{14}$, and A$_2$M$_6$X$_{14}$.L$_2$ including M=W, Mo and X=Cl, Br, I, and L=Cl, CH$_3$CN, benzenethiols, ethanethiols, H$_2$O (hydrates), HCl, acetonitrile (CAN) and A=K, Na, tetrabutylammonium (TBA), and other ammonium salts. Moreover, amines and ammonium salts can be readily anchored to polymer chain backbones to enhance particle separation and increase quantum yields. Exemplary phosphorescent nanoclusters include K$_2$Mo$_6$Cl$_{14}$, TBA$_2$Mo$_6$Cl$_{14}$, (H$_3$O)$_2$Mo$_6$Cl$_{14}$, and combinations thereof.

Figure 3A:
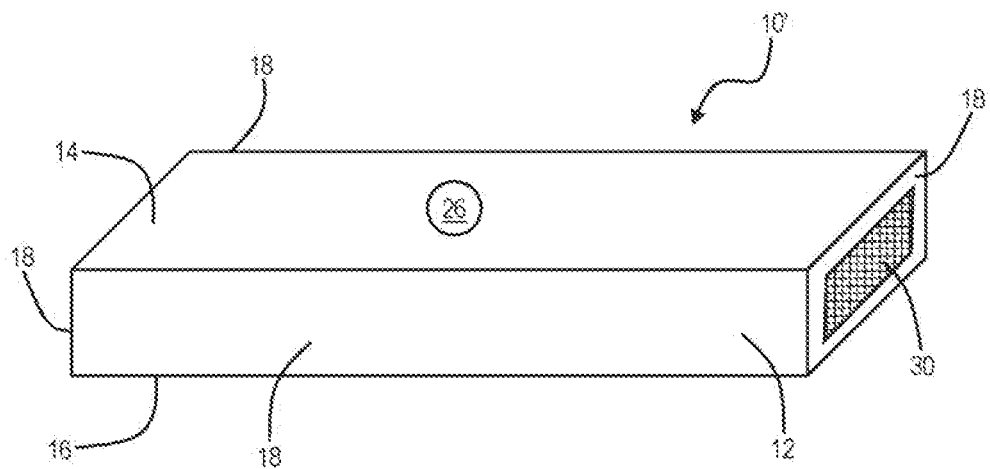
FIG. 3A is a schematic illustration of a TLSC in which a photovoltaic cell is disposed onto an edge of a waveguide, where the edge can be rectangular, curved, or beveled in accordance with various aspects of the current technology.
Figure 3B:
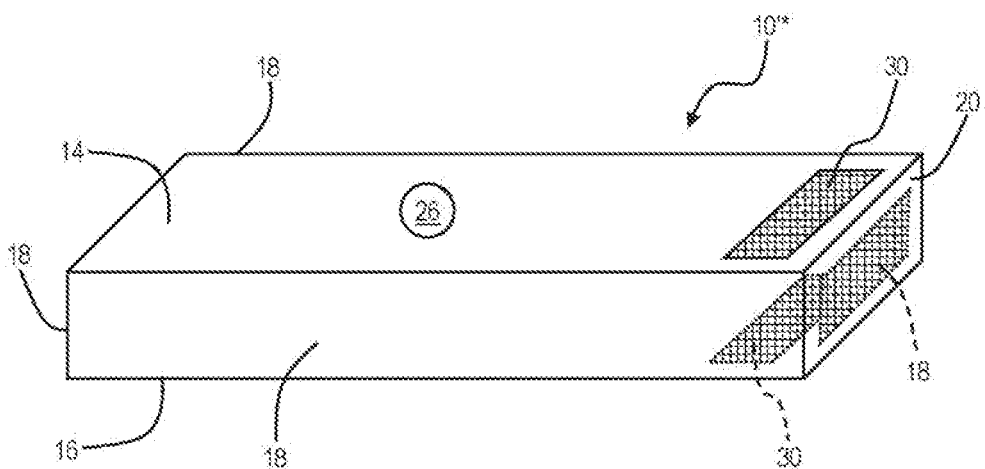
FIG. 3B is a schematic illustration of a TLSC in which a photovoltaic cell is disposed onto a surface of the waveguide. Optional additional photovoltaic cells are disposed onto at least one of a second surface of the waveguide and an edge of the waveguide in accordance with various aspects of the current technology.

The TLSC 10 of FIG. 1 also includes a photovoltaic (PV) component, such as a PV cell or a PV array. FIGS. 3A and 3B show TLSCs 10', 10'* having the same components as the TLSC 10 in FIGS. 1A and 1B. However, the solar concentrator 10' comprises a PV cell 30 disposed onto one of the edges 18 of the waveguide 12, and the TLSC 10'* comprises a PV cell 30 disposed on the first surface 14 of the waveguide 12, and PV cells 30 optionally disposed onto the edge 18 and/or onto the second surface 16, such that the PV cells 30 are operably coupled to the waveguide 12. By "operably coupled" it is meant that NIR or IR radiation within the waveguide 12, emitted from the luminophore 26, can be transferred to the PV cell 30. In various aspects, the TLSC 10' of FIG. 3A comprises the PV cell 30 on at least one edge 18 of the waveguide 12. In FIG. 3B, PV cells 30 are located on the first and/or second surface 14, 16 of the waveguide 12 at or near the edge 18, which can be, for example, rectangular, curved, or beveled. By "at or near the edge 18" it is meant that the PV cells 30 abut the edge 18 or are within about 10 cm, within about 5 cm, or within about 2.5 cm of abutting the edge 18. In aspects where the PV cells 30 are disposed onto surfaces 14, 16 of the waveguides 12, the waveguide surfaces 14, 16 may be roughed at a location of the PV cells 30 or the PV cells 30 can be embedded in the waveguides 12 to ensure that the PV cells 30 are operably coupled to the waveguides 12 by reducing total internal reflection at PV-waveguide interfaces.

Figure 3C:
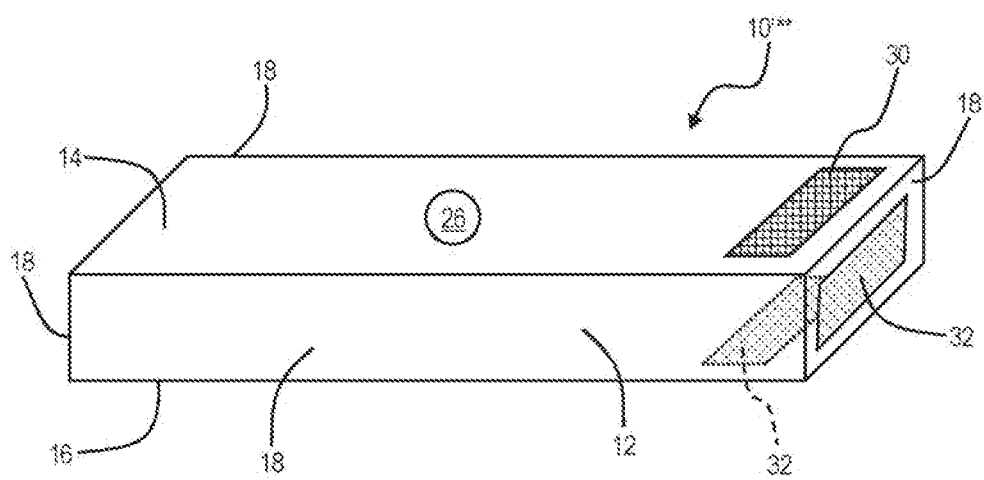
FIG. 3C is a schematic illustration of a TLSC in which a photovoltaic cell is disposed onto a first surface of the waveguide and a wavelength-specific mirror is disposed onto an edge of the waveguide. An optional wavelength-dependent mirror is disposed onto a second surface of the waveguide in accordance with various aspects of the current technology.
Figure 3D:
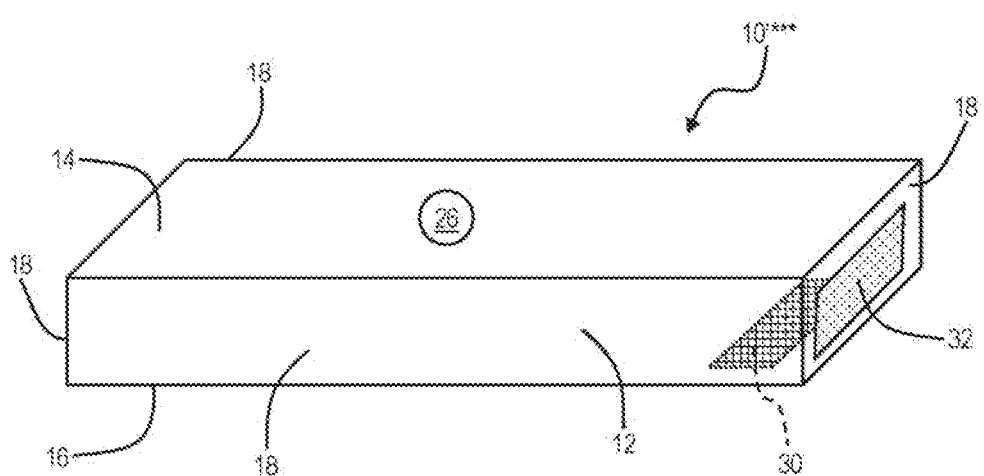
FIG. 3D is a schematic illustration of a TLSC comprising a waveguide and a luminophore. A photovoltaic cell is disposed onto a first surface of the waveguide and a wavelength-specific mirror is disposed onto an edge of the waveguide in accordance with various aspects of the current technology.

FIGS. 3C and 3D show TLSCs **10'\*\*, 10'\*\*\* having the same components as the solar concentrator 10 in FIGS. 1A and 1B. However, the TLSCs 10'\*\*, 10'\*\*\* of FIGS. 3C and 3D include at least one wavelength-dependent mirror 32 and at least one PV cell 30. More particularly, in FIG. 3C, the TLSC 10'\*\* comprises the PV cell 30 on the first surface 14 of the waveguide 12 at or near the edge 18 and a wavelength-dependent mirror 32 on the edge 18. An optional second wavelength-dependent mirror 32 is disposed onto the second surface 16 of the waveguide 12 at or near the edge 18. In FIG. 3D, the TLSC 10'\*\*\* comprises the PV cell 30 disposed onto the second surface 14 of the waveguide 12 at or near the edge 18 and a wavelength-dependent mirror 32 disposed onto the edge 18. A description of wavelength-dependent mirrors is provided in more detail below with reference to FIG. 4**.

Figure 3E:
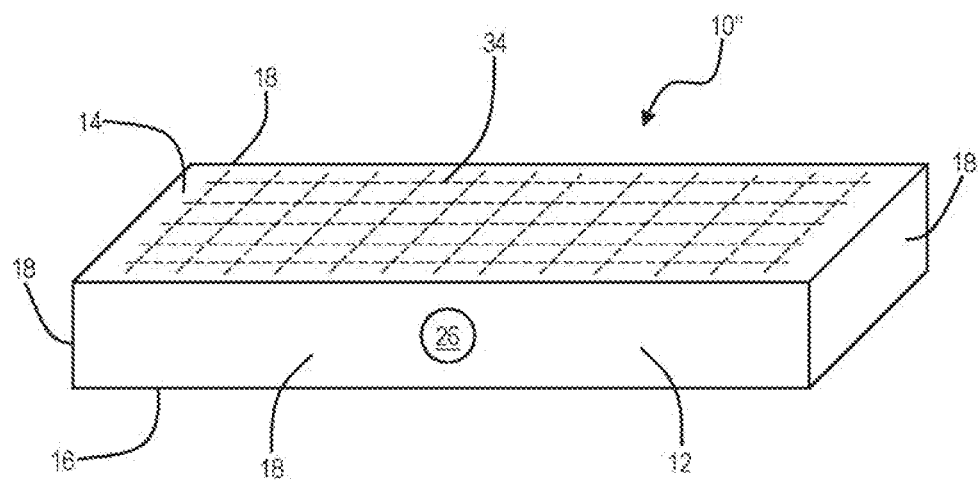
FIG. 3E is a schematic illustration of a TLSC comprising a waveguide and a luminophore. A photovoltaic array is disposed at or near a surface of the waveguide in accordance with various aspects of the current technology.
Figure 3F:
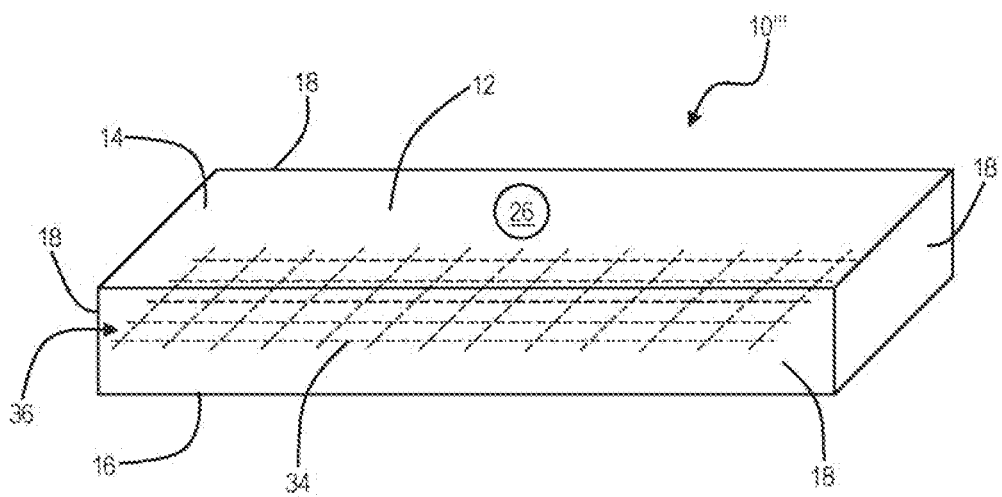
FIG. 3F is a schematic illustration of a TLSC comprising a waveguide and a luminophore. A photovoltaic array is embedded within the waveguide in accordance with various aspects of the current technology.

FIGS. 3E and 3F show TLSCs 10", 10''' having the same components as the solar concentrator 10 in FIGS. 1A and 1B. However, the TLSCs 10", 10''' have a segmented PV array 34 that is operably coupled to the waveguide 12. In FIG. 3E, the PV array 34 is disposed onto the surface 14 of the waveguide 12. In FIG. 3F, the PV array 34 is disposed within a central region 36 of the waveguide 12, such as in the bulk of the waveguide 12 interior matrix. The PV array 34 can be provided as a coating or spraying on the waveguide 12 or by layering dyed sheets as strata between alternating stacks the collectively form the waveguide 12. Although the PV array 34 may not be visibly transparent, it has a size that is sufficiently small, such that the PV array 34 does not substantially affect the transparent nature of the solar concentrator 10. For example, in various embodiments, the PV array 34 occupies less than or equal to about 20%, less than or equal to about 15%, less than or equal to about 10%, less than or equal to about 5%, less than or equal to about 2.5% of the waveguide 12. Put another way, the PV array 34 blocks less than about 20%, less than or equal to about 15%, less than or equal to about 10%, less than or equal to about 5%, less than or equal to about 2.5% of the light that contacts the solar concentrator 10. In some embodiments, the PV array 34 may be slightly visible by a human viewer as thin lines or dots, or the PV array 34 may be microscopic and invisible to a human viewer.

In various aspects, the PV array 22 is a mesh comprising wires, microwires, nanowires, ribbons, slivers, spheres, dots, combinations thereof, or the like arranged within or placed on the surface 24 of the waveguide 16 (FIG. 2F). More than one PV array 22 can be utilized to reduce thermal losses. The PV cell 18 of FIG. 2B and the PV array 22 of FIGS. 2F and 2G can comprise any material known in the art. Non-limiting examples of solar array and solar cell materials include germanium (Ge); amorphous germanium (a-Ge); gallium (Ga); gallium arsenide (GaAs); gallium nitride (GaN), gallium indium nitride (IN$_x$Ga$_{1-x}$N, 0<x<1), silicon (Si); amorphous silicon (a-Si); silicon-germanium (SiGe); amorphous silicon-germanium (a-SiGe); gallium indium phosphide (GaInP); copper indium selenide, copper indium sulfide, or combinations thereof (CIS); copper indium gallium selenide, copper indium gallium sulfide, or combinations thereof (CIGS); cadmium telluride (CdTe); perovskites (PV), such as CH$_3$NH$_3$PbI$_3$, CH$_3$NH$_3$PbCl$_3$ and CH$_3$NH$_3$PbBr$_3$; and combinations thereof.

In some aspects, the PV array 34 shown in regard to the TLSCs 10", 10''' of FIGS. 3E and 3F are wired in series and may include adducts, such as spheres or dots. For example, the PV array 34 may comprise a Si sphere solar array connected by thin-wire electrical connections. In one embodiment, the PV array 34 comprises spheres that are wired together to form a mesh. Advantageously, using spherical or multi-sided PV arrays 34 further increases system efficiency, as each cell can capture both direct and indirect sunlight at multiple angles. The PV array 34 can be located at different positions within the waveguide 12, at or near the surfaces 14, 16, or the PV array 34 can have a thickness that is about the same overall thickness of the waveguide 12. In some aspects, the TLSC 10″, 10‴ can comprise a plurality of PV arrays 34, located at different positions within the waveguide 12.

By positioning segmented PV arrays 34 at the first or second surface 14, 16 of the waveguide 12, it is possible to capture luminesced light before it is lost optically due to dye reabsorption. Alternatively, the PV arrays 34 can be embedded within the waveguide 12. This loss of reabsorption is particularly beneficial for fluorescent materials with small Stokes shifts. Depending on where the PV arrays 34 are positioned in the waveguide 12, the luminophore 26 can be either embedded in, or juxtaposed to, the PV array 34. Also, by positioning the PV arrays 34 at the first or second surface 14, 16 of the waveguide 12, a fraction of forward emitted light can be captured, which further reduces optical losses and enhances the efficiency of spatially segmented PV arrays 34 by utilizing a greater fraction of NIR light between cells.

Figure 4:
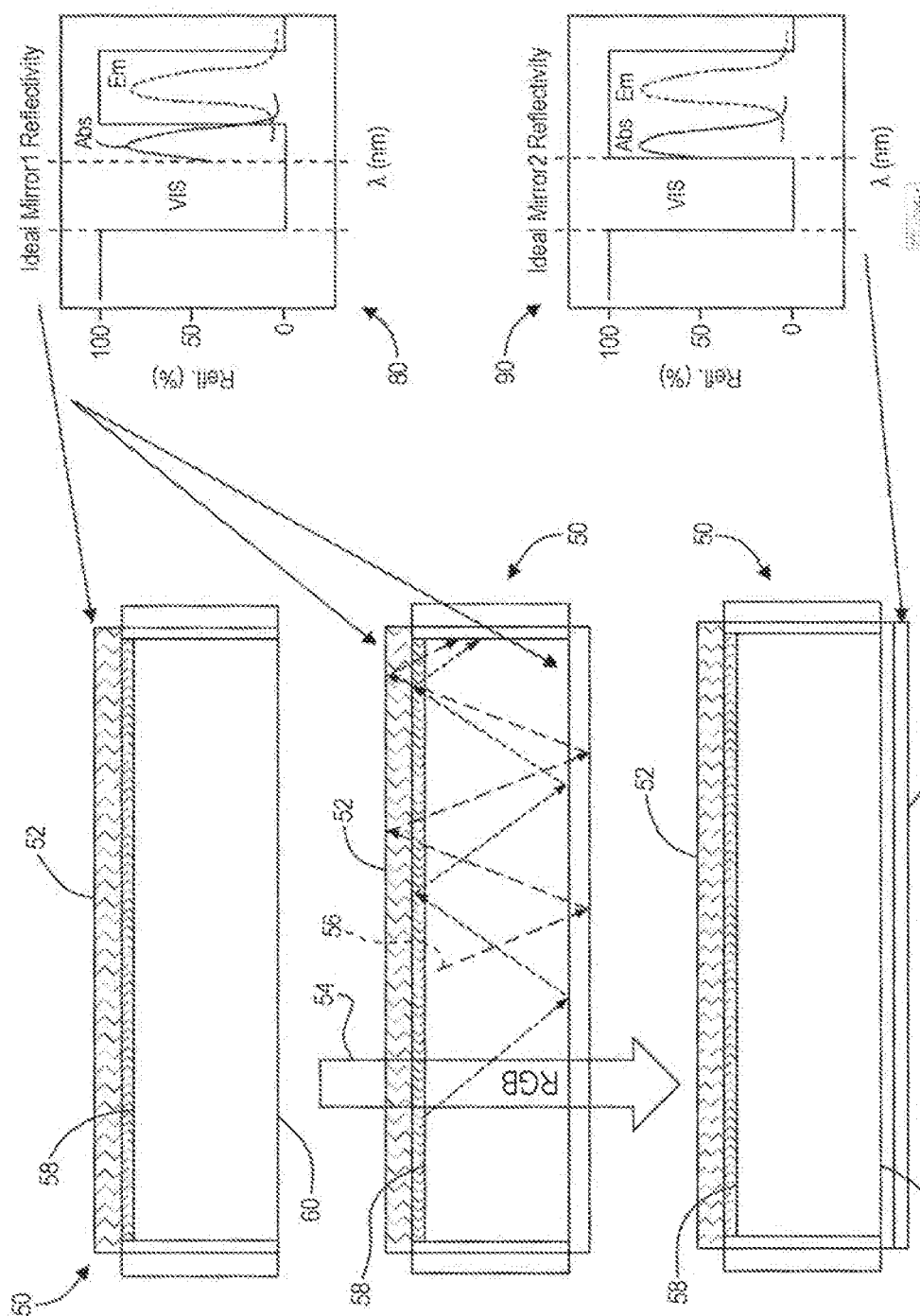
FIG. 4 is a schematic illustration of an exemplary TLSC including a wavelength-dependent mirror according to various aspects of the current technology.

As shown in FIG. 4, a TLSC 50 can comprise a first wavelength-dependent mirror 52. The first wavelength-dependent mirror 52 can have a reflectivity of NIR light corresponding to only an emission spectrum of a luminophore as shown in graph 80. Therefore, the first wavelength-dependent mirror 52 is transparent to visible light 54, but reflects NIR light 56 in an emission range shown in graph 80. The first wavelength-dependent mirror 52 can be functionally coupled to a first surface 58 of the TLSC 50, which comprises a luminophore as described above. Alternatively, the first wavelength-dependent mirror 52 can be functionally coupled to a second surface 60 of the TLSC 50, or to both surfaces 58, 60. In other aspects, the luminophore is on the second surface 60 or embedded within the waveguide.

With further reference to FIG. 3, the TLSC 50 can comprise a second wavelength-dependent mirror 62. The second wavelength-dependent mirror 62 can have a reflectivity of NIR light corresponding to both absorption and emission spectra of a modified luminophore as shown in graph 90. The second wavelength-dependent mirror 62 is transparent to visible light 54, but reflects NIR light 56 in an emission range shown in graph 90. The second wavelength-dependent mirror 62 can be functionally coupled to the first surface 58 of the TLSC 50, to the second surface 60 of the TLSC 50, or to both surfaces 58, 60. In one embodiment, the first wavelength-dependent mirror 52 is functionally coupled to the first surface 58 of the TLSC 50, and the second wavelength-dependent mirror 62 is functionally coupled to the second surface 60 of the TLSC 50. As described above, a photovoltaic array can be positioned on the first surface 58, the second surface 60, or within the waveguide. In various embodiments, the TLSC 50 comprises a plurality of solar arrays positioned at any of the first surface 58, the second surface 60, or within the waveguide between the first and second surfaces 58, 60. In yet other embodiments, the TLSC 50 comprises a solar cell positioned at an edge of the TLSC 50 that is adjacent to the first and second surfaces 58, 60.

Incorporation of visibly transparent, selective NIR wavelength-dependent mirrors 52, 62 in transparent photovoltaics (TPVs) substantially improves power conversion efficiencies by 50-100%. Similarly, the incorporation of these mirrors 52, 62 improves the optical efficiency at low plate dimension by greater than about 20%, while reducing the quantity of modified luminophore needed by about half for a given optical density. For solar concentrator sizes of greater than about 0.5 m$^2$, these mirrors 52, 62 are helpful in mitigating any surface and bulk scattering imperfections that could reduce system efficiencies. The mirrors 52, 62 can be coatings that improve collector absorption and increase waveguiding. Moreover, these coating layers are very similar to low-e-coatings that are already ubiquitously deployed and can complement or replace much of their functionality for heat rejection. Alternating layer combinations of $TiO_2$, $SiO_2$, and $Al_2O_3$ can be grown by e-beam evaporation, pulsed laser deposition, plasma-enhanced sputtering, thermal deposition, chemical vapor deposition, or solution deposition to optimize overall color impact and performance. It is understood that the above discussion in regard to FIG. 4 applies to the TLSCs described in FIGS. 1A-1B, 2A-2B, and 3A-3F.

Figure 5A:
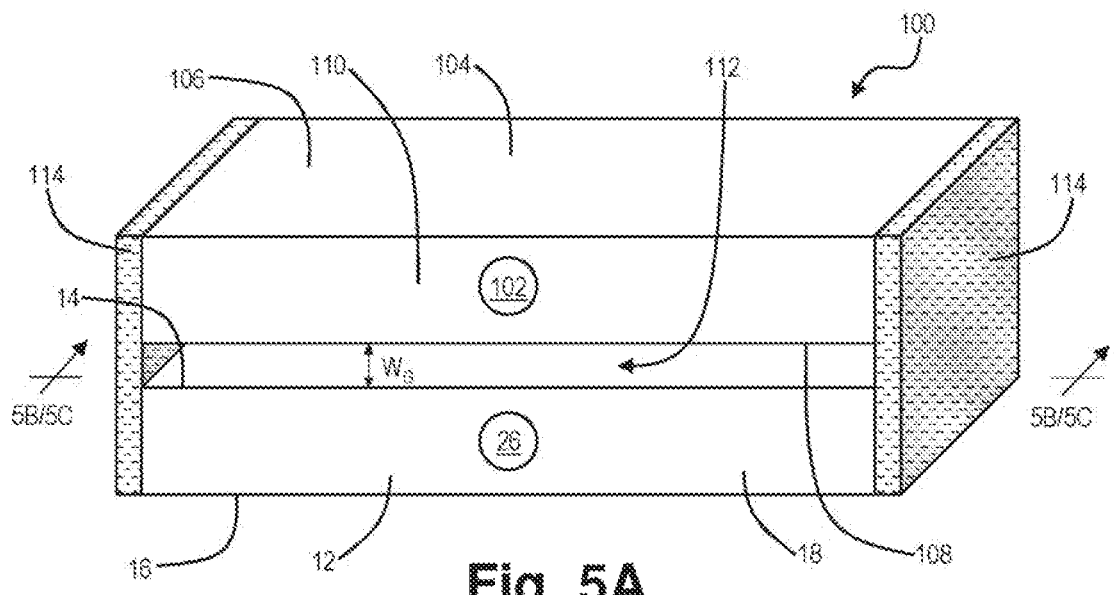
FIG. 5A is a schematic illustration of a transparent dual-band device in accordance with various aspects of the current technology.

With reference to FIG. 5A, the current technology also provides a transparent dual-band device 100. The dual-band device 100 comprises the waveguide 12 discussed above in all its permutations in reference to FIGS. 1A-1B, 2A-2B, 3A-3F, and 4. However, the luminophore 26 has a strongest absorbance maximum and a strongest peak emission greater than or equal to about 650 nm as discussed above, and a quantum yield of greater than or equal to about 15%, greater than or equal to about 20%, or greater than or equal to about 25%. The luminophore 26 is not a UV harvesting luminescent nanocluster as discussed above. Therefore, the luminophore is a thiophene, a polythiophene, a BODIPY, a porphyrin, a phthalocyanine, or a combination thereof. The transparent dual-band device 100 further comprises a second luminophore 102 and a second waveguide 104 that guides light emitted from the second luminophore 102. The second luminophore 102 is a luminescent emitter having a strongest absorbance maximum less than or equal to about 450 nm and a strongest peak emission greater than or equal to about 650 nm as discussed above. As a non-limiting example, the second luminophore 102 can be at least one of the luminescent nanoclusters described above. Moreover, the second luminophore has a quantum yield (QY) greater than or equal to about 20%, greater than or equal to about 30%, greater than or equal to about 40%, or greater than or equal to about 50%.

The second waveguide 104 has a third surface 106 and an opposing fourth surface 108 and edges 110 (only one of four edges 110 being visible in FIG. 5A). The third surface 106 receives incident light and the fourth surface 108 transmits light. The waveguides 12, 104 are arranged adjacent to each other so that the first surface 14 of the waveguide 12 receives light that is transmitted through the fourth surface 108 of the second waveguide 104. Moreover, second waveguide 104 is not in direct physical contact with the waveguide 12. Rather, the waveguides 12, 104 are arranged in a manner that defines a gap (or separation) 112 between the waveguide 12 and the second waveguide 104. The gap 112 ensures that the emitted light guided in each waveguide 12, 104 does not transfer into the opposing waveguide 12, 104. For example, the gap 112 prevents the luminophore 26 from possibly absorbing NIR light emitted from the second luminophore 102. The width of the gap 112, i.e., distance between the first surface 14 of the waveguide 12 and the fourth surface 108 of the second waveguide, is $W_G$, which is greater than or equal to about 1 nm, to less than or equal to about 10 mm or even wider. Exemplary widths $W_G$ include about 10 nm, about 100 nm, about 500 nm, about 1 µm, about 1 µm, about 1 µm, about 1 μm, about 100 μm, about 250 μm, about 500 μm, about 750 μm, about 1 mm, 2 mm, 3 mm, 4 mm, 5 mm, 6 mm, 7 mm, 8 mm, 9 mm, and 10 mm.

The transparent dual-band device 100 also comprises at least one PV cell 114. Each PV cell 114 is coupled to corresponding edges 18, 110 of the waveguides 12, 104. Put another way, single and unitary PV cells 114 is coupled to the edge 18 of the waveguide 12 and to the edge 110 of the second waveguide 104. As such, the transparent dual-band device 100 is a single-cell device (as opposed to a dual-cell, multi-cell, or multifunction device having separate PV cells for each waveguide). In some aspects, a luminophore having a strongest absorbance maximum in the UV and a strongest peak emission in the NIR and/or IR is used with a second luminophore having a strongest absorbance maximum in the UV and a strongest peak emission in the UV. In other aspects, a luminophore having a strongest absorbance maximum in the UV and a strongest peak emission in the NIR and/or IR is used with a second luminophore having a strongest absorbance maximum in the NIR and a strongest peak emission in the NIR and/or IR, wherein the strongest peak emission of the luminophore is different from the strongest absorbance maximum and the strongest peak emission of the second luminophore. With these aspects it is possible to couple the same PV cell to both waveguides or couple distinct PV cells to each waveguide with each PV cell having a distinct bandgap close to the emission edge of the UV absorber/emitter and the NIR absorber/emitter to reduce thermalization losses.

Figure 5B:
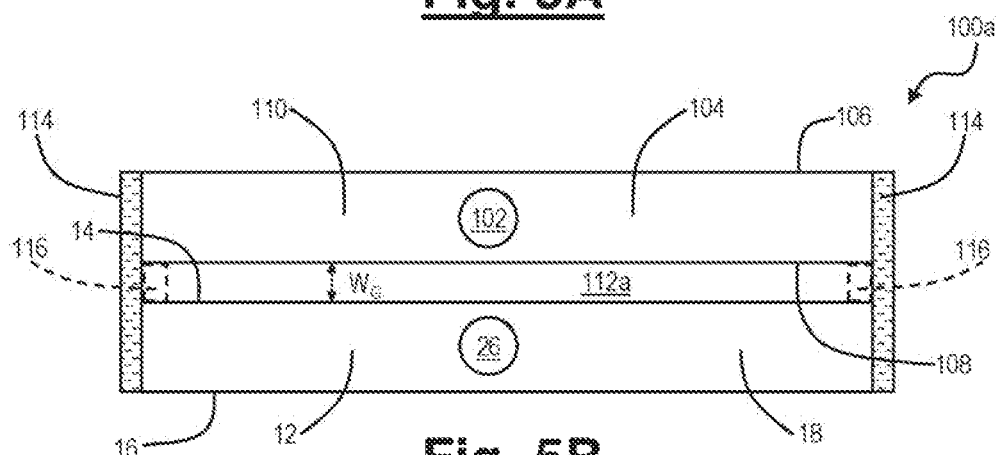
FIG. 5B is a view of the transparent dual-band device of FIG. 5A taken along line 5B/5C. The transparent dual-band device includes an air layer separating two waveguides in accordance with various aspects of the current technology.

FIG. 5B is a view of the transparent dual-band device 100 of FIG. 5A taken along line 5B/5C. More particularly, FIG. 5B shows a transparent dual-band device 100a in which the gap 112a is filled with air. As such, the gap 112a is an air gap or a layer comprising air. Here, the at last one PV cell 114 can maintain the device architecture. However, the transparent dual-band device 100a optionally comprises spacers 116 that separate the waveguide 12 from the second waveguide 104.

Figure 5C:
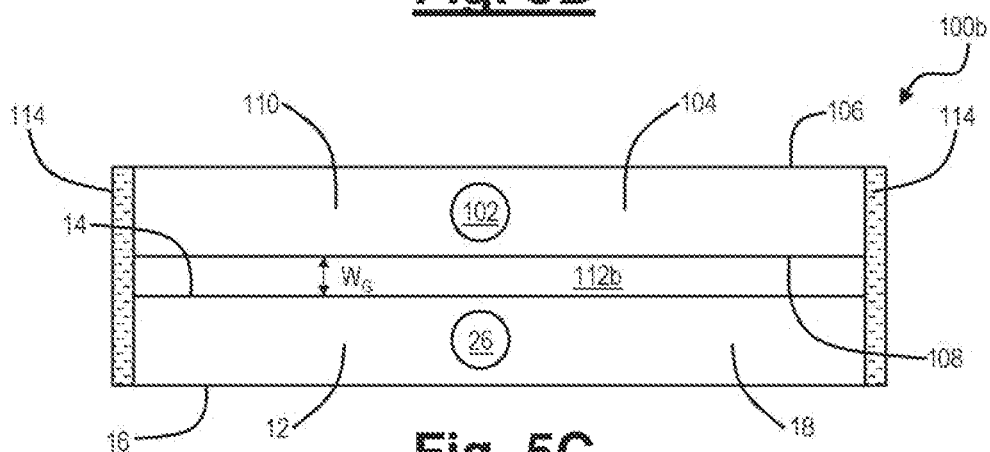
FIG. 5C is a view of the transparent dual-band device of FIG. 5A taken along line 5B/5C. The transparent dual-band device includes a layer comprising a transparent material separating two waveguides in accordance with various aspects of the current technology.

FIG. 5C is a view of the transparent dual-band device 100 of FIG. 5A taken along line 5B/5C. More particularly, FIG. 5B shows a transparent dual-band device 100a in which the gap 112b is a layer comprising a visually transparent material. The visually transparent material has an index of refraction (n) of less than or equal to about 1.45 or less than or equal to about 1.3. Thus, the index of refraction (n) is greater than or equal to about 1 to less than or equal to about 1.45 or greater than or equal to about 1 to less than or equal to about 1.3. The index of refraction (n) can be about 1, about 1.05, about 1.1, about 1.15, about 1.2, about 1.25, about 1.3, about 1.35, about 1.4, or about 1.45.

As discussed above, all of the device described herein have an AVT of greater than or equal to about 50%, greater than or equal to about 60%, greater than or equal to about 75%, greater than or equal to about 80%, or greater than or equal to about 90%. Exemplary AVTs exhibited by devices of the current technology include about 50%, about 55%, about 60%, about 65%, about 70%, about 80%, about 85%, about 90%, and about 95%.

All of the devices described herein have a color rendering index (CRI) of greater than or equal to about 80, greater than or equal to about 85, or greater than or equal to about 90. Exemplary CRIs exhibited by devices of the current technology include about 80, about 85, about 90, and about 95. The transmittance (AVT) and clarity values provided herein are at normal (i.e., 90°) incidence to the waveguides.

All of the devices described herein have a $L^*a^*b^*$ color space defined by the International Commission on Illumination (CIE), i.e., a CIELAB color space, that is substantially white. More particularly, the devices exhibit $|a^*|$ and $|b^*|$ values of less than or equal to about 25, less than or equal to about 20, less than or equal to about 15, less than or equal to about 10, and less than or equal to about 5 and $L^*$ values greater than or equal to about 10, greater than or equal to about 25, greater than or equal to about 50, greater than or equal to about 75, or greater than or equal to about 95, including $L^*$ values of about 100, about 95, about 90, about 85, about 80, about 75, about 70, about 65, about 60, about 55, about 50, about 45, about 40, about 35, about 30, about 25, about 20, about 15, and about 10. More particularly, the devices exhibit $sqrt(|a^*|^2+|b^*|^2)$ values of less than or equal to about 25, less than or equal to about 20, less than or equal to about 15, less than or equal to about 10, or less than or equal to about 5.

All of the devices described herein have a haze or transmission haze, defined as the diffuse transmittance (i.e., the amount of light that gets scattered in a device, but that still transmits through) divided by the total transmittance (i.e., the total amount of light that gets trough, whether scattered or not), of less than or equal to about 20%, less than or equal to about 10%, less than or equal to about 5%, less than or equal to about 2%, or less than or equal to about 1%, including a haze of about 20%, about 18%, about 16%, about 14%, about 12%, about 10%, about 8%, about 6%, about 4%, about 2%, about 1%, and less. As such, the devices are substantially free of haze.

All of the devices described herein have a power conversion efficiency (PCE) of greater than or equal to about 1%, greater than or equal to about 1.5%, greater than or equal to about 2%, or greater than or equal to about 3%.

Light utilization efficiency (LUE) is the product of PCE and AVT. For example, if a device has a PCE of 2.0% and an AVT of 50%, the LUE would be 2.0%*50%=1.0% or simply 1.0 for shorthand. A LUE of 0 refers to an opaque device. All of the devices described herein have a LUE of greater than or equal to about 0.9. For example, a TLSC comprising a thiophene or polythiophene as the sole luminophore has a LUE of about 0.92. A TLSC comprising BODIPY as the sole luminophore has a LUE of about 1.26. A TLSC comprising luminescent nanoclusters as the sole luminophore has a LUE of 1.01, 1.59, and 1.84. A transparent dual-band device having a first waveguide comprising luminescent nanoclusters and a second waveguide comprising BODIPY (in order in which the waveguides contact incident light) has a LUE of about 1.3, about 1.49, about 1.92, about 2.36, and about 2.6. A transparent dual-band device having a first waveguide comprising luminescent nanoclusters and a second waveguide comprising $CO_i8DFIC$ (in order in which the waveguides contact incident light) has a LUE of about 1.19, about 1.56, about 1.89, and about 2.12. As such, the current technology provides TLSC and transparent dual-band devices having a LUE of greater than or equal to about 0.9, greater than or equal to about 0.95, greater than or equal to about 1, greater than or equal to about 1.5, or greater than or equal to about 2, including LUEs of about 0.9, about 0.95, about 1, about 1.05, about 1.1, about 1.2, about 1.3, about 1.4, about 1.5, about 1.6, about 1.7, about 1.8, about 1.9, about 2, about 2.1, about 2.2, about 2.3, about 2.4, about 2.5, about 2.6, and higher.

Optimizing PCEs with best possible aesthetics leads to $PCE/(sqrt (a^{*\wedge}2+b^{*\wedge}2))$ of greater than or equal to about 0.05, greater than or equal to about 0.08, greater than or equal to about 0.1, greater than or equal to about 0.13, The above TLSCs can be incorporated into buildings, vehicles, and devices for energy generation. As such, the current technology as provides buildings, vehicles, and devices that include the TLSCs described above.

Embodiments of the present technology are further illustrated through the following non-limiting examples.

Example 1

Transparent luminescent solar concentrators (TLSCs) selectively harvest ultraviolet (UV) and near infrared (NIR) light. Due to the absence of electrodes, busbars, and collection grids over the solar harvesting area, the device structure enables these devices to achieve the highest levels of transparency and aesthetics. In this example, we introduce non-fullerene acceptors, such as $CO_i8DFIC$, into TLSCs as the luminophores. The impact of $CO_i8DFIC$ concentration on power conversion efficiency (PCE), aesthetic quality, and scalability is systematically examined. After device optimization, the $CO_i8DFIC$ TLSCs are shown to achieve a PCE over 1.2% while the average visible transmittance (AVT) exceeds 74% and color rendering index (CRI) exceeds 80. This example reports the highest TLSC device efficiency at the highest visibly transparency reported.

Introduction

Visibly transparent photovoltaics (TPVs) can selectively harvest the ultraviolet (UV), near infrared (NIR) or partially and neutrally across the visible (VIS) portion of the solar spectrum. Therefore, TPVs can effectively supply on-site energy demand with minimal effect to the functionality and aesthetic quality of the surfaces underneath, improving total energy utilization efficiency. This technology enables applications in small area applications including (autonomous) mobile electronics, displays, and electric vehicles, where the potential market is substantial due to ever increasing production volumes. In addition to these small area applications, TPVs can be integrated onto the architectural envelope as they become more scalable, converting new and existing infrastructure into power-generating sources and dramatically reducing the electrical loss in transmission.

Transparent luminescent solar concentrators (TLSCs), a key TPV technology, optically shift the solar energy conversion by photoluminescence (PL) that is transported optically (by total internal reflection) to edge-mounted PV cells (FIG. 6A). Due to the absence of electrodes, busbars, and collection grids over the solar harvesting area, the device structure is largely simplified, which enables LSC/TLSC devices to achieve the highest levels of transparency and aesthetics. In the past decade, quantum dots, nanoclusters and rare-earth ion complexes have been widely investigated as the luminophores in LSC/TLSC systems. Most of these works focus on (1) the improvement of quantum yield (QY), (2) the modulation of the absorption and emission spectra to minimize the reabsorption loss, and (3) the enhancement of light absorption by matching the absorption spectrum of the luminophores with the peak of the incident solar spectrum. However, the continuous-band absorption characteristics of these luminophores limit their absorption cut-off to about 435 nm, if a high aesthetic quality and transparency is targeted. Bandgaps beyond 440 nm can result in rapid drops in average visible transmittance (AVT) and color rendering index (CRI). Utilizing wavelength selective absorbers makes it possible to harvest just the UV or NIR. As selective absorption redshifts beyond 675 nm, the CRI and AVT reach a maximum. Therefore, NIR photons between 675 nm and the absorption cut-off of the edge-mounted PV cell can be utilized for power generation, and this range coincides with the peak of the incident AM 1.5G photon flux. Moreover, even with tail absorption in the red-NIR below 675 nm, the resulting blue/green tint is often more visually acceptable than yellow/red tinting, which offers more design freedom for NIR selective-harvesting luminophores.

Optical absorption in organic and molecular semiconductors originates from the transition from the ground state to excited molecular orbitals (e.g., $S_0 \to S_1$, $S_0 \to S_2$). The gap between the excited molecular orbitals ($S_1$ and $S_2$) results in discontinuity in the density of states, which allows the transmission of photons. The molecular structure can be designed so that this gap is tuned to overlap with the visible spectrum, creating visible transparency. In general, organic dyes can then be designed to selectively harvest NIR photons, which is not typically possible with traditional semiconductors. However, organic luminophores often suffer from large self-absorption (large overlap between absorption and PL), narrow absorption peaks, and relatively low QY in NIR. Recently, $CO_i8DFIC$ (also referred to as O6T-4F, FIG. 6B) has been developed as a non-fullerene acceptor in organic photovoltaics with unprecedented performance. In this example non-fullerene acceptors (including $CO_i8DFIC$) are introduced as luminescent emitters in NIR-selective harvesting TLSCs, where the power conversion efficiency (PCE) is more than doubled to 1.24%, which is the best NIR-selective harvesting TLSC to date and the highest PCE reported above 70% AVT. Due to the high visible transparency from wavelength selective-harvesting, the light utilization efficiency (LUE=PCE×AVT) is also comparable to the highest LUE of quantum-dot-based LSCs. With this materials motif, efficiencies approaching 5% with a similar level of AVT are possible solely by increasing QY from ~25% to closer to 100% and efficiencies above 10% are achieved by additionally increasing the solar harvesting around the visible spectrum.

Experimental $CO_i8DFIC$ Synthesis.

NMR spectra were obtained on a 500 MHz Varian NMR spectrometer and referenced using the residual $^1H$ peak from the deuterated solvent. Column chromatography was performed using Silicycle 60 Å, 35-75 μm silica gel. Pre-coated 0.25 mm thick silica gel 60 F254 plates were used for analytical TLC and visualized using UV light. Compound A and D were obtained from ChemShuttle Co.

With reference to FIG. 7A, the synthesis of $CO_i8DFIC$ closely followed a known procedure, with small alterations to a few procedures as described below. The synthesis commenced with bromide A, and in two steps isomeric bromo esters B and C were obtained in a ~2:1 ratio. Column chromatography was not efficient to separate the desired B isomer, and thus crystallization was employed. Recrystallization of the B/C mixture began by dissolving the material in pure DCM at room temperature. Slow addition of $Et_2O$ led to the formation of crystals. Addition of $Et_2O$ was terminated when a final 3:1 ratio of $Et_2O:DCM$ was achieved. The solution was kept at room temperature overnight and the crystals were filtered with a Buchner funnel and washed with cold $Et_2O$. The isolated crystals led to a substantial improvement in the purity of the desired isomer (10:1 B:C), which was used in subsequent transformations. Ensuing steps were performed until $CO_i8$-CHO was obtained. For the last reaction, it was found that prolonged reaction times leads to lower yields. The reaction between $CO_i8$-CHO and D was terminated in 3 h, leading to the isolation of the target molecule in 91% yield. The molecular structure of the thiophene ITIC is shown in FIG. 7B.

Module Fabrication.

CO$_i$8DFIC power was massed and dissolved in dichloromethane (5 min of sonication) to prepare the solution at the target concentration. For "150 mgL$^{-1}$" TLSC, 150 mgL$^{-1}$ dichloromethane solution was uniformly mixed with (poly)-butyl methacrylate-co-methyl methacrylate (PBMMA) (Sigma-Aldrich) at a volume ratio of 1:1. This composite mixture was drop-cast on 5.08 cm×5.08 cm×0.635 cm glass sheets (for J-V characterization) and allowed to dry for 3 h in a glove-box filled with nitrogen gas (O$_2$, H$_2$O<1 ppm) resulting in a layer thickness of approximately 0.5 mm. The same layer structure was applied for 2.54 cm×2.54 cm×0.1 cm (for PL and QY measurements). For photovoltaic measurements, single crystalline solar cells (Vikocell Solar) were laser cut into 5.08 cm×0.635 cm strips for J-V and corresponding EQE$_{LSC}$ measurements, and 10.16 cm×0.635 cm strips for position-dependent EQE measurements. The edge-mounted GaAs PVs (Alta Devices) were used as received. For J-V measurements, two PV strips were mounted on orthogonal edges using index matching gel (Thorlabs) to attach the PV strips on the waveguide edges and were connected in parallel. The remaining two edges were painted black to block the light and internal reflection of light. For EQE$_{LSC}$ measurements, one PV strip was attached to one edge of the waveguide with the other three edges painted black.

Optical Characterization.

Specular transmittance (T(λ)) of both solutions and TLSC devices were measured using a double-beam Lambda 800 UV/VIS spectrometer in the transmission mode. No reference sample was placed on the reference beam side for the solid-film TLSC transmittance measurement. Reflectance (R(λ)) of the TLSCs was also measured using Lambda 800 UV/VIS spectrometer with the specular accessory installed on the sample beam side. The absorption spectra were acquired by following the equation: A(λ)=1−T(λ)−R(λ). The PL for CO$_i$8DFIC in chlorobenzene solution and polymer matrix were measured by using a PTI QuantaMaster 40 spectrofluorometer with excitation at 650 nm. Photoluminescence quantum yields were tested by using a Hamamatsu Quantaurus fluorometer, excitation ranges in scan mode (10 nm per scan step) were set to 650-750 nm. The reported QY value was averaged from 11 measured values.

Module Photovoltaic Characterization.

A Keithley 2420 SourceMeter was used to obtain J-V characteristics under simulated AM 1.5G solar illumination (xenon arc lamp combined with a calculated spectra mismatch factor of 1.05 for all the TLSCs tested). The light intensity was calibrated with an NREL-calibrated Si reference diode with KG5 filter. The position-dependent EQE$_{LSC}$ measurements were performed using a QTH lamp with a calibrated Si detector, monochromator, chopper and lock-in amplifier. The measured EQE$_{LSC}$(λ) at each distance (d) was corrected by multiplying the geometric factor g=π/tan$^{-1}$(L/2d), which accounts for the different angle subtended by the edge-mounted PV at various excitation distance (d), where L is the LSC waveguide length. A series of EQE$_{LSC}$(λ) spectra were acquired with the same TLSC device, then the averaged spectrum was used to represent the whole device and integrated to confirm the J$_{SC}$ from the corresponding J-V characteristics of the same device. A matte black background was placed on the back of the TLSC device to eliminate illumination from the environment or reflection (double-pass) for both J-V and EQE measurements. All the TLSC devices were tested with the same Si or GaAs PV cells to eliminate any PV-to-PV variation in performance.

Results and Discussion

The normalized absorption and emission spectra of CO$_i$8DFIC dissolved in chlorobenzene solution and embedded in polymer matrix are plotted in FIG. 6C. From solution to polymer matrix, there is a hypsochromic shift of both the absorption and emission spectra: the absorption peak shifts from 770 to 745 nm and the emission peak shifts from 831 nm to 808 nm, exhibiting Stokes shift of ~60 nm. The measured QY is 23±1% in chlorobenzene solution and 25±3% in polymer matrix with an increased absorption width. This is a relatively high QY for NIR emission range, considering most commercially available quantum dots with emission in this range are <50%. In contrast, CO$_i$8DFIC bandgap decreases in neat films (as applied in organic PVs), so that external quantum efficiencies (EQE) of reported PV devices can be extended up to 1050 nm. When spin-coated as neat layers on glass, the corresponding absorption spectrum does exhibit an absorption onset at ~1000 nm, but the quantum yield decreases significantly to the point where neat layers are not viable in LSC structures. Thus, the use of this compound in doped LSC structures was investigated.

In further regard to CO$_i$8DFIC absorption, there are two likely explanations for the shift of the spectra from solution to polymer matrix film—aggregation and solvatochromic shifts. Aggregation typically leads to a broadening of the absorption such that the bandgap decreases. In FIG. 8A the absorption spectra is measured in different polymer hosts (Eukitt vs. Shandon) and it is found that the absorption/bandgap do not change while the emission does moderately shift. Aggregated solutions were also made by mixing THF with water and neat films as shown in FIG. 8B. The absorption cut-offs of aggregates and neat film are very close to each other (olive curves) and show a huge bathochromic shift (~100 nm) compared to the monomer in solution. In contrast, the absorption cut-off of solution and polymer film are very close to each other (blue curves). Thus, this is more likely a solvatochromic shift related to the difference in the index of refraction of the polymer host. CO$_i$8DFIC bandgap decreases in neat films and aggregates compared to solution and polymer matrix, and the corresponding absorption onset also redshifts.

TLSC devices were formed on square borosilicate glass sheets with an active area of 25.8 cm$^2$ (the waveguide length (L) is 5.08 cm). CO$_i$8DFIC molecules were dissolved in dichloromethane, and uniformly mixed with the polymer host. The mixture was then drop-cast onto glass sheets to form CO$_i$8DFIC/polymer composite films. The CO$_i$8DFIC in dichloromethane solution was prepared with various concentrations to adjust the total light absorption in the NIR. Both Si and GaAs were utilized as edge mounted PVs. Si was utilized to understand the trends in the performance and GaAs was deployed to reduce thermal losses and demonstrate maximum performance. Note that the utilization of GaAs is only possible as the CO$_i$8DFIC/polymer PL cutoff is nearly ideally positioned at 875 nm with respect to the GaAs EQE cutoff of 900 nm. Laser-diced Si PV cells (or GaAs PV cells) were mounted onto two orthogonal edges and connected in parallel, while the other two orthogonal edges were painted black (see Experimental Section). TLSC devices with five different CO$_i$8DFIC concentrations were fabricated and their photovoltaic performance characterized. For comparison, TLSC with cyanine dye Cy7-NHS was added as a reference device. The current density versus voltage (J-V) characteristics of these TLSCs are shown in FIG. 9A along with average position-dependent external quantum efficiency (EQE$_{LSC}(\lambda)$) spectra in FIG. 9B. The photovoltaic parameters and aesthetic quality metrics (AVT and CRI) are summarized in Table 1. The TLSC with the lowest concentration of 50 mgL$^{-1}$ shows 30% higher short-circuit current density (J$_{SC}$: 1.29±0.03 mAcm$^{-2}$) compared to the "Cy7-NHS" control (1.01±0.07 mAcm$^{-2}$) while exhibiting similar open-circuit voltage (V$_{OC}$) and fill factor (FF). The corresponding AVT (84.4% vs. 88.2%) and CRI (91.3 vs. 92.0) are very close. As the CO$_t$8DFIC concentration increases to 150 mgL$^{-1}$, the J$_{SC}$ further increases to 2.07±0.08 mAcm$^{-2}$ with a modestly reduced AVT (74.4%) and CRI (80.0), and the corresponding PCE reaches 0.54±0.03%. Further increasing the concentration to 300 mgL$^{-1}$ only slightly improves the PCE to 0.61±0.05% with a significant cost in AVT (59.7%) and CRI (63), where there is an increasing blue tint.

tion of the distance (d) from the excitation source to the edge-mounted PV cell. Multiple EQE scans were taken for each TLSC system as d increases from 15 mm to 95 mm with 10 mm interval. The corrected EQE$_{LSC}$ peak values are extracted and plotted in FIG. 9C.

The absolute absorption peak height of "50 mgL$^{-1}$" (A($\lambda$)%=49.6%) is significantly lower than that of the "Cy7-NHS" control (A($\lambda$)%=88.6%), however, the EQE$_{LSC}$ peak heights are similar to each other as shown in FIG. 9B. Thus, this 30% PCE improvement mainly originates from the wider absorption peak and the higher QY. The excellent luminescent properties are likely one of the reasons it has become such a high-performance acceptor in photovoltaic devices, where the high QY at notably low bandgaps signifies a reduction of non-radiative modes. For "150 mgL$^{-1}$", both the increased absorption peak height (A($\lambda$)%=80.3%)

TABLE 1

Photovoltaic and aesthetic quality parameters of the TLSCs.

| Devices | J$_{SC}$ (mAcm$^{-2}$) | Int. J$_{SC}$ (mAcm$^{-2}$) | V$_{OC}$ (V) | FF % | PCE % | AVT % | LUE % | CRI | (a*, b*) |
|---|---|---|---|---|---|---|---|---|---|
| Cy7-NHS | 1.01 ± 0.07 | 1.03 | 0.42 ± 0.01 | 57 ± 1 | 0.24 ± 0.01 | 88.2 | 0.21 | 92.0 | (−5.5, −0.8) |
| 50 mgL$^{-1}$ | 1.29 ± 0.03 | 1.30 | 0.44 ± 0.01 | 57 ± 1 | 0.33 ± 0.01 | 84.4 | 0.28 | 91.3 | (−6.0. −1.5) |
| 100 mgL$^{-1}$ | 1.76 ± 0.09 | 1.71 | 0.46 ± 0.01 | 58 ± 1 | 0.47 ± 0.03 | 78.0 | 0.37 | 84.8 | (−10.4, −2.8) |
| 150 mgL$^{-1}$ | 2.07 ± 0.08 | 1.89 | 0.47 ± 0.01 | 56 ± 1 | 0.54 ± 0.03 | 74.4 | 0.41 | 80.0 | (−13.5. −3.7) |
| 150 mgL$^{-1}$* | 1.54 ± 0.05 | 1.78 | 0.99 ± 0.01 | 81 ± 1 | 1.24 ± 0.04 | | 0.92 | | |
| 200 mgL$^{-1}$ | 2.13 ± 0.06 | 1.88 | 0.47 ± 0.01 | 57 ± 1 | 0.57 ± 0.03 | 67.4 | 0.38 | 72.0 | (−18.6, −5.3) |
| 300 mgL$^{-1}$ | 2.24 ± 0.04 | 2.12 | 0.48 ± 0.01 | 57 ± 1 | 0.61 ± 0.05 | 59.7 | 0.37 | 63.0 | (−24.2, −6.7) |
| 300 mgL$^{-1}$* | 1.56 ± 0.08 | 1.77 | 0.99 ± 0.01 | 80 ± 1 | 1.24 ± 0.07 | | 0.74 | | |

*TLSC edge-mounted with GaAs PVs.

The J$_{SC}$ values extracted from J-V characteristics are confirmed by the integrated J$_{SC}$ from EQE$_{LSC}(\lambda)$ (in FIG. 9B). The EQE$_{LSC}$ peak positions matches the absorption spectrum in FIG. 6C, and interestingly, an amount of the EQE$_{LSC}$ contribution originates from the visible range due to the neutral absorption profile of the CO$_t$8DFIC through the visible. In EQE$_{LSC}$ measurements, scattering caused by particle aggregation or direct illumination of the edge-mounted PV can be directly identified from the shape of EQE$_{LSC}$ spectra Rayleigh scattering decreases as wavelength increases, which superimposes an inclined background to the luminophore peaks. Direct illumination of the PV introduces a level background to the luminophore peaks that extends to the absorption cut-off of the edge-mounted PV. Both effects can cause inaccurate EQE$_{LSC}$ measurement and overestimated integrated J$_{SC}$. Neither Rayleigh scattering at short wavelengths, nor direct illumination of the edge-mounted PV cell at the long wavelengths are observed in the EQE$_{LSC}$ spectra, which confirms that the EQE contribution stems only from the PL of the embedded CO$_t$8DFIC.

To explore the impact of CO$_t$8DFIC concentration on device scalability, TLSC systems (dimension: 10.16×10.16 cm) with three different CO$_t$8DFIC concentrations (50 mgL$^{-1}$, 150 mgL$^{-1}$, and 300 mgL$^{-1}$) and "Cy7-NHS" were characterized by position-dependent EQE$_{LSC}$ as a funcand width results in substantial improvement in J$_{SC}$. Further increasing the concentration, the absorption peak height reaches a plateau (A($\lambda$)%=92.0% for "300 mgL$^{-1}$"), but the increased width leads to both color-tinting (low AVT and CRI) and greater reabsorption loss. This is reflected in the corresponding EQE$_{LSC}$ spectra: the "300 mgL$^{-1}$" shows a broader EQE$_{LSC}$ peak width but a decreased peak height compared to the "150 mgL$^{-1}$". The decay trends of the normalized position-dependent EQE$_{LSC}$ peak value can help to analyze the reabsorption loss behavior: "50 mgL$^{-1}$" exhibits the slowest decay trend due to the lowest reabsorption in the series. With higher luminophore concentration "150 mgL$^{-1}$" shows a more rapid decay curve, however, it is still slightly slower than that of the "Cy7-NHS" control. Lastly, with the highest concentration, the "300 mgL$^{-1}$" and the "Cy7-NHS" share very similar "roll-off" behavior due to the highest reabsorption loss in the series. Considering the scalability, aesthetic quality, and photovoltaic performance, 150 mgL$^{-1}$ is found to be the optimal concentration.

To further clarify the origin of the enhancement over the state of the art, as shown in FIGS. 10-10C and Table 2, moving from the previously reported Cy7-NHS to CO$_t$8DFIC leads to a near doubling PCE from improved QY from 20% to 25% (increase by a factor of 1.25) and an increase in the wavelength selective absorption by a factor of 1.63.

TABLE 2

Wavelength selective absorption ratio, QY and Int. $J_{SC}$ comparison for TLSCs
with Cy7-NHS and $COi_8DFIC$ 150 mgL$^{-1}$; Factors to reach practical limits with and
without visible contribution.

| Luminophore | Total Solar Photon Absorbed (#m$^{-2}$) | QY % | Int. $J_{SC}$ (mAcm$^{-2}$) | $V_{OC}$ (V) | FF % | PCE % |
|---|---|---|---|---|---|---|
| Cy7-NHS | $4.28 \times 10^{20}$ | 20 ± 1 | See Table 3 for detail | | | |
| $CO_i8DFIC$ | $6.98 \times 10^{20}$ | 25 ± 3 | | | | |
| Ratio | 6.98/4.28 = 1.63 | 25/20 = 1.25 | | | | |
| Practical Limit-1 (0% VIS Contribution) | $9.14 \times 10^{20}$ | 100 | 10.3 | 1.05 | 80 | 8.65 |
| Practical Limit-2 (20% VIS Contribution) | $1.11 \times 10^{21}$ | 100 | 13.5 | 1.05 | 80 | 11.34 |

To explore the photovoltaic performance the TLSCs with different G factor, edge-mounted PV and luminophores, square TLSC devices with a different G factor: waveguide length of 10.16 cm and thickness of 3.175 mm, and the G factor is 8 were fabricated and tested. As shown in FIGS. 11A-11B, the averaged integrated current density is 0.95 mAcm$^{-2}$ compared to 1.78 mAcm$^{-2}$ with the $CO_i8DFIC$ concentration of 150 mgL$^{-1}$. The PCE is expected to be 0.75% with similar $V_{OC}$ and FF.

In addition, as G factor and edge-mounted PV are kept the same, the PCE improvement from $CO_i8DFIC$ is always 80-100% compared to Cy7-NHS as shown in Table 3. Moving from Si to GaAs leads to an improvement in the $V_{OC}$ and FF by a factor of 2.2 and 1.4, respectively. Thus, it can be seen that the PCE improvement from the luminophore and matched PV cell is equally important.

TABLE 3

Summary of Photovoltaic parameters for
TLSCs with different edge mounted PV, G
factor and luminophores as shown in FIGS. 11A-11B.

| # | Luminophore | PV | G | Int. $J_{SC}$ (mAcm$^{-2}$) | $V_{OC}$ (V) | FF % | PCE % |
|---|---|---|---|---|---|---|---|
| 1 | Cy7-NHS | Si | 8 | 0.56 | 0.45 | 57 | 0.14 |
| 2 | — | — | 2 | 1.03 | 0.42 | 57 | 0.25 |
| 3 | — | GaAs | 8 | 0.50 | 0.99 | 80 | 0.40 |
| 4 | — | — | 2 | 0.91 | 0.99 | 80 | 0.72 |
| 5 | $CO_i8DFIC$ | Si | 8 | 1.10 | 0.45 | 57 | 0.28 |
| 6 | — | — | 2 | 1.89 | 0.47 | 56 | 0.54 |
| 7 | — | GaAs | 8 | 0.95 | 0.99 | 80 | 0.75 |
| 8 | — | — | 2 | 1.78 | 0.99 | 80 | 1.41 |

As shown in FIG. 10C and Table 2, improving the QY from 25% to 100% can increase the PCE by a factor of 4 (from 1.3% to 5.2%). However, improving the UV and NIR absorption efficiency with sharper absorption spectrum cutoffs (e.g., with dielectric mirrors) would result in a factor of 1.31 (PCE from 5.2% to 6.8%), while further tuning the emission spectrum to suppress the reabsorption, would lead to an enhancement of 1.26 (PCE from 6.8% to 8.6%). By absorbing 20% of the VIS light from 435-675 nm, the integrated $J_{SC}$ can be further improved from 10.3 mAcm$^{-2}$ to 13.5 mAcm$^{-2}$ (30% enhancement) boosting the PCE up to >11%. This emphasizes several key points: 1) there is nearly as much to be gained by increasing the absorption efficiency as the QY and 2) selectively harvesting UV+NIR is more effective to reach the highest efficiencies. Overall, optimized efficiencies above 10% are achievable with this class of materials and an efficiency above 5% (with AVT >70%) is achievable with modest gains as the QY approaches 50%.

Reabsorption is still a primary loss mechanism in these NIR selective-harvesting TLSC devices that can limit their application to smaller area applications. However, neither the Stokes shift nor the normalized absorption and emission spectra (FIG. 6C) reflect the actual scalability in devices with different $CO_i8DFIC$ concentrations. Also, as shown in FIGS. 12A-12F, the photon balance at every wavelength was used to check all transparent photovoltaic devices, where $EQE_{LSC}(\lambda)+T(\lambda)+R(\lambda) \leq 1$. To quantify the this behavior a useful design parameter called the overlap integral (OI) was introduced to conveniently correlate reabsorption losses in LSC systems. Since the emission width of Cy7-NHS and $CO_i8DFIC$ are distinctly different from each other, we normalized OI by their corresponding emission spectra to account for any spectral shape difference using Formula (2):

$$OI^* = \frac{\int_0^\infty A(\lambda) PL^*(\lambda) d\lambda}{\int_0^\infty PL^*(\lambda) d\lambda} \quad (2)$$

where $PL(\lambda)$ is the emission spectrum of the organic emitter in polymer matrix film, OI* is the modified overlap integral that will be dependent on thickness and/or concentration, and lower OI* is desirable for higher efficiency and improved scalability. The calculated OI* trend from the lowest to highest scaling is: "50 mgL$^{-1}$" (0.249), "150 mgL$^{-1}$" (0.467), "Cy7-NHS" (0.470) and "300 mgL$^{-1}$" (0.618), which agrees well with the decay trend of these TLSCs.

To confirm the validity of the photon balance from the independent $EQE_{LSC}(\lambda)$, transmittance $(T(\lambda))$, and reflectance $(R(\lambda))$ spectra measurements of the TLSC device, $EQE_{LSC}(\lambda)+T(\lambda)+R(\lambda)$ 1 is satisfied at each wavelength for "150 mgL$^{-1}$" in FIG. 13A. The photon balance check for the rest TLSC devices involved are shown in FIGS. 12A-12F. The highest $EQE_{LSC}(\lambda)$ (acquired at the smallest d, rather than the average in FIG. 9B) in the position-dependent $EQE_{LSC}$ spectra is used in this relation to ensure that the whole series satisfy the photon balance.

The CIELAB color space coordinates (a*, b*) are key figures of merit to quantify the rendered color fidelity of the transmitted light in the window industry. The incident AM 1.5G is at the origin (0, 0) (as neutral) and the (a*, b*) positions of the TLSCs are plotted in FIG. 13B. Since there is a tail absorption of the NIR absorption peak that extends into VIS (mostly in red), the TLSCs all have negative values of a* and b*. The coordinates of "50 mgL$^{-1}$" and "Cy7-NHS" are very close to each other, which can be observed in the TLSC photographs (FIG. 13D). As the CO$_i$8DFIC concentration increases, the positions move away from the origin along a nearly straight line and the rendered colors gradually become more blue-tinted. At the highest concentration the corresponding (a*, b*) moves outside of the scale shown, indicating that the "300 mgL$^{-1}$" is no longer suitable for glazing systems.

The output voltage of an LSC device is determined by the edge-mounted PV cell. Ideally, using a PV cell with a bandgap bordering the emission edge of the luminophore can effectively reduce voltage losses (reduced thermalization loss in the PV) and improve the overall PCE. Further increasing the bandgap of the edge-mounted PV beyond that can result in a direct trade-off between the output voltage and collectable current. With the CO$_i$8DFIC emission peak edge at around 900 nm, GaAs is a nearly ideal PV with an EQE cut-off closest to the CO$_i$8DFIC emission peak edge. Therefore, GaAs PV cells were integrated onto "150 mgL$^{-1}$" and "300 mgL$^{-1}$" TLSCs to replace the Si PVs as an example of this potential improvement. The J-V curves are plotted in FIG. 13C. The measured J$_{SC}$ of the "150 mgL$^{-1}$" device with GaAs is 1.54±0.05 mAcm$^{-2}$, with significantly improved V$_{OC}$ of 0.99±0.01 V and FF of 811%, leading to a PCE of 1.24±0.04%. The "300 mgL$^{-1}$" exhibits very similar photovoltaic performance as the "150 mgL$^{-1}$". The average EQE$_{LSC}$ spectra is provided in the inset of FIG. 13C; with slightly broader EQE$_{LSC}$ peak width, the peak height of "300 mgL$^{-1}$" is lower than that of the "150 mgL$^{-1}$" but more contribution from the visible range, so the integrated J$_{SC}$ values of "150 mgL$^{-1}$" and "300 mgL$^{-1}$" are 1.78 mAcm$^{-2}$ and 1.77 mAcm$^{-2}$, respectively, and these values agree well with the J$_{SC}$ from the J-V characteristics.

The LUE provides a metric for systematically comparing transparent PV devices with different overall levels of AVT on the same scale. The LUE of the TLSC devices are plotted as a function of their AVT in the inset of FIG. 13B. With Si edge-mounted PVs, the "Cy7-NHS" control TLSC has an LUE of 0.21, and the LUE of the CO$_i$8DFIC TLSCs peaks at 0.41 with "150 mgL$^{-1}$". Further increasing the concentration can slightly improve the PCE but dramatically reduce the AVT. With GaAs PVs, the "150 mgL$^{-1}$" and "300 mgL$^{-1}$" have LUE values of 0.92 and 0.74, respectively. To the best of our knowledge, the "150 mgL$^{-1}$" is the first report for a TLSC device with an AVT over 70% and a PCE over 1.2%. A summary of previously reported LSC/TLSC performance parameters in shown in Table 4 for comparison.

TABLE 4

An overview of reported LSC/TLSC devices.

| Luminophore | QY % | Size (cm$^2$) | AVT % | CRI | PCE % | LUE % |
|---|---|---|---|---|---|---|
| CO$_i$8DFIC (This work) | 25 ± 3 | 5.08 × 5.08 | 74.4 | 80.0 | 1.24 | 0.92 |
| (TBA)$_2$Mo$_6$Cl$_{14}$ NCs | 50-55 | 2.5 × 2.5 | 84.0 | 94.0 | 0.44 | 0.37 |
| Cy7-NHS | 20 ± 1 | 2 × 2 | 86.0 | 94.0 | 0.40 | 0.34 |
| Cy7-NEt$_2$-I | 26 ± 1 | 5.08 × 5.08 | 77.1 | 75.6 | 0.36 | 0.28 |
| CdSe/Cd$_{1-x}$Zn$_x$S | 40 | 10.16 × 10.16 | 84.8 | 91.0 | N/A$^{c,e,f}$ | N/A |
| Si QDs | 46 ± 5 | 12 × 12 | 83.0$^a$ | 84.1 | N/A$^{c,e,f}$ | N/A |
| CdSe/CdS | 45 | 21.5 × 1.35 | 94.9$^a$ | 89.2 | N/A$^{c,e,f}$ | N/A |
| CuInS$_2$/ZnS | 56 | 2.2 × 2.2 | N/A$^b$ | N/A | 8.71$^{d,f}$ | N/A |
| gem-Pyrene Ethenes | 52 | 2.5 × 2.5 | N/A$^b$ | N/A | 0.32 | N/A |
| SINc:t-U(5000) | 16 (UV) 8 (NIR) | 7.6 × 2.6 | 99.0$^a$ | 97.7 | N/A$^e$ | N/A |
| CuInS$_2$/ZnS | 66 | 10 × 10 | 43.7$^a$ | 76.9 | 2.18 | 0.95 |
| Mn:Cd$_x$Zn$_{1-x}$S/ZnS | 78 ± 2 | 15.24 × 15.24$^d$ | 88.8$^g$ | 95.5 | 1.3$^{c,d,f}$ | 1.15 |
| CuInSe$_2$/ZnS | 65-75 | | 8.5$^g$ | 0.42 | 1.8$^{c,d,f}$ | 0.15 |
| CuInSe$_x$S$_{2-x}$/ZnS | 40 ± 4 | 12 × 12 | 45.6$^a$ | 77.1 | N/A$^{c,e,f}$ | N/A |
| Cu:CdSe/CdS NPLs | ~40 | 10 × 10 | N/A$^b$ | N/A | 0.003$^{h,f}$ | N/A |
| CuInS$_2$/CdS NCs | ~45 | 7.5 × 7.5 | 70.1$^a$ | 82.2 | N/A$^{c,e,f}$ | N/A |
| PbS/CdS | 40-50 | 2 × 1.5 | 53.0$^a$ | 65.6 | N/A$^{c,e,f}$ | N/A |
| CdSe/Cd$_x$Pb$_{1-x}$S | 40 | 7 × 1.5 | N/A$^a$ | N/A | 1.15$^{c,e,f}$ | N/A |
| Mn:ZnSe | 53 | 2.5 × 7.5 | N/A$^b$ | N/A | N/A$^{c,e,f}$ | N/A |
| CdSe/CdS | 82 | 2 × 2 | N/A$^b$ | N/A | N/A$^{c,e,f}$ | N/A |
| bPDI-3 | 97.7 | 20 × 20 | 56.0$^a$ | 57.0 | 1.90$^{d,f}$ | 1.06 |
| LR 305 | — | 5 × 5 | N/A$^b$ | N/A | 7.1$^i$ | N/A |
| LR 305 CRS 040 | | | | | | |
| Rubrene Pt(TPBP) | ~50 | 2.5 × 2.5 | N/A$^b$ | N/A | N/A$^e$ | N/A |

To show that these non-fullerene acceptors are a compelling platform for LSC and TLSC development, a second popular non-fullerene acceptor IEICO-4F (FIG. 14A) is characterized and integrated as a luminophore for TLSCs. The corresponding A(λ), PL(λ), and EQE$_{LSC}$(λ) (FIGS. 14B-14D) are similar to CO$_i$8DFIC with slightly lower QY of 20±2% in polymer matrix (Eukitt). This reinforces the beneficial properties of this class of low bandgap organic molecules.

As the spectral absorption range is nearly ideal and well-coupled spectrally to the GaAs (which is already close to the Shockley-Queisser limit), the practical limit with this device arrangement/molecular-motif can be estimated by considering just an improvement of the QY of the NIR luminophore from 25% (measured) to ~90%-100%. This could be achieved, for example, with chemical modifications to the core molecular motif to reduce non-radiative modes via rigidification. In this limit, the PCE would reach an efficiency just over 5% with the same high level of AVT, while approaching the record opaque LSC of 7%. Practical limits above 10% are achievable with this approach.

In summary, non-fullerene acceptors were introduced into LSCs and TLSCs as the luminophore. CO$_i$8DFIC, which has emerged as a blockbuster acceptor in organic photovoltaics and also has excellent luminescent properties, was studied extensively. The impact of CO$_i$8DFIC concentration on PCE, aesthetic quality, and scalability is systematically studied. After device optimization, the TLSCs are shown to achieve a PCE over 1.2% while the AVT exceeds 74% and CRI exceeds 80. This example reports the highest TLSC device efficiency at the highest visibly transparency and highlights that the photoluminescent properties of these low bandgap organic molecules provide higher TLSC performance.

Example 2

Visibly transparent luminescent solar concentrators (TLSC) selectively harvest the ultraviolet (UV), near infrared (NIR) portion of the solar spectrum and convert the incident solar energy into electricity. Since the primary applications of TLSCs include building envelopes, greenhouses, automobiles, signage and mobile electronics, maintaining aesthetics and functionalities is as important as achieving high power conversion efficiencies (PCE) in practical deployment. In this example, both massive-downshifting phosphorescent nanoclusters (NC) and fluorescent organic molecules are introduced into TLSC system as UV and NIR selective-harvesting luminophores, respectively. UV and NIR dual-band selective harvesting TLSCs with PCE over 3% are demonstrated while the average visible transmittance (AVT) exceeds 75% with color rendering index (CRI) near 90. With distinct wavelength selectivity and effective utilization of the invisible portion of incident solar spectrum, this example reports the highest TLSC PCE at the highest transparencies, demonstrating a route to the commercialization of transparent solar technologies.

INTRODUCTION

Building-integrated photovoltaic technologies (BIPV) can convert new and existing infrastructure surfaces into power-generating sources, dramatically reducing the electrical loss in transmission. To maximize the output from the incident solar energy, integration should be deployed over the entire building envelope including both the facades and rooftop areas. For the siding and window area this requires that the aesthetic quality is not compromised by the BIPVs. Visibly transparent photovoltaic (TPV) technologies selectively harvest the UV and NIR portion of the solar spectrum and allow the visible (VIS) light to pass through, converting the invisible portion of light into electricity to supply on-site energy demand. Additionally, TPVs can also be readily integrated onto other smaller area including greenhouses, (electric) automobiles, (autonomous) mobile electronics and textiles, substantially and ubiquitously improving the energy utilization efficiency.

Practical deployment of TPV technologies requires high PCE with good aesthetic quality (high AVT and CRI). Therefore, it is beneficial to maximize the light harvesting in the invisible portion of the solar spectrum, and simultaneously fine-tune the absorption cut-off edges precisely at the UV/VIS and VIS/NIR borders to maximize the visible transmission (435-675 nm). In the past 5 years, efforts have been made to achieve both high PCE and visible transparency in TPVs. For example, the bandgap of organometallic halide perovskite materials was carefully tuned by compositional engineering for UV-selective-harvesting TPVs; a series of novel low-bandgap polymer donors and non-fullerene acceptors have been applied in organic PV devices, and excellent photovoltaic performance with distinct NIR selectivity has been demonstrated; the utilization of optical outcoupling layers for VIS photons, distributed Bragg reflectors for NIR photons and various types of transparent electrodes can simultaneously enhance the visible transparency and the utilization of invisible photons. Currently, the PCE of thin-film TPVs has reached ~8-10%, however, the highest reported AVT is around 40-50% due to considerable parasitic absorption from the electrodes, active layers, and non-ideal wavelength selectivity.

Alternatively, transparent luminescent solar concentrators (TLSCs) optically shift the solar energy conversion to edge-mounted traditional PV cells via waveguided photoluminescence (PL). Without the presence of any electrodes over the active area, the structural simplicity enables TLSCs with distinct wavelength selectivity to achieve the highest possible visible transparency, circumventing several of the challenges for thin-film TPVs and simplifying the manufacturing. Much of the previous work on TSLCs with NIR harvesting have absorption profiles that have limited UV capture and PCEs up to around 1% for AVTs above 70% for a light utilization efficiency (LUE, equal to PCE×AVT) of 0.7. The highest reported semitransparent LSC devices have reported a PCE of 2.2% with an AVT of 44% (LUE of 0.97) and a brown tint. Multiple luminophores with various wavelength selectivity can be incorporated into LSC waveguide to maximize the spectral coverage of light harvesting, enhance photovoltaic performance, and balance the color neutrality. Here, highly luminescent phosphorescent nanoclusters and fluorescent organic molecules are introduced into TLSCs as isolated UV and NIR selective-harvesting luminophores, respectively. The nanoclusters selectively harvest UV photons while exhibiting QYs greater than 70% and massive downshift of the luminescence into the NIR. To effectively pair these emitters and prevent parasitic reabsorption loss of the nanocluster emission in the NIR absorbing organic fluorophore an effective strategy to isolate the absorption/emission bands is shown. The corresponding dual-band selective harvesting TLSC exhibits PCE over 3% due to the effective utilization of the invisible photons and high photoluminescence quantum yield (QY) of the luminophores. Distinct UV and NIR selectivity offers the TLSC with excellent aesthetic quality (AVT over 75% and CRI near 90). These dual-band TLSCs also show good photostability with minimal degradation over 300 hours of constant illumination. This example not only reports the TLSC device with highest PCE (to the best of our knowledge), but also demonstrates a novel design to effectively utilize the solar spectrum in an aesthetic way.

Experimental

Nanocluster synthesis.

1) $Cs_2Mo_6I_{14}$: $MoI_2$ powder (2A Biotech) was uniformly mixed with CsI powder (Sigma-Aldrich) with a stoichiometric ratio of 3:1. The mixture was then transferred into quartz ampule (12 cm long, 1.5 cm diameter), and ampule was sealed under vacuum. The ampule was heated at the reaction temperature of 750° C. for 72 hours to form $Cs_2Mo_6I_{14}$. After cooling down to room temperature, the powder in the ampule was dissolved in acetone (wine-colored clear solution) and the undissolved impurity (unreacted black powder) was filtered out. The acetone solvent of $Cs_2Mo_6I_{14}$ solution was dried by rotary evaporator to form red $Cs_2Mo_6I_{14}$ powder.

2) $Cs_2Mo_6I_8(CF_3CF_2COO)_6$: $Cs_2Mo_6I_{14}$ was weighed and dissolved in acetone, and then silver pentafluoropropionate (CF3CF2COOAg) (Sigma-Aldrich) was added into the $Cs_2Mo_6I_{14}$ solution with a stoichiometric ratio of 6:1. The reaction was kept in dark and nitrogen atmosphere for 48 hours. After the ligand exchange reaction, the precipitation AgI was filtered out and the solution (cider-colored) was dried by rotary evaporator to obtain orange $Cs_2Mo_6I_8(CF_3CF_2COO)_6$ powder. $Cs_2Mo_6I_8(CF_3COO)_6$ or $Cs_2Mo_6I_8(CF_3CF_2CF_2COO)_6$ nanoclusters can be prepared by reacting $Cs_2Mo_6I_{14}$ and $CF_3COOAg$ or $CF_3CF_2CF_2COOAg$ with similar procedures.

3) $CO_i8DFIC$ was synthesized as discussed above. BODIPY as synthesized based on the reaction scheme provided in FIG. 15.

Module Fabrication.

1) UV component: $Cs_2Mo_6I_8(CF_3CF_2COO)_6$ nanocluster powder was weighed and dissolved in ethanol to prepare the solution at the target concentration. The ethanol solution was mixed with mounting medium (Fluoroshield F6182, Sigma-Aldrich) at a volume ratio of 1:2.

2) NIR component: BODIPY or $CO_i8DFIC$ powder was dissolved in dichloromethane to prepare the solution. The dichloromethane solution was mixed with mounting medium (Shandon, Thermo Fisher Scientific) at a volume ratio of 1:1. This mixture was drop-cast on 50.8 mm×50.8 mm×6.35 mm (for J-V characterization and averaged $EQE_{LSC}$ measurement) and 101.6 mm×101.6 mm×6.35 mm (for position-dependent $EQE_{LSC}$) borosilicate glass sheets and allowed to dry for 6 h in a glove-box filled with nitrogen gas ($O_2$, $H_2O$<1 ppm). After drying two components were encapsulated together by UV-curing epoxy (DELO) around the edges with two composite films facing each other. The edge-mounted GaAs PVs (Alta Devices) were used as received. For J-V measurements, two PV strips were mounted on orthogonal edges using index matching gel (Thorlabs) to attach the PV strips on the waveguide edges and were connected in parallel. The remaining two edges were painted black to block the light and internal reflection of light. For $EQE_{LSC}$ measurements, one PV strip was attached to one edge of the waveguide with the other three edges painted black.

Optical Characterization.

Specular transmittance ($T(\lambda)$) of TLSC devices were measured using a double-beam Lambda 800 UV/VIS spectrometer in the transmission mode. No reference sample was placed on the reference beam side for the solid-film TLSC transmittance measurement. Reflectance ($R(\lambda)$) of the TLSCs was also measured using Lambda 800 UV/VIS spectrometer with the specular accessory installed on the sample beam side. The absorption spectra were acquired by following the equation: $A(\lambda)=1-T(\lambda)-R(\lambda)$. The PL for NC, BODIPY and $CO_i8DFIC$ in polymer matrix were measured by using a PTI QuantaMaster 40 spectrofluorometer with excitation at 400 nm, 650 nm and 650 nm, respectively. Photoluminescence quantum yields were tested by using a Hamamatsu Quantaurus fluorometer.

Module Photovoltaic Characterization.

A Keithley 2420 SourceMeter was used to obtain J-V characteristics under simulated AM 1.5G solar illumination (xenon arc lamp combined with a calculated spectra mismatch factor of 1.05 for all the TLSCs tested). The light intensity was calibrated with an NREL-calibrated Si reference diode with KG5 filter. The position-dependent $EQE_{LSC}$ measurements were performed using a QTH lamp with a calibrated Si detector, monochromator, chopper and lock-in amplifier. The measured $EQE_{LSC}(\lambda)$ at each distance (d) was corrected by multiplying the geometric factor $g=\pi/\tan^{-1}(L/2d)$, which accounts for the different angle subtended by the edge-mounted PV at various excitation distance (d), where L is the LSC waveguide length. A series of $EQE_{LSC}(\lambda)$ spectra were acquired with the same TLSC device, then the averaged spectrum was used to represent the whole device and integrated to confirm the $J_{SC}$ from the corresponding J-V characteristics of the same device. A matte black background was placed on the back of the TLSC device to eliminate illumination from the environment or reflection (double-pass) for both J-V and EQE measurements. All the TLSC devices were tested with the same GaAs PV cells to eliminate any PV-to-PV variation in performance.

Results

The dual-band TLSC device is composed of two separated waveguides as shown in FIG. 16A with the UV-component in one waveguide and the NIR-component in the second. An air gap is utilized to optically isolate the waveguided luminescence in each panel to prevent parasitic reabsorption and increase scalability. For more practical deployment, this can be replaced with low index polymer, metal oxide, glass, or glue with little change in the performance.

The top UV-component is based on highly phosphorescent hexanuclear nanoclusters (the chemical structure of $Cs_2Mo_6I_8(CF_3CF_2COO)_6NC$ is shown in FIG. 16B). Details of the synthesis are provided in the experimental section. The waveguide was made by drop-casting NC/polymer mixture onto square borosilicate glass sheets to form uniform composite films. The normalized absorption and emission spectra of the NC in polymer are also shown in FIG. 16B, the spectra show band absorption cut-off at the UV/VIS border and NIR emission onset at the VIS/NIR border with a massive down shift over 300 nm and a corresponding QY of 75±5 in polymer matrix, which makes the NC a good UV selective-harvesting luminophore for TLSC application.

The bottom waveguide is based on organic dye molecules. In organic and molecular semiconductors light absorption originates from the transition from the ground state to excited molecular orbitals. The energy difference between the excited molecular states forms discontinuity in the density of states. Therefore, these energy gaps can be tuned to transmit visible photons in TPV applications. In this work two different organic luminophores are used as NIR selective-harvesters: $CO_i8DFIC$ (also referred to as O6T-4F), which has been developed as a non-fullerene acceptor in organic photovoltaics with excellent performance; and a novel BODIPY molecule with high quantum yield in the NIR (details of the synthesis are provided in the experimental section). The molecular structures, normalized absorption and emission spectra of these NIR-components in polymer matrix are shown in FIGS. 16C and 16D, respectively. Similarly, the NIR selective harvesting waveguide was also made by drop-casting dye/polymer mixture onto glass sheets to form uniform composite film. The absorption peak of $CO_i8DFIC$ is at 745 nm and the emission peak is at 808 nm, exhibiting Stokes shift of ~60 nm and QY of 25±3 in polymer matrix. Compared to $CO_i8DFIC$, the absorption peak of BODIPY is narrower with a smaller Stokes shift, but the significantly higher QY of 40±3% is among the highest values for the NIR emission range. Since oxygen can absorb triplet excitons to form singlet oxygen species which increases the non-radiative recombination rate in NC, the QY will be significantly reduced when exposed to oxygen. Therefore, it is necessary to encapsulate waveguides by epoxy along the waveguide edges with two composite films facing each other.

For LSCs it is ideal to select an edge-mounted PV cell with a bandgap bordering the emission edge of the luminophores. This allows all the waveguided PL to be collected and converted while minimizing the voltage losses due to thermalization. With all three emission edges of NC, $CO_i8DFIC$ and BODIPY below 900 nm as shown in FIGS. 16B, 16C and 16D, GaAs is therefore a nearly ideal edge-mounted PV cell choice for these luminophores to maximize performance. GaAs cells are thus mounted on one edge of the dual waveguide for EQE measurements and on two sides for JV measurements, where both are accordingly corrected for the equivalent four edge mounting.

Dual-band TLSC devices with two luminophore combinations (NC+$CO_i8DFIC$ and NC+BODIPY) were fabricated and their photovoltaic performance was characterized. For comparison, TLSC with NC-only (10 mg/mL) was added as a reference device. The current density versus voltage (J-V) characteristics of these TLSCs (active area of 5.08×5.08 $cm^2$) measured under AM 1.5G illumination are shown in FIG. 17A. The NC-only TLSC shows short-circuit current density ($J_{SC}$) of 2.5±0.2 $mAcm^{-2}$, open-circuit voltage ($V_{OC}$) of 1.01±0.01 V and fill factor (FF) of 80±1%, resulting in a PCE of 2.0±0.1%. As the organic dyes are added into TLSCs with the same UV-component (NC concentration is kept at 10 mg/mL), the $J_{SC}$ values are improved to 3.6±0.2 $mAcm^{-2}$ and 3.8±0.1 $mAcm^{-2}$ while exhibiting similar $V_{OC}$ and FF, resulting in corresponding PCEs that reach 2.9±0.1% and 3.01±0.07% for NC+$CO_i8DFIC$ and NC+BODIPY TLSCs, respectively. The averaged position-dependent external quantum efficiency ($EQE_{LSC}(\lambda)$) spectra are shown in FIG. 17B. For NC-only TLSC the $EQE_{LSC}$ contribution originates only from the light absorption of the UV selective-harvesting NC. Neither Rayleigh scattering caused by particle aggregation nor direct illumination of the edge-mounted PV is observed from the $EQE_{LSC}$ profile. This also confirms that there this very little haze (<10%) from the devices. For the NC+$CO_i8DFIC$ and NC+BODIPY TLSCs, both UV and NIR peaks appear in their corresponding $EQE_{LSC}$ spectra, which result from the dual-band selective harvesting. The $EQE_{LSC}$ peak positions match the absorption spectra of the corresponding luminophores. The $EQE_{LSC}$ peak heights are determined by both the luminophore QY values and the absolute absorption spectra. With the same UV component, the NC contribution is nearly the same for all three TLSCs. Both slightly higher absolute absorption peak and significantly higher QY of the BODIPY results in a substantially higher $EQE_{LSC}$ peak compared to that of the $CO_i8DFIC$ for these device sizes. As one of the most important consistency check for any photovoltaic device, the $J_{SC}$ values extracted from J-V characteristics are confirmed by the integrated $J_{SC}$ ($J_{SC}^{int}$) from $EQE_{LSC}(\lambda)$. The $J_{SC}^{int}$ values are 2.42 $mAcm^{-2}$, 3.60 $mAcm^{-2}$ and 3.89 $mAcm^{-2}$ for NC-only, NC+$CO_i8DFIC$ and NC+BODIPY TLSCs, respectively, and they match well with the $J_{SC}$ from J-V curves. Although the $EQE_{LSC}$ peak of BODIPY in NC+BODIPY TLSC is higher than that of NC+$CO_i8DFIC$ TLSC, however, the broad absorption width of $CO_i8DFIC$ compensates for its lower absorption peak and QY, resulting in similar contributions from the NIR components.

The series of position-dependent $EQE_{LSC}$ spectra can be used to understand the scalability of LSC systems. The dual-band TLSC systems were fabricated with larger dimension (10.16×10.16 $cm^2$), and the series of $EQE_{LSC}$ at various d are plotted in FIGS. 17C and 17D for NC+$CO_i8DFIC$ and NC+BODIPY TLSCs, respectively, where d is the distance between the incident excitation beam and the edge-mounted PV cell along the centerline of the square waveguide (See Experimental Section for details). Both UV and NIR peak values of each individual scan were extracted, normalized and plotted as a function of d in FIGS. 17E and 17F. The NC-only, $CO_i8DFIC$-only and BODIPY-only TLSCs were also fabricated as references. With the massive downshift of the NC, the reabsorption loss is so negligible that the UV peak values of the NC-only, NC+$CO_i8DFIC$ and NC+BODIPY TLSCs stay nearly constant as d increases. Note that it is possible to replace the NC with efficient downconverters so that two or more NIR or IR photons are emitted for every UV photon absorbed. However, due to significantly stronger overlap between the absorption and emission spectra for both $CO_i8DFIC$ and BODIPY, the reabsorption loss leads to a more pronounced decay of the NIR peak values compared to the UV peaks. As shown in FIGS. 17E and 17F, the UV and NIR peak decay behaviors of the dual-band TLSCs strongly resemble those of the NC-only, $CO_i8DFIC$-only and BODIPY-only TLSCs, respectively. Given the similarity in the decay trend in each range of the $EQE_{LSC}$ spectra, the isolation of the waveguides effectively enables total internal reflection within each waveguide so that the UV and NIR components operate independently.

Aesthetic quality is equally important as photovoltaic performance for any TPV device, which determines whether a TPV device can be deployed in certain practical applications. The transmittance spectra (T(λ)) of the NC-only, NC+$CO_i8DFIC$ and NC+BODIPY TLSCs are plotted in FIG. 18A along with the photopic response of the human eye (V(λ)) for comparison. NC shows absorption cut-off edge at the UV/VIS border and BODIPY exhibits a NIR-band absorption onset at the VIS/NIR border. However, the broad NIR-band absorption of $CO_i8DFIC$ extends into the red/NIR range, leading to lower visible transmittance with a slight blue tint. T(λ) is used to quantify the main figures of merit for aesthetic quality: AVT, CRI and CIELAB color space coordinates (a*, b*). With good UV selectivity, the NC-only TLSC shows AVT of 81.9% and CRI of 91.3. For the dual-band TLSCs, the AVT and CRI of the NC+$CO_i8DFIC$ TLSC drop to 65.6% and 82.9. With better NIR selectivity of BODIPY the AVT and CRI of the NC+BODIPY TLSC is improved to 75.8% and 88.3.

Discussion

The impact of NC concentration on aesthetic quality and photovoltaic performance of the NC-only, NC+$CO_i8DFIC$ and NC+BODIPY TLSCs is systematically studied. The CIELAB color space coordinates (a*, b*) are commonly utilized to assess acceptable ranges of color tinting for products in glass and glazing industry. As the "reference light source" for TPVs, the incident AM 1.5G is at the origin (0, 0) (as colorless or neutral), and the (a*, b*) coordinates are plotted in FIG. 18B as a function of NC concentration. These TLSCs are categorized into three groups: NC-only group, NC+$CO_i8DFIC$ group and NC+BODIPY group, within each group NC concentration (1, 2, 5, 10 and 20 mg/mL) is the only variable. Additionally, the $CO_i8DFIC$-only and BODIPY-only TLSCs are included as references. As shown in FIG. 18B, the incorporation of $CO_i8DFIC$ or BODIPY leads to negative values of a* due to the extended NIR absorption into red range. b* of NC-only, NC+$CO_i8DFIC$, and NC+BODIPY TLSCs increases as NC concentration increases from 1 to 5 mg/mL, while further increasing the concentration above 10 mg/mL causes a dramatic drop in TLSC aesthetic quality and |b*| values less acceptable to the window industry (>10).

Visibly absorbing semiconductor materials can also be utilized as active layer in TPV application. Active layer with thin enough thickness or micro-segmented structure permits the transmission of a portion of visible light, which creates partial visible transparency. However, there is a direct trade-off between photovoltaic performance and visible transmission. As shown in FIG. 18B, any absorption profile within 435-675 nm range can result in sharp drops in AVT, CRI, and increased deviation of (a*, b*) from the CIELAB origin. Therefore, this type of device is sometimes referred to as "semitransparent" PV or non-wavelength-selective TPV. Although the theoretical Shockley-Queisser (SQ) limit for an opaque PV is 33.1%, the PCE of a non-wavelength selective TPV approaches 0% as the AVT increases to 90%. The SQ PCE limit line for non-wavelength selective TPV is shown in FIG. 19A. While the SQ PCE limit for wavelength-selective TPV or TLSC from harvesting only UV (<435 nm) and NIR photons (>675 nm) is over 20% (20.6%) with AVT approaching 100% (99.4%). The region to the right of the SQ limit line reflects the target PCE and AVT combination only achievable with the wavelength-selective approach. The PCE values as a function of AVT (60-100% range) of the all three groups of TLSCs (including $CO_i8DFIC$-only and BODIPY-only references) are plotted in FIG. 19A. We note that $CO_i8DFIC$-only and BODIPY-only reference TLSCs do not require encapsulation with an extra glass sheet. The structural simplicity reduces their reflection loss and therefore improves the overall transmittance over the whole spectrum. Among all these devices, BODIPY-only TLSC is the closest to the SQ PCE limit line due to the good NIR selectivity. As the NC concentration increases from 1 to 10 mg/mL, the PCE vs. AVT trend line of the NC-only group maintains a trend nearly parallel to the SQ PCE limit line until it starts to deviate above 10 mg/mL due to tail absorption into the visible. The NC+$CO_i8DFIC$ group and NC+BODIPY groups also show a similar trend as NC concentration increases, and the incorporation of the NIR component significantly improves the PCE of the dual-band selective-harvesting TLSC system over 3% (up to 3.4%) with modestly reduced AVT. Light utilization efficiency (LUE, defined as the product of PCE and AVT) provides a metric for systematically comparing TPVs with different levels of AVT values on the same scale. LUE of all the TLSCs as a function of their corresponding AVT along with the SQ LUE limit line is plotted in FIG. 19B. Although the air gap or extended NIR absorption into red range leads to a slightly reduced AVT level, the LUE still gains significant improvement stemming from the dual-band selective harvesting, i.e. the dual-band TLSC system can more effectively utilize invisible photons for electric power generation and simultaneously exhibit good aesthetic quality.

Approaches for further increasing the performance to approach the TPV and TLSC limit are considered. The photon flux <435 nm is only ~8% of the AM 1.5G. Harvesting light >435 nm can rapidly cause a yellowish or brown tint (positive b* value), which is unacceptable for the majority of window applications. In contrast, the NIR range between 675 nm and the absorption cut-off of the edge-mounted PV cell (e.g. Si, GaAs, etc.) coincides with the peak of AM 1.5G photon flux, which has significantly more potential to for power generation. Even with absorption extending into red range, a resulting blue tint (negative a* value) is more visually acceptable, which offers more design freedom for NIR selective-harvesting luminophores and can even help to compensate poor b* values from too much yellow tinting. The QY of various UV-absorbing luminophores including quantum-dots and nanoclusters have been gradually improved to more than 80% in recent years, and further improvement will become not only challenging but rather limited. By comparison, the QY of NIR luminophores currently ranges 20-35%. However, there is still great promise via chemical design to improve the QY up to 60-80%. For example, as shown in FIG. 17B, for the NC+BODIPY TLSC although the NC peak is much stronger than the BODIPY peak (due to higher QY and less reabsorption loss of the NC), however, the contribution from the NIR component is comparable to that from the UV component (2.4 mA/cm² vs. 1.5 mA/cm²). Thus, future efforts for TLSC development should mainly focus on: 1) the improvement of the QY of the NIR selective-harvesting luminophores (allowing a 2-3 times of enhancement in the NIR contribution without changing the aesthetics); 2) distinct wavelength selectivity near the UV/VIS and VIS/NIR borders for higher visible transmittance and better color rendering; 3) separation of the absorption and emission spectra of the NIR luminophores to suppress the reabsorption loss. Considering a dual-band TLSC with QY of ~80% in both UV and NIR components and ideal wavelength selectivity, the majority (>75%) of the $J_{SC}$ contribution should stem from its NIR component, and the overall PCE is expected to be ~7% with both AVT >80% and CRI >90. This PCE and AVT combination locates well above the SQ PCE and LUE lines shown in FIGS. 19A and 19B, which will be suitable for deployment in most practical applications.

The photon balance is a necessary consistency check to confirm the validity of independent measurements including $EQE_{LSC}(\lambda)$, $T(\lambda)$ and reflectance $R(\lambda)$ at every wavelength. The photon balance for all the TLSC devices in this work is shown to be consistent in FIGS. 20A-02C. Long lifetime performance is another key feature in real-world deployment. The photostability of all the NC-only, NC+$CO_i8DFIC$ and NC+BODIPY TLSCs are studied. Normalized absorption peak values of absorption spectra $(\lambda)$, $EQE_{LSC}$ and internal quantum efficiency ($IQE_{LSC}$) for NC-only, NC+$CO_i8DFIC$ and NC+BODIPY as a function of time under constant illumination are plotted in FIGS. 21A-21C. All the parameters remain nearly constant after 300 hours of constant illumination, thus, these TLSC devices exhibit excellent photostability.

In summary, by combining highly emissive phosphorescent hexanuclear metal halide nanoclusters and organic luminophores as the UV and NIR selective-harvesting luminophores, dual-band selective-harvesting TLSC devices have been designed and demonstrated. Harvesting invisible photons from both UV and NIR portions of solar spectrum leads to PCE >3%, and precise wavelength selectivity at the UV/VIS and VIS/NIR borders results in AVT >75% and CRI near 90. This approach leads to devices with efficiency approaching 10% as NIR quantum yields are further improved. With high photovoltaic performance, excellent aesthetic quality and long-term photostability, this example reveals the exceptional potential of TLSC technology to be deployed as power-generating sources in multiple applications, offering a pathway to effectively and ubiquitously utilize solar energy.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A transparent luminescent solar concentrator (TLSC) comprising:
   a luminophore having a quantum yield (QY) of greater than or equal to about 25%; and a waveguide that guides light emitted from the luminophore, wherein
the TLSC has a light utilization efficiency (LUE) of greater than or equal to about 1,
the luminophore has a strongest absorbance maximum of less than or equal to about 450 nm or greater than or equal to about 650 nm, and
the luminophore has a strongest peak emission of greater than or equal to about 650 nm.

2. The TLSC according to claim 1, wherein the TLSC has an average visible transmittance (AVT) of greater than or equal to about 50% and a color rendering index (CRI) of greater than or equal to about 80 at normal incidence to the waveguide.

3. The TLSC according to claim 1, wherein the TLSC has a power conversion efficiency (PCE) of greater than or equal to about 1% and a |b*| value of less than or equal to about 25.

4. The TLSC according to claim 1, wherein the TLSC has an average visible transmittance (AVT) of greater than or equal to about 60%.

5. The TLSC according to claim 1, wherein the luminophore is embedded within the waveguide, disposed directly on the waveguide, or provided in a film that is disposed on the waveguide.

6. The TLSC according to claim 1, further comprising:
a photovoltaic component operably coupled to the waveguide.

7. The TLSC according to claim 1, wherein the luminophore has a strongest absorbance maximum greater than or equal to about 650 nm.

8. The TLSC according to claim 7, wherein the TLSC has a haze that is less than or equal to about 10%.

9. The TLSC according to claim 7, wherein the luminophore is a non-fullerene acceptor, a boron-dipyrromethene (BODIPY), or a combination thereof.

10. The TLSC according to claim 9, wherein the luminophore is the non-fullerene acceptor, the non-fullerene acceptor being 2,2'-[[4,4, 11, 11-tetrakis(4-hexylphenyl)-4, 11-dihydrothieno[2',3': 4,5]thieno[2,3-d]thieno[2'''',3'''': 4''',5''']thieno[2''',3''': 4'',5'']pyrano[2'',3'': 4',5']thieno[2',3': 4,5]thieno[3,2-b]pyran-2,9-diyl]bis[methylidyne(5,6-difluoro) (COi8DFIC), 3,9-bis(2-methylene-(3-(1,1-dicyanomethylene)-indanone))-5,5,11, 11-tetrakis(4-hexylphenyl)-dithieno [2,3-d: 2',3'-d']-s-indaceno[1,2-b: 5,6-b']dithiophene) (ITIC), 2,2'-[4,4,9,9-Tetrakis(4-hexylphenyl)-4,9-dihydro-s-indaceno[1,2-b: 5,6-b']dithiophene-2,7-diyl]bis[4-[(2-ethylhexyl)oxy]-5,2-thiophenediyl]methylidyne(5,6-difluoro-3-oxo-1H-indene-2,1 (3H)-diylidene)]]bis[propanedinitrile] (IEICO-4F), or a combination thereof.

11. The TLSC according to claim 7, further comprising:
a second luminophore; and
a second waveguide that guides light emitted from the second luminophore,
wherein the second waveguide is positioned adjacent to the waveguide so that the waveguide receives light that is transmitted through the second waveguide, and
wherein the waveguide and the second waveguide are separated by a gap that is either filled with air or filled with a visually transparent material.

12. The TLSC according to claim 11, wherein the visually transparent material has an index of refraction (n) of less than or equal to about 1.3.

13. The TLSC according to claim 11, wherein the second luminophore has a quantum yield (QY) greater than or equal to about 50%.

14. The TLSC according to claim 11, wherein the second luminophore has a strongest absorbance maximum less than or equal to about 450 nm and a strongest peak emission greater than or equal to about 650 nm.

15. The TLSC according to claim 14, wherein the second luminophore comprises a nanocluster.

16. The TLSC according to claim 14, wherein the waveguide and the second waveguide are configured so that incident light first passes through the second waveguide and then through the first waveguide.

17. A transparent luminescent solar concentrator (TLSC) comprising:
a luminophore; and
a waveguide that guides light emitted from the luminophore,
wherein the TLSC has a power conversion efficiency (PCE) of greater than or equal to about 1% and a |b*| value of less than or equal to about 25.

18. The TLSC according to claim 17, wherein the TLSC has an average visible transmittance of greater than or equal to about 50% and a color rendering index (CRI) of greater than or equal to about 80 at normal incidence to the waveguide.

19. The TLSC according to claim 17, wherein the TLSC has a light utilization efficiency (LUE) of greater than or equal to about 1.

20. The TLSC according to claim 17, wherein the TLSC has an average visible transmittance (AVT) of greater than or equal to about 50%.

21. The TLSC according to claim 17, wherein the luminophore is embedded within the waveguide, disposed directly on the waveguide, or provided in a film that is disposed on the waveguide.

22. The TLSC according to claim 17, further comprising:
a photovoltaic component operably coupled to the waveguide.

23. The TLSC according to claim 17, wherein the luminophore has a strongest absorbance maximum and a strongest peak emission greater than or equal to about 650 nm.

24. The TLSC according to claim 23, wherein the TLSC has a haze that is less than or equal to about 10%.

25. The TLSC according to claim 23, wherein the luminophore is a non-fullerene acceptor, a boron-dipyrromethene (BODIPY), or a combination thereof.

26. The TLSC according to claim 25, wherein the luminophore is the non-fullerene acceptor, the non-fullerene acceptor being COi8DFIC, 3,9-bis(2-methylene-(3-(1,1-dicyanomethylene)-indanone))-5,5,11,11-tetrakis(4-hexylphenyl)-dithieno[2,3-d: 2',3'-d']-s-indaceno[1,2-b: 5,6-b']dithiophene) (ITIC), 2,2'-[4,4,9,9-Tetrakis(4-hexylphenyl)-4,9-dihydro-s-indaceno[1,2-b: 5,6-b']dithiophene-2,7-diyl]bis[4-[(2-ethylhexyl)oxy]-5,2-thiophenediyl]methylidyne(5,6-difluoro-3-oxo-1H-indene-2,1 (3H)-diylidene)]bis [propanedinitrile] (IEICO-4F), or a combination thereof.

27. The TLSC according to claim 23, further comprising:
a second luminophore; and
a second waveguide that guides light emitted from the second luminophore,
wherein the second waveguide is positioned adjacent to the waveguide so that the waveguide receives light that is transmitted through the second waveguide, and
wherein the waveguide and the second waveguide are separated by a gap that is either filled with air or filled with a visually transparent material.

28. The TLSC according to claim 27, wherein the visually transparent material has an index of refraction (n) of less than or equal to about 1.3.

29. The TLSC according to claim 27, wherein the second luminophore has a quantum yield (QY) greater than or equal to about 50%.

30. The TLSC according to claim 27, wherein the second luminophore has a strongest absorbance maximum less than or equal to about 450 nm and a strongest peak emission greater than or equal to about 650 nm.

31. The TLSC according to claim 30, wherein the second luminophore comprises a nanocluster.

32. The TLSC according to claim 30, wherein the waveguide and the second waveguide are configured so that incident light first passes through the second waveguide and then through the first waveguide.

33. A transparent luminescent solar concentrator (TLSC) comprising:
   a luminophore comprising a molecular polythiophene having both a strongest absorbance maximum and a strongest peak emission greater than or equal to about 650 nm; and
   a waveguide that guides light emitted from the luminophore,
   wherein the TLSC has a light utilization efficiency (LUE) of greater than or equal to about 1, an average visible transmittance (AVT) of greater than or equal to about 50%, and a color rendering index (CRI) of greater than or equal to about 80 at normal incidence to the waveguide.

34. The TLSC according to claim 33, wherein the TLSC has a power conversion efficiency (PCE) of greater than or equal to about 1% and a |b*| value of less than or equal to about 25.

35. The TLSC according to claim 33, wherein the luminophore is embedded within the waveguide, disposed directly on the waveguide, or provided in a film that is disposed on the waveguide.

36. The TLSC according to claim 33, further comprising: a photovoltaic component operably coupled to the waveguide.

37. The TLSC according to claim 33, wherein the TLSC has a haze that is less than or equal to about 10%.

38. The TLSC according to claim 33, wherein the molecular polythiophene is 2,2'-[4,4,11,11-tetrakis(4-hexylphenyl)-4, 11-dihydrothieno[2',3': 4,5]thieno[2,3-d]thieno[2'''',3'''': 4''',5''']thieno[2'',3'': 4'',5'']pyrano[2''',3''': 4',5']thieno[2',3': 4,5]thieno[3,2-b]pyran-2,9-diyl]bis[methylidyne(5,6-difluoro) (COi8DFIC), 3,9-bis(2-methylene-(3-(1,1-dicyanomethylene)-indanone))-5,5,11,11-tetrakis(4-hexylphenyl)-dithieno[2,3-d: 2',3'-d']-s-indaceno[1,2-b: 5,6-b']dithiophene) (ITIC), 2,2'-[[4,4,9,9-Tetrakis(4-hexylphenyl)-4,9-dihydro-s-indaceno[1,2-b: 5,6-b']dithiophene-2,7-diyl]bis[4-[(2-ethylhexyl)oxy]-5,2-thiophenediyl]methylidyne (5,6-difluoro-3-oxo-1H-indene-2,1 (3H)-diylidene)]]bis[propanedinitrile] (IEICO-4F), or a combination thereof.

39. The TLSC according to claim 33, further comprising:
   a second luminophore comprising a boron-dipyrromethene (BODIPY) having both a strongest absorbance maximum and a strongest peak emission greater than or equal to about 650 nm,
   wherein the waveguide guides light emitted from both the luminophore and the second luminophore.

40. The TLSC according to claim 33, further comprising:
   a second luminophore; and
   a second waveguide that guides light emitted from the second luminophore,
   wherein the second waveguide is positioned adjacent to the waveguide so that the waveguide receives light that is transmitted through the second waveguide, and
   wherein the waveguide and the second waveguide are separated by an air layer or a layer comprising a visually transparent material.

41. The TLSC according to claim 40, wherein the visually transparent material has an index of refraction (n) of less than or equal to about 1.3.

42. The TLSC according to claim 40, wherein the second luminophore has a quantum yield (QY) greater than or equal to about 50%.

43. The TLSC according to claim 40, wherein the second luminophore has a strongest absorbance maximum less than or equal to about 450 nm and a strongest peak emission greater than or equal to about 650 nm.

44. The TLSC according to claim 43, wherein the second luminophore comprises a nanocluster.

45. The TLSC according to claim 40, wherein the waveguide and the second waveguide are configured so that incident light first passes through the second waveguide and then through the first waveguide.

46. The TLSC according to claim 40, further comprising:
   a third luminophore comprising a boron-dipyrromethene (BODIPY) having both a strongest absorbance maximum and a strongest peak emission greater than or equal to about 650 nm,
   wherein the waveguide guides light emitted from both the luminophore and the third luminophore.

47. A transparent luminescent solar concentrator (TLSC) comprising:
   a luminophore comprising a molecular polythiophene having both a strongest absorbance maximum and a strongest peak emission greater than or equal to about 650 nm; and
   a waveguide that guides light emitted from the luminophore,
   wherein the TLSC has a power conversion efficiency (PCE) of greater than or equal to about 1% and a |b*| value of less than or equal to about 25.

* * * * *